United States Patent
Shibutani et al.

(12) 
(10) Patent No.: US 6,631,491 B1
(45) Date of Patent: Oct. 7, 2003

(54) INTERLEAVING METHOD, INTERLEAVING APPARATUS, AND RECORDING MEDIUM IN WHICH INTERLEAVE PATTERN GENERATING PROGRAM IS RECORDED

(75) Inventors: Akira Shibutani, Tokyo (JP); Hirohito Suda, Tokyo (JP)

(73) Assignee: NTT Mobile Communications Network, Inc., Tokyo (JP)

( * ) Notice: Subject to any disclaimer, the term of this patent is extended or adjusted under 35 U.S.C. 154(b) by 0 days.

(21) Appl. No.: 09/341,113

(22) PCT Filed: Nov. 9, 1998

(86) PCT No.: PCT/JP98/05027

§ 371 (c)(1),
(2), (4) Date: Aug. 20, 1999

(87) PCT Pub. No.: WO99/25069

PCT Pub. Date: May 20, 1999

(30) Foreign Application Priority Data

Nov. 10, 1997 (JP) .............................................. 9-307599
Jul. 31, 1998 (JP) ........................................... 10-218377
Aug. 19, 1998 (JP) ........................................... 10-233088

(51) Int. Cl.[7] .............................................. H03M 13/00
(52) U.S. Cl. ...................................... 714/762; 714/759
(58) Field of Search ........................... 377/64; 370/518; 178/18; 714/788, 755, 762, 759; 375/240.25; 345/200

(56) References Cited

U.S. PATENT DOCUMENTS

| | | | | |
|---|---|---|---|---|
| 3,652,998 A | * | 3/1972 | Forney, Jr. ................... | 377/64 |
| 5,111,455 A | * | 5/1992 | Negus ......................... | 370/518 |
| 5,387,765 A | * | 2/1995 | Crooks ........................ | 178/18 |
| 5,446,747 A | * | 8/1995 | Berrou ........................ | 714/788 |
| 5,537,429 A | * | 7/1996 | Inoue .......................... | 714/755 |
| 5,721,745 A | * | 2/1998 | Hladik et al. ................ | 714/755 |
| 6,141,384 A | * | 10/2000 | Wittig et al. ........... | 375/240.25 |
| 6,172,670 B1 | * | 1/2001 | Oka et al. ................... | 345/200 |
| 6,289,486 B1 | * | 9/2001 | Lee et al. ................... | 714/788 |

FOREIGN PATENT DOCUMENTS

| | | |
|---|---|---|
| JP | 55-26715 | 2/1980 |
| JP | 63-204937 | 8/1988 |
| JP | 3-292023 | 12/1991 |

(List continued on next page.)

OTHER PUBLICATIONS

S.V. Maric, Class of algebraically constructed permutations for use in pseudorandom interleavers, Electronic Letters, vol. 30, No. 17, Aug. 18, 1994, pp. 1378–1379.

P. Jung and M. Nasshan, Performance evaluation of turbo codes for short frame transmission systems, Electronic Letters, vol. 30, No. 2, Jan. 20, 1994, pp. 111–113.

(List continued on next page.)

*Primary Examiner*—David Ton
(74) *Attorney, Agent, or Firm*—Oblon, Spivak, McClelland, Maier & Neustadt, P.C.

(57) ABSTRACT

Data of an input data series is written into a first interleaver. The data is read out column by column or row by row from the first interleaver and written into a plurality of second interleavers column by column or row by row. The data is read from each of the second interleavers and written into one or a plurality of third interleavers as necessary. The operation is repeated once or a plurality of times, thereby reading the data from each of the interleavers and generating a data series. Interleaving is carried out by generating interleaving patterns with a plurality of interleaving patterns. Further, an interleaving pattern suitable for turbo encoding or transmission is generated.

47 Claims, 49 Drawing Sheets

FOREIGN PATENT DOCUMENTS

| | | |
|---|---|---|
| JP | 7-30846 | 1/1995 |
| JP | 7-50598 | 2/1995 |
| JP | 7-58646 | 3/1995 |
| JP | 7-202852 | 8/1995 |
| JP | 7-212250 | 8/1995 |
| JP | 7-254862 | 10/1995 |
| JP | 8-97731 | 4/1996 |
| JP | 8-242217 | 9/1996 |
| JP | 8-511393 | 11/1996 |
| JP | 9-214473 | 8/1997 |
| JP | 9-294079 | 11/1997 |
| JP | 10-98397 | 4/1998 |
| JP | 10-154940 | 6/1998 |
| JP | 11-67834 | 3/1999 |

OTHER PUBLICATIONS

E. Dunscombe and F.C. Piper, Optimal Interleaving Scheme For Convolutional Coding, Electronic Letters, vol. 25, No. 22, Oct. 26, 1989, pp. 1517–1518.

W–CDMA, vol. 97, No. 544, AP97–178 Feb. 18, 1998, pp. 23–30.

S. Dolinar and D. Divsalar, "Weight Distributions for Turbo Codes Using Random and Nonrandom Permutations," The Telecommunications and Data Acquisition Report (JPL TDA Progress Report) 42–122, Jet Propulsion Laboratory, Aug. 15, 1995, pp. 56–65.

\* cited by examiner

DEFINITION 1; L [N × M]···CARRYING OUT FOLLOWING INTERLEAVING WITH
N × M BLOCK INTERLEAVER

DEFINITION 2; R { A } ···REARRANGING IN INVERSE ORDER

EXAMPLE 0, 1, 2, 3, 4, 5 → R{6} → 5, 4, 3, 2, 1, 0

DEFINITION 3 ; L [N1 × M1, N2 × M2··· ] ··· INTERLEAVING WITH INTERLEAVER CORRESPONDING TO EACH OF A PLURALITY OF SERIES
( EACH SERIES IS L BITS )

EXAMPLE

FIG. 40

| INDEX | EXPRESSION | INTERLEAVING PATTERN |
|---|---|---|
| T7 | R{7[3x3[2x2]]} | 4,1,5,2,6,3,0 |
| T71 | R{7[3xR{3}]} | 6,3,0,4,1,5,2 |
| 2 | R{2} | 1,0 |
| 3 | R{3[2x2]} | 1,2,0 |
| 4 | 4[2xR{2}] | 1,3,0,2 |
| 5 | 5[2x3] | 0,3,1,4,2 |
| 6 | 6[3x2] | 0,2,4,1,3,5, |
| 7 | 7[3x3[2x2]] | 0,3,6,2,5,1,4 |
| 8 | 8[4[2x2]x2] | 0,4,2,6,1,5,3,7 |
| 9 | 9[R{2}x5[2x3]] | 5,0,8,3,6,1,4,7,2 |
| 11 | 11[3x5[3x2]] | 0,5,10,2,7,4,9,1,6,3,8 |
| 13 | 13[2x7[3x3[2x2] ,3[2x2,2xR{2},2xR{2}] x3[R{3}x1,R{3}x1,3x1]]] | 0,9,3,12,6,2,11,5,8,1,10,4,7 |
| 17 | 17[4[2x2,4x1,4x1 4x1]x5[3x2]] | 0,10,5,15,2,7,12,4,9,14,1,6,11,16,3,8,13 |
| 20 | 20[4[2xR{2}] x5[2x3]] | 5,15,0,10,8,18,3,13,6,16,1,11,9,19,4,14,7, 17,2,12 |
| 29 | 29[5[3x2] x7[3x3[2x2]]] | 0,14,28,7,21,3,17,10,24,6,20,13,27,2,16,9, 23,5,19,12,26,1,15,8,22,4,18,11,25 |
| 37 | 37[7[3x3] x6[3x2]] | 0,18,36,6,24,12,30,2,20,8,26,14,32,4,22,10, 28,16,34,1,19,7,25,13,31,3,21,9,27,15,33,5, 23,11,29,17,35 |
| 43 | 43[4[2x2] x11[3x5[3x2]]] | 0,22,11,33,5,27,16,38,10,32,21,2,24,13,35,7, 29,18,40,4,26,15,37,9,31,20,42,1,23,12,34,6, 28,17,39,3,25,14,36,8,30,19,41 |
| 47 | 47[7[3x3]x7[3x3]] | 0,21,42,7,28,14,35,3,24,43,10,31,17,38,6,27, 13,34,20,41,1,22,43,8,29,15,36,4,25,46,11, 32,18,39,2,23,44,9,30,16,37,5,26,12,33,19,40 |
| 53 | 53[5[2x3] x11[3x5[3x2]]] | 0,33,11,44,22,5,38,16,49,27,10,43,21,32,2, 35,13,46,24,7,40,18,51,29,4,37,15,48,26,9, 42,20,31,1,34,12,45,23,6,39,17,50,28,3, 36,14,47,25,8,41,19,52,30 |
| 59 | 59[9[R{2} x5[2x3]] x7[3x3]] | 35,0,56,21,42,7,28,49,14,38,3,24,45,10,31, 52,17,41,6,27,48,13,34,55,20,36,1,57,22,43, 8,29,50,15,39,4,25,46,11,32,53,18,37,2,58, 23,44,9,30,51,16,40,5,26,47,12,33,54,19 |
| 61 | 61[5[2x3] x13[5[2x3] x3[2x2]]] | 0,39,13,52,26,9,48,22,35,3,42,16,55,29,12, 51,25,38,6,45,19,58,32,2,41,15,54,28,11,50, 24,37,5,44,18,57,31,8,47,21,60,34,1,40,14, 53,27,10,49,23,36,4,43,17,56,30,7,46,20,59,33 |

EXAMPLE:

15 BITS IP ··· C={0,8,4,12,2,10,6,14,1,9,5,13,3,11,7}

16 BITS IP C'

C'[i]=4A[i%4]+B[i/4]

4 BITS IP
A={0,2,1,3}

4 BITS IP
B={0,2,1,3}

FIG. 48

| INDEX | EXPRESSION | INTERLEAVING PATTERN |
|---|---|---|
| 2 | 2 | 0,1 |
| 3 | 3 | 0,1,2 |
| 4 | 4[2x2] | 0,2,1,3 |
| 5 | 5[2x3] | 0,3,1,4,2 |
| 6 | 6[3x2] | 0,2,4,1,3,5 |
| 7 | 7[3x3[2x2]] | 0,3,6,2,5,1,4 |
| 8 | 8[4[2x2]x2] | 0,4,2,6,1,5,3,7 |
| 9 | 9[3x3] | 0,3,6,1,4,7,2,5,8 |
| 10 | 10[5[3x2]x2] | 0,4,8,2,6,1,5,9,3,7 |
| 11 | 11[3x5[3x2]] | 0,5,10,2,7,4,9,1,6,3,8 |
| 13 | 13[2x7[3x3[2x2],3[2x2,2xR{2},2xR{2}]x3[R{3}x1,R{3}x1,3x1]]] | 0,9,3,,12,6,2,11,5,8,1,10,4,7 |
| 16 | 16[4[2x2]x4[2x2]] | 0,8,4,12,2,10,6,14,1,9,5,13,3,11,7,15 |
| 17 | 17[4[2x2,4x1,4x1,4x1,4x1]x5[3x2]] | 0,10,5,15,2,7,12,4,9,14,1,6,11,16,3,8,13 |
| 20 | 20[4[2x2]x5[3x2]] | 0,10,5,15,2,12,7,17,4,14,9,19,1,11,6,16,3,13,8,18 |
| 32 | 32[8[4[2x2]x2]x4[2x2]]] | 0,16,8,24,4,20,12,28,2,18,10,26,6,22,14,30,1,17,9,25,5,21,13,29,3,19,11,27,7,23,15,31 |
| 64 | 64[8[4[2x2]x2]x8[4[2x2]x2]] | 0,32,16,48,8,40,24,56,4,36,20,52,12,44,28,60,2,34,18,50,10,42,26,58,6,38,22,54,14,46,30,62,1,33,17,49,9,41,25,57,5,37,21,53,13,45,29,61,3,35,19,51,11,43,27,59,7,39,23,55,15,47,31,63 |
| 128 | 128[16[4[2x2]x4[2x2]]x8[4[2x2]x2]] | 0,64,32,96,16,80,48,112,8,72,40,104,24,88,56,120,4,68,36,100,20,84,52,116,12,76,44,108,28,92,60,124,2,66,34,98,18,82,50,114,10,74,42,106,26,90,58,122,6,70,38,102,22,86,54,118,14,78,46,110,30,94,62,126,1,65,33,97,17,81,49,113,9,73,41,105,25,89,57,121,5,69,37,101,21,85,53,117,13,77,45,109,29,93,61,125,3,67,35,99,19,83,51,115,11,75,43,107,27,91,59,123,7,71,39,103,23,87,55,119,15,79,47,111,31,95,63,127 |

INTERLEAVING METHOD, INTERLEAVING APPARATUS, AND RECORDING MEDIUM IN WHICH INTERLEAVE PATTERN GENERATING PROGRAM IS RECORDED

This application is a 371 of PCT/JP98/05027 filed on Nov. 09, 1998.

TECHNICAL FIELD

The present invention generally relates to an interleaving technology for improving error correction ability of an error correction code for burst error. More particularly, the present invention relates to an interleaving method, an interleaving device, and a medium which stores an interleaving pattern generating program for improving the effect of the interleaving by increasing the degree of data randomizing.

BACKGROUND ART

In digital transmissions of such as a mobile communications system, the level of received signals varies largely over time by a multipath fading caused by reflections from a building and the like. Therefore, a digital error, such as a burst error, may occur. In addition, in a storing medium of digital systems, such as a compact disc or a hard disk, a digital error such as a burst error may occur due to a scratch, dust or the like on the reading surface of the medium. Thus, various error correction codes are used by various systems. In such an error correction code, for improving the correction ability with respect to the burst error, an interleaving technology is used in concert with the error correction code. The correction ability of the error correction code when a burst error exists depends on the interleaving technology.

In addition, a turbo encoder which uses a high-ability error correction code which has been proposed in recent years includes a plurality of encoders, and each encoder is connected to each other through an interleaver (which carries out interleaving processing), for decreasing the degree of correlation of redundancy system between the encoders. The interleaver is very important for determining the ability of the turbo code.

Therefore, an interleaving method applicable for turbo encoding and transmission systems such as the above-mentioned mobile communication systems using the above mentioned interleaver are required.

As is well known to a person skilled in the art, the purpose of the interleaving method is to randomize the bit sequence of an input bit series and the bit sequence of an out put bit series. The following viewpoint can be used as criteria for evaluating the ability of the interleaving method.

(1) How far apart two successive input bits can be separated in the output series.

(2) How far apart two successive output bits are separated in the input series.

FIG. 1 shows a block interleaving method as a conventional interleaving method.

As shown in FIG. 1, data 100 of one frame includes 1152 bits. A matrix 110 has a buffer of N×M (N rows and M columns). The interleaving method is realized such that M bit data is written in the direction of the row, for example, like a vector 115 shown as a diagonally shaded area A, and N bit data is read out in the direction of the column shown as a diagonally shaded area B. By evaluating the interleaving method in terms of the above mentioned criteria, it is recognized that (1) two successive input bits can not be separated farther apart than N bits in an interleaved output series 130, and (2) two successive output bits are separated as far apart as at least M bits in the input series.

However, in the above-mentioned interleaving method, an input bit series is written in the row direction in order of time in the input bit series, and the written data is read out in the column direction also in order of time in the input bit series. Therefore, data is written/read only once in order of time in each of the processes. Therefore, the effect of the interleaving is low, and the performance of the randomizing is limited to the above-mentioned degree even with the N×M buffer.

DISCLOSURE OF THE INVENTION

The present invention is achieved in view of the above-mentioned points. A first objective of the present invention is to provide an interleaving method for improving the effect of the interleaving, comparing with the case of reading and writing one by one in order of time, by applying a process of changing a sequence repeatedly after carrying out a process of reading or writing to a buffer once.

To achieve the above-mentioned objective, according to the present invention, an interleaving method for inputting a data series of a unit length and outputting an interleaved series of the unit length, includes:

a first step of writing data of the data series to a first interleaver, reading out the data column by column or row by row from the first interleaver, and writing the data to a plurality of second interleavers;

a second step of reading out the data from each of the second interleavers, and writing the data to one or a plurality of third interleavers as necessary, and reading out the data from each of in one direction, and repeating the reading out column data or row data and the writing the read out data column by column or row by row;

interleavers generated by repeating the second step once or a plurality of times or from each of interleavers generated by the first step, and outputting a data series.

The above-mentioned invention may be configured such that an interleaving method for inputting a data series of a unit length and outputting an interleaved series of the unit length, includes:

a first step of writing the data series to a first interleaver in one direction;

a second step of reading out column data or row data from the first interleaver, writing the read out data to a second interleaver, which has a size different from a size of the first interleaver, in one direction, and repeating the reading out column data or row data and the writing the read out data column by column or row by row;

repeating a third step of performing the second step wherein each of a plurality of the second interleavers generated by the second step is regarded as the first interleaver, and reading out data from each of interleavers generated by repeating the third step or by performing the second step, and outputting a data series.

The above-mentioned interleaving method may be configured such that an interleaving method for inputting a data series of a unit length and outputting an interleaved series of the unit length, includes:

a first step of writing the data series to a first interleaver in one direction;

a second step of reading out column data or row data from the first interleaver, writing the read out data to a second interleaver, which has a size different from a size of the first interleaver, (2) two successive output bits are separated as far apart as at least M bits in the input series.

However, in the above-mentioned interleaving method, an input bit series is written in the row direction in order of time in the input bit series, and the written data is read out in the column direction also in order of time in the input bit series. Therefore, data is written/read only once in order of time in each of the processes. Therefore, the effect of the interleaving is low, and the performance of the randomizing is limited to the above-mentioned degree even with the N×M buffer.

a third step of reading out data column by column or row by row from each of interleavers generated by the second step, and writing the data to an interleaver which has a size the same as the size of the first interleaver, and reading out data from the interleaver generated by the third step, and outputting a data series.

In the above configuration, the interleaving method includes:

a fourth step of performing the second step and the third step wherein the interleaver generated by the third step is regarded as the first interleaver, reading out data from an interleaver generated by repeating the fourth step once or a plurality of times, and outputting a data series.

The interleaving method may be configured such that an interleaving method for inputting a data series of a unit length and outputting an interleaved data series of the unit length, includes:

storing a plurality of interleaving patterns in a table beforehand;

applying one of the interleaving patterns to the input data series by referring to the table and outputting data, and repeating a step of applying one of the interleaving patterns to the output data, and outputting the interleaved data series.

In the above mentioned configuration, an interleaving pattern is stored in the table according to the interleaving method as claimed in one of claims 1–4.

According to the above mentioned invention, because a process of changing sequence is applied repeatedly after carrying out a process of reading or writing to a buffer once, the effect of interleaving can be improved comparing with the case of reading and writing one by one in order of time.

The second objective of the present invention is to provide an interleaving method for supporting various interleaving flexibly with decreased data amount necessary for the interleaving.

To achieve the above mentioned objectives, according to the present invention, a method for generating an interleaving pattern description of an interleaving pattern for interleaving an input data series of a unit length and outputting an interleaved data series of the unit length, includes:

generating the interleaving pattern description of a third unit by using an interleaving pattern description of a first unit and an interleaving pattern description of a second unit.

The present invention generates an interleaving pattern description of a predetermined length unit by using the interleaving pattern description generation method as claimed in claim 7.

In the above configuration, the interleaving pattern description is an interleaving pattern table or an interleaving pattern equation which describes an interleaving pattern.

The interleaving method of the present invention may be configured such that an interleaving method for inputting a data series of a unit length and outputting an interleaved data series of the unit length, includes:

generating an interleaving pattern description of a third unit by using an interleaving pattern description of a first unit and an interleaving pattern description of a second unit, and interleaving with the generated interleaving pattern description.

Further, the interleaving method of the present invention may be configured such that an interleaving method for inputting a data series of a unit length and outputting an interleaved data series of the unit length, includes:

calculating interleaving destinations in a series of a third unit with an interleaving pattern description of a first unit and an interleaving pattern description of a second unit, and interleaving with the result of the calculation.

Further, the interleaving method includes:

generating an interleaving pattern description of a first unit and an interleaving pattern description of a second unit by using the interleaving pattern description generated by the method, interleaving a data series of a third unit by calculating from the interleaving pattern description of a first unit and the interleaving pattern description of a second unit.

Further, that the interleaving pattern description is an interleaving pattern table or an interleaving pattern equation which describes an interleaving pattern.

According to the above mentioned present invention, by generating the interleaving pattern description, for example, from one interleaving pattern table (in the case of A=B), or from two interleaving pattern tables, an interleaving pattern table which has a larger interleaving length can be generated. Thus, a pattern of a certain interleaving length can be represented by a combination of a plurality of patterns of smaller interleaving lengths. Therefore, memory amount for fixed length patterns can be decreased. For example, conventionally, in the case of using an interleaving pattern table for 1000 bits, a memory for 1000 bits is necessary. According to the present invention, by representing the interleaving pattern table for 1000 bits with a 20 bit interleaving pattern table and a 50 bit interleaving pattern table, the memory can be decreased to an amount for 70 (=20+50) bits. In addition, by representing an interleaving pattern table 900 bits with a 20 bit interleaving pattern table×a 50 bit interleaving pattern table, interleaving for 1000 bits and 900 bits are possible without enlarging the fixed length interleaving pattern table.

A method according to the present invention may be configured such that a method for generating an interleaving pattern description of an interleaving pattern for interleaving an input data series of a unit length and outputting an interleaved data series of the unit length, includes:

interpreting an interleaving pattern description language which defines an interleaving pattern, and generating an interleaving pattern description by using the method as claimed in claim 9 on the basis of the interpretation.

In the above configuration, if an interleaving pattern description corresponding to a part of the interleaving pattern description language is stored, the interleaving pattern description is generated with reference to the stored interleaving pattern description without performing a process corresponding to the part of the interleaving pattern description language, when generating an interleaving pattern.

Further, the interleaving method includes:

interpreting an interleaving pattern description language which defines an interleaving pattern, and interleaving by the method as claimed in claim 13 on the basis of the interpretation.

In the above configured interleaving method, if an interleaving pattern description corresponding to a part of the interleaving pattern description language is stored, the interleaving pattern description is generated with reference to the stored interleaving pattern without performing a process corresponding to the part of the interleaving pattern description language, when interleaving.

The present invention may be configured such that a method for generating an interleaving pattern description of an interleaving pattern for interleaving an input data series of a unit length and outputting an interleaved data series of the unit length, includes:

determining an interleaving pattern description of a first stage when a unit length is given, and generating an interleaving pattern description by repeating a process of determining interleaving patterns corresponding to interleavers of a column and a row of a stage after the first stage until reaching any stage or until becoming unable to interleave.

Further, the present invention may be configured such that a method for generating an interleaving pattern description of an interleaving pattern for interleaving an input data series of a unit length and outputting an interleaved data series of the unit length, includes:

checking an interleaving pattern description which is generated;

generating an interleaving pattern description again after changing all or a part of parameters if the result of the checking is unsuccessful, and repeating the checking and the generation until the result of the checking becomes successful so as to generate an interleaving pattern description which passed the checking.

In the above configured interleaving pattern description generation method, the interleaving pattern description which is generated is an interleaving pattern table or an interleaving pattern equation or an interleaving pattern description language.

According to the above mentioned present invention, various interleaving can be supported flexibly with decreased data amount necessary for the interleaving.

The third objective of the present invention is to provide a method for applying the interleaving method to a transmission system device, a turbo encoder, or the like, and to provide the devices such as the transmission system device and the encoder, and a medium storing an interleaving pattern generating program suitable for a target.

To achieve the above objectives, the present invention may be configured such that a method for generating an interleaving pattern description of an interleaving pattern for interleaving an input data series of a unit length and outputting an interleaved data series of the unit length, includes:

a step of determining, when a unit length is given, the number of rows or columns of a block interleaver corresponding to the unit length by using an interleaving pattern list suitable for a predefined application target and defining the number of columns or rows from the determined number of rows or columns, and generating an interleaving pattern of the unit length from interleaving patterns obtained by repeating the step until the defined number of columns or the defined number of rows is defined in the interleaving pattern list.

In the above configuration, the method includes:

a first step, which is a process of a first stage, of determining the number of rows or the number of columns of a block interleaver corresponding to a unit length which is given beforehand by a defined number, assuming an interleaving pattern corresponding the defined number as a predefined interleaving pattern, and defining the number of rows by using the determined number of columns or defining the number of columns by using the determined number of rows;

a second step of determining the number of rows or the number of columns of a block interleaver corresponding to the defined number of rows or the defined number of columns by using an interleaving pattern list suitable for predefined application target, and defining the number of columns from the determined number of rows or defining the number of rows from the determined number of columns;

a third step of repeating the second step until an interleaving pattern corresponding to the number of rows or columns exists in the predefined interleaving pattern list;

performing the third step a number of times equal to the number of rows or columns corresponding to the predefined interleaving pattern in the first step, and generating an interleaving pattern corresponding to the row or the column of a former stage sequentially from an interleaving pattern corresponding to the row and the column which is generated in a final stage.

Further, in the above configuration, the generated interleaving pattern of the unit length is checked and an interleaving pattern of the unit length is generated again according to the result of the checking.

Further, in the above configuration, the application target is turbo code and the number of rows of the first stage is 7.

Further, in the above configuration, the application target is transmission and the number of columns of the first stage is the number of slots of one frame.

According to the above mentioned invention, an interleaving pattern suitable for turbo encoding and a transmission system, and the like.

To achieve the above mentioned objectives, an interleaving device for inputting a data series of a unit length and outputting interleaved data series of the unit length, includes:

means which stores one or a plurality of interleaving patterns in a table beforehand;

means which outputs data by applying one of the plurality of interleaving patterns, and means which outputs the output data by further applying one of the plurality of interleaving patterns as necessary.

In the above configuration, the table stores an interleaving pattern by the interleaving method as claimed in one of claims 1–4.

Further, in the above configuration, the interleaving pattern is generated by the interleaving pattern generating method as claimed in claim 21.

Further, in the interleaving device, interleaving destinations of an input data series are calculated, and the interleaving is performed on the basis of the calculation and data is output instead of using an interleaving pattern.

According to the above mentioned invention, a device for carrying out interleaving processes can be provided, particularly, a device suitable for turbo encoding and transmission, and the like.

To achieve the above mentioned objectives, according to the present invention, a computer readable medium storing a program for description and generation of an interleaving pattern in an interleaving method for inputting a data series of a unit length and outputting an interleaved series of the unit length, includes:

a step of determining the number of rows or columns of a block interleaver corresponding to a unit length which is given beforehand by using an interleaving pattern list suitable for a predefined application target and defining the number of columns from the determined number of rows or the number of rows from the determined number of columns, and generating an interleaving pattern of the unit length from interleaving patterns obtained by repeating the step until the defined number of columns or the defined number of row is defined in the interleaving pattern list.

Further, in the above configuration, the program includes:

a first step, which is a process of a first stage, of determining the number of rows or the number of columns of a block interleaver corresponding to a unit length which is given beforehand by a defined number, assuming an interleaving pattern corresponding the defined number as a predefined interleaving pattern, and defining the number of rows by using the determined number of columns or defining the number of columns by using the determined number of rows;

a second step of determining the number of rows or the number of columns of a block interleaver corresponding to the defined number of rows or the defined number of columns by using an interleaving pattern list suitable for a predefined application target, and defining the number of columns from the determined number of rows or defining the number of rows from the determined number of columns;

a third step of repeating the second step until an interleaving pattern corresponding to the number of rows or columns exists in the predefined interleaving pattern list;

performing the third step a number of times equal to the number of rows or columns corresponding to the predefined interleaving pattern in the first step, and generating an interleaving pattern corresponding to the row or the column of a former stage sequentially from an interleaving pattern corresponding to the row and the column which is generated in a final stage.

In the above configuration, in the computer readable medium storing a program for generation of an interleaving pattern of the present invention, the generated interleaving pattern of the unit length is checked and an interleaving pattern of the unit length is generated again according to the result of the checking.

Further, in the computer readable medium storing a program for generation of an interleaving pattern of the present invention, the application target is turbo code and the number of rows of the first stage is 7.

Further, in the computer readable medium storing a program for generation of an interleaving pattern of the present invention, the application target is transmission and the number of columns of the first stage is the number of slots of one frame.

According to the above mentioned invention, a medium storing a program for generating an interleaving pattern can be provided, particularly, a medium storing a program for generating an interleaving pattern suitable for turbo encoding, transmission and the like can be provided.

BRIEF DESCRIPTION OF THE DRAWINGS

FIG. 40 is a table showing a list of predetermined interleaving patterns used for the determining process of the interleaving pattern.

FIG. 48 is a table showing a list of the predetermined interleaving patterns used for generating an interleaving pattern.

PREFERRED EMBODIMENTS FOR CARRYING OUT THE INVENTION

In the following, a detailed description of embodiments of the present invention will be given with reference to figures. Although an interleaver is described as a two-dimensional array in the figures in the following description, it is only as a matter of convenience. It is needless to say that the present invention can be carried out with a one-dimensional array instead of the two-dimensional array.

The interleaving processes described in the following are carried out by a processing device for signal processing of an input bit series and the like.

First, a first embodiment of the present invention will be described.

Figure 2:
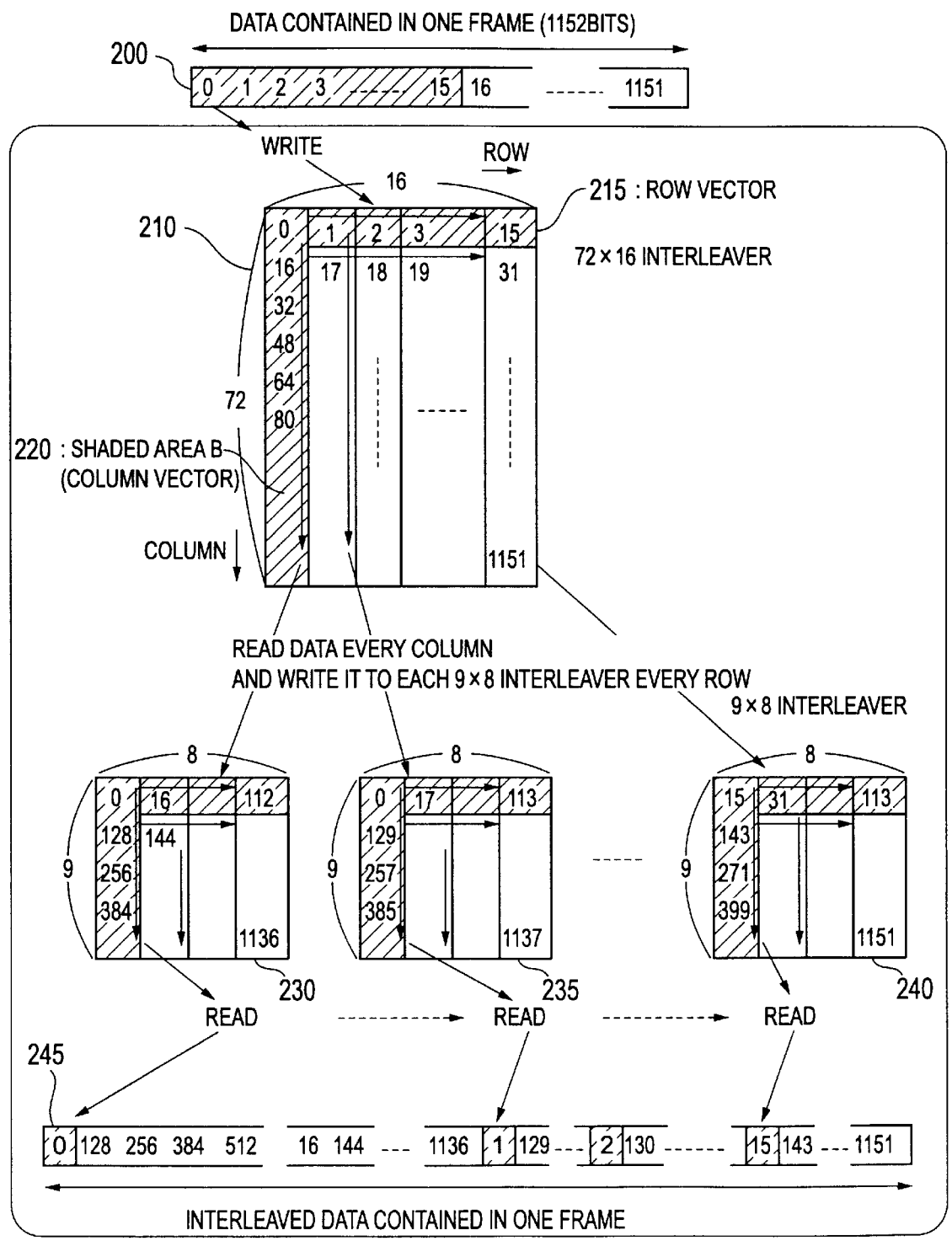
FIG. 2 is a diagram showing an interleaving method according to a first embodiment of the present invention.
Figure 3:
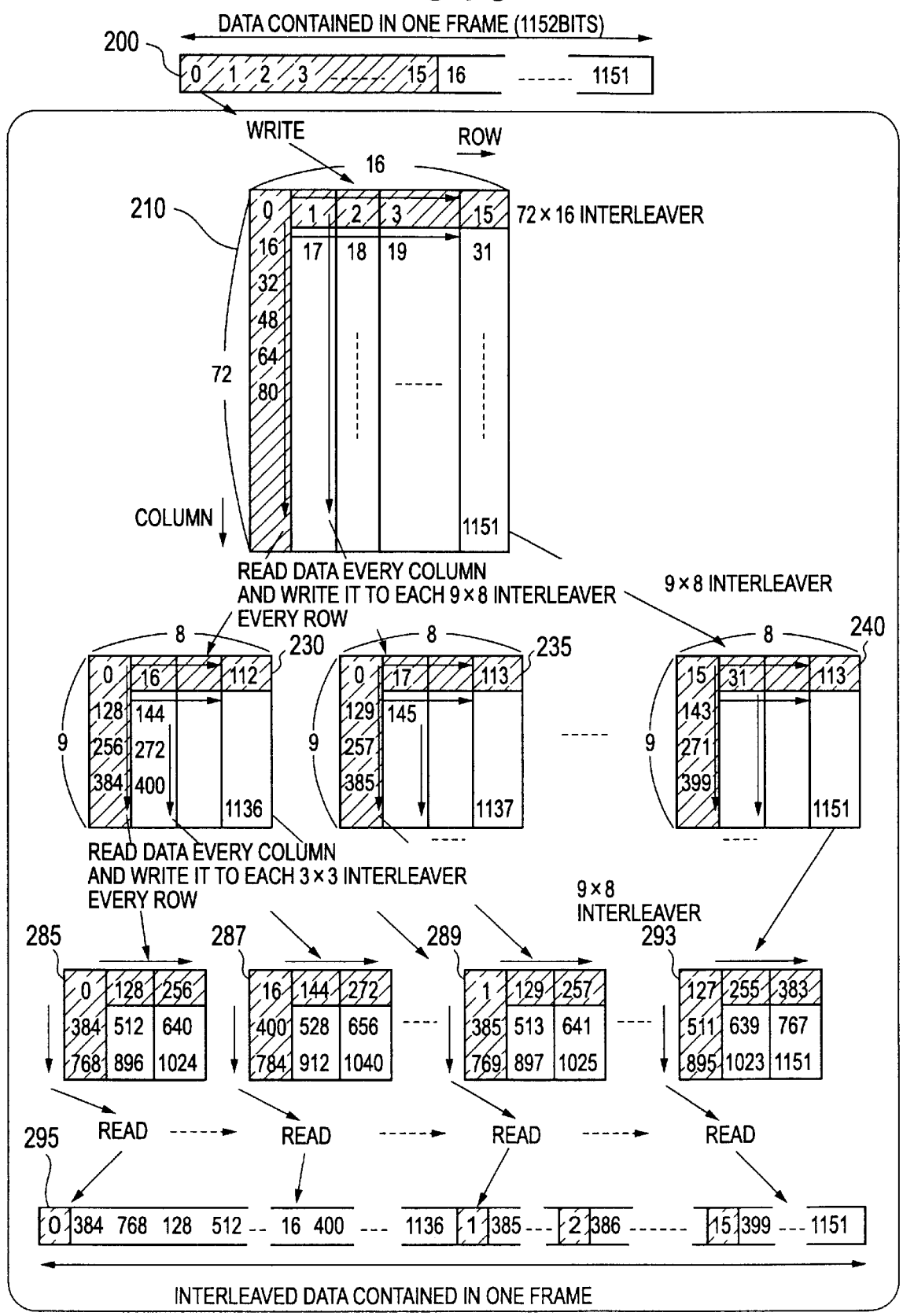
FIG. 3 is a diagram showing the interleaving method according to the first embodiment of the present invention.

FIG. 2 and FIG. 3 show the interleaving method of the first embodiment of the present invention. As shown in FIG. 2, 1152-bit data as single frame data 200 is input, as in the case of the conventional method, and a row vector 215 is written to a buffer of an interleaver 210 of 72×16 (=1152) in the direction of the row. It is needless to say that the interleaving method of the present invention can be applied to a general N×M interleaver instead of the 72×16 interleaver. In the 72×16 interleaver 210, each of 16 column vectors, including a vector 220 which has 72 bits, is read out, and is interleaved by a 9×8 (=72) interleaver 230, 235, . . . , or 240 which corresponds to each of 16 column vectors. That is to say, for example, the column vector 220 is written in the buffer of the 9×8 (=72) interleaver 230 in the direction of the row. Finally, data in each of the 16 9×8 interleavers is read out in the direction of the column successively, and, then, the interleaved data 245 is output, in other words, extracted.

Figure 1:
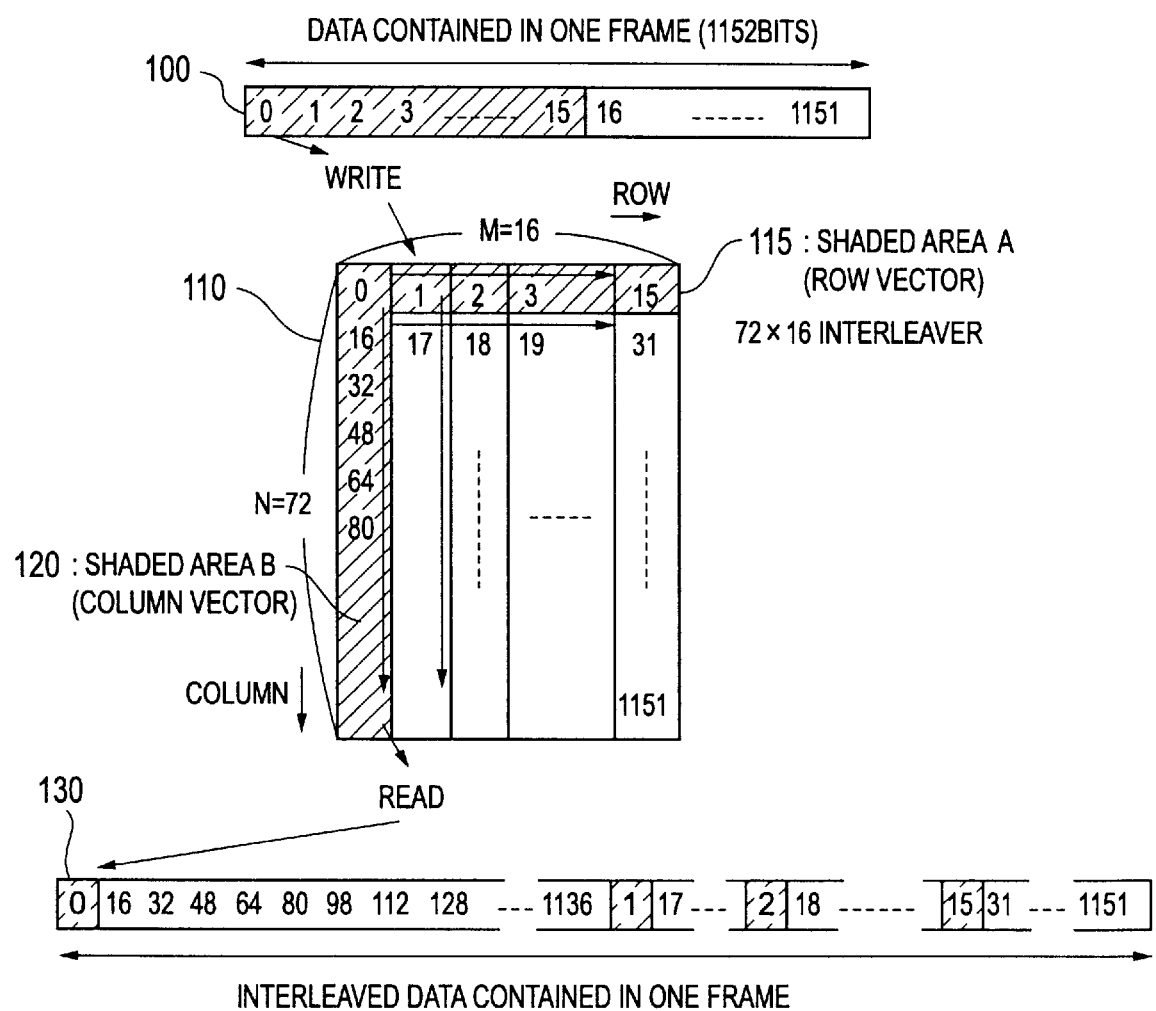
FIG. 1 is a diagram showing a conventional interleaving method.

The interleaved data shown in FIG. 1 is arranged orderly in order of time in terms of the column part. In contrast, the data arrangement in FIG. 2 is more complex. Here, to evaluate quantitatively the performance of the interleaving, the performance of the interleaving is evaluated from the viewpoint of the criterion (2) described in the related art.

In the output 130 in FIG. 1, the number adjacent to "0" is "16". Therefore, in the input data, the two bits are separated by at least 16 bits. When all bits are examined, it is recognized that two successive bits of output are separated by at least 16 bits in the input series. That is to say, the above-mentioned evaluation according to the criterion (2) is 16 bits.

The result of an evaluation according to the criterion (2) of the method shown in FIG. 2 is 128 bits. Therefore, it is understood that the performance of interleaving is improved.

FIG. 3 shows a method in which an additional interleaving is performed. As shown in FIG. 3, each column data in each of the 9×8 interleavers such as the interleaver 230 shown in FIG. 2 is interleaved by each of 3×3 (=9) block interleavers. At the end stage of the interleaving, interleaved data 295 is output or extracted by reading out data sequentially in the column direction from the 3×3 block interleavers such as the interleaver 285.

According to the method shown in FIG. 3, since the result of the evaluation by the above-mentioned criterion (2) is 384 bits, it can be understood that the performance of interleaving will improve by repeating the interleaving process.

Figure 4:
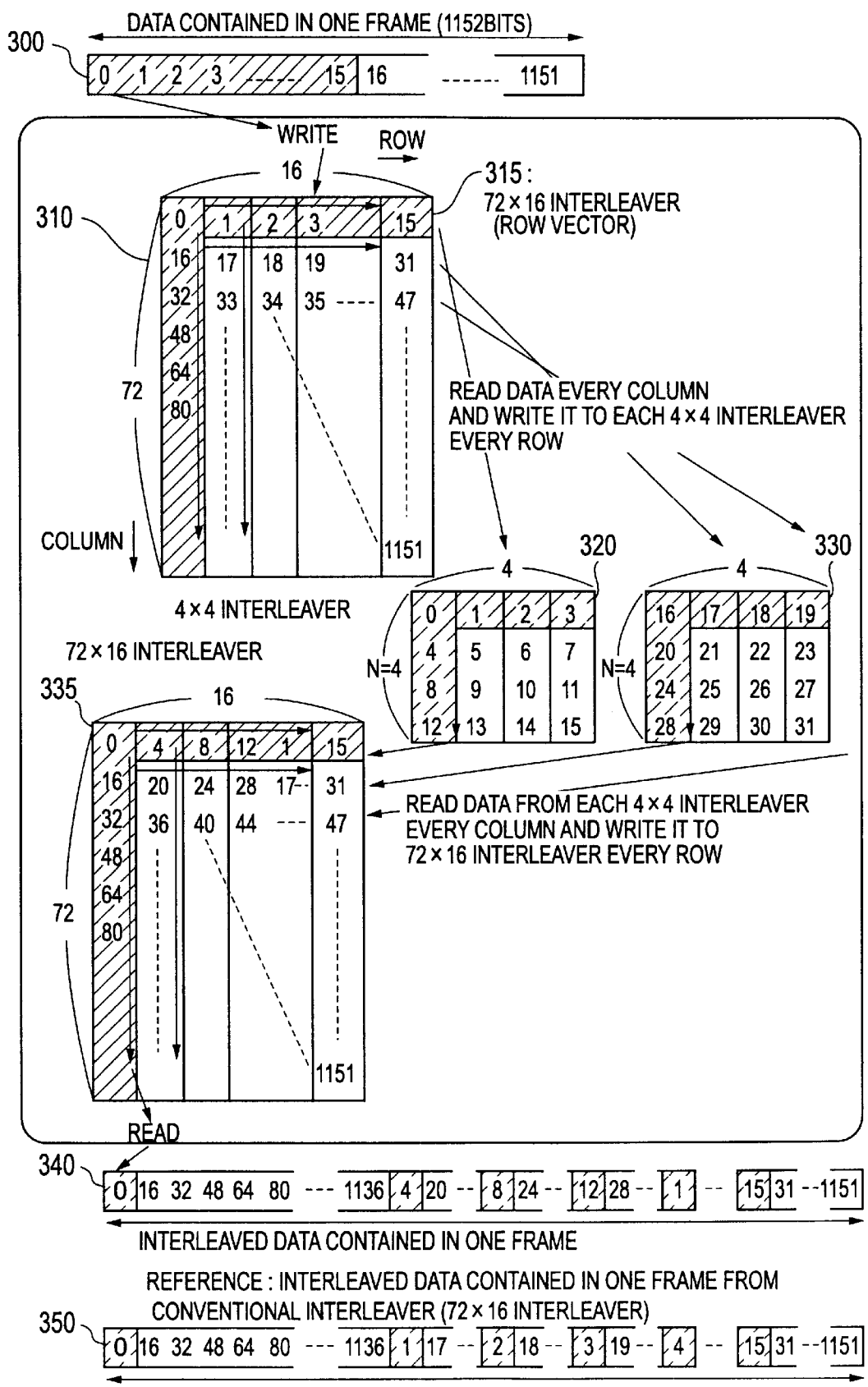
FIG. 4 is a diagram showing the interleaving method according to a second embodiment of the present invention.

In the following, a second embodiment of the present invention will be described. FIG. 4 shows an interleaving method according to the second embodiment of the present invention.

Different from the method shown in FIG. 3 in which data in the 72×16 interleaver 210 is read in the column direction, in the method according to the second embodiment, 16 bits in row vectors in an 72×16 interleaver 310 are read and written to each of 4×4 interleavers such as an interleaver 320 in the row direction. Next, each column of each of the 4×4 interleavers such as the interleaver 320 is read in the column direction sequentially and is written back to each row in the 72×16 interleaver 310. In this case, another interleaver 335 can be used instead of the 72×16 interleaver 310. After all data in the 4×4 interleavers are written back to the 72×16 interleaver 310, interleaved data 340 is extracted by reading a buffer of the 72×16 interleaver 310 in the column direction.

Compared with the output result 350 according to the conventional interleaving method, data alignment in each column in the 72×16 interleaver 310 is the same as that of the conventional method, however, it can be recognized that column alignment is different. This interleaving method will be evaluated from the viewpoint of the criterion (1) in the following. According to the conventional method, the input data "0" and "1" are interleaved to be 72 bits apart. Similarly evaluating all bits in terms of the criterion (1), the result is 72 bits. In the second embodiment, since the result is 288 bits, it can be understood that the performance of the interleaving is improved.

Figure 5:
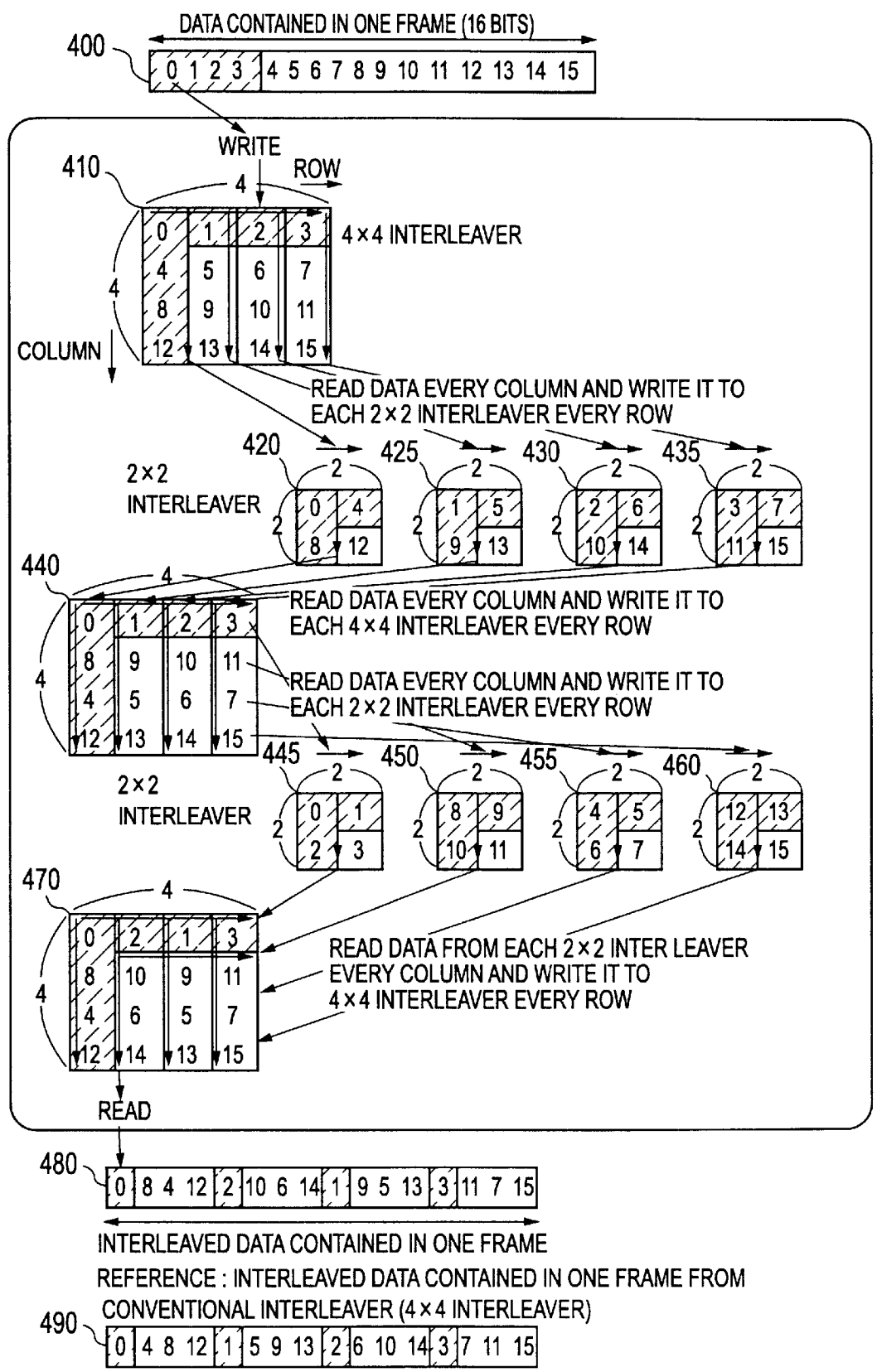
FIG. 5 is a diagram showing the interleaving method according to a third embodiment of the present invention.

In the following, a third embodiment of the present invention will be described. FIG. 5 shows an interleaving method of the third embodiment of the present invention. The embodiment is a method in which methods of the first and second embodiments are utilized in combination and each of the interleaving methods is repeated.

In FIG. 5, single frame data 400 of 16 bits is input and written to a buffer of a 4×4 (=16) interleaver 410 in the row direction. Each of the 4 columns consists of 4 bits and is interleaved by one of four 2×2 (=4) interleavers 420, 425, 430, 435 as shown in FIG. 5. That is, each of the columns is written into the buffer of the 2×2 (=4) interleavers such as the interleaver 420 in the row direction.

Next, the 2 bits of each column of each 2×2 (=4) interleaver are read successively and returned to each column of the 4×4 interleaver 410. In this case, another 4×4 interleaver 440 can be used instead of the 4×4 interleaver 410.

Each row data is read from the interleaver 410 or 440 and is interleaved by a corresponding one of four 2×2 (=4) interleavers 445, 450, 455, and 460. That is, the row data of the interleaver 410 or 440 is written to the buffer of the 2×2 (=4) interleaver in the row direction.

Next, 2 bits of each column of every 2×2 interleaver such as the interleaver 445 are successively read and returned to each row of the 4×4 interleaver 410 or 440. In this case, another 4×4 interleaver 470 can be used instead of the 4×4 interleaver 410 or 440. After all column data of the 2×2 interleavers 445–460 are returned, the buffer of the 4×4 interleaver 410, 440, or 470 is read in the column direction and interleaved data 480 is extracted.

According to the above-mentioned method, since the performances in terms of the criteria (1) and (2) are improved simultaneously, the interleaving performance can be further improved.

Therefore, according to the present invention, in an interleaving of an N×M buffer size, two successive input bits can be separated such that the distance between the two bits becomes more than 2N bits in the output series after interleaving is repeated enough times, and two successive two output bits can be separated in the input series such that the distance between the two bits is more than 2M bits. For example, in the case of 8×8 buffer size interleaving, two successive input bits can be separated farther apart than 2×8 bits in the output series after three times of repeated interleaving and two successive output bits can be separated farther apart than 2×8 bits in the input series.

Further, the present invention can be used for randomization of burst error arising in a burst error transmission line or a burst error recording medium, and also can be used for an interleaving method applied to turbo encoding.

Figure 6:
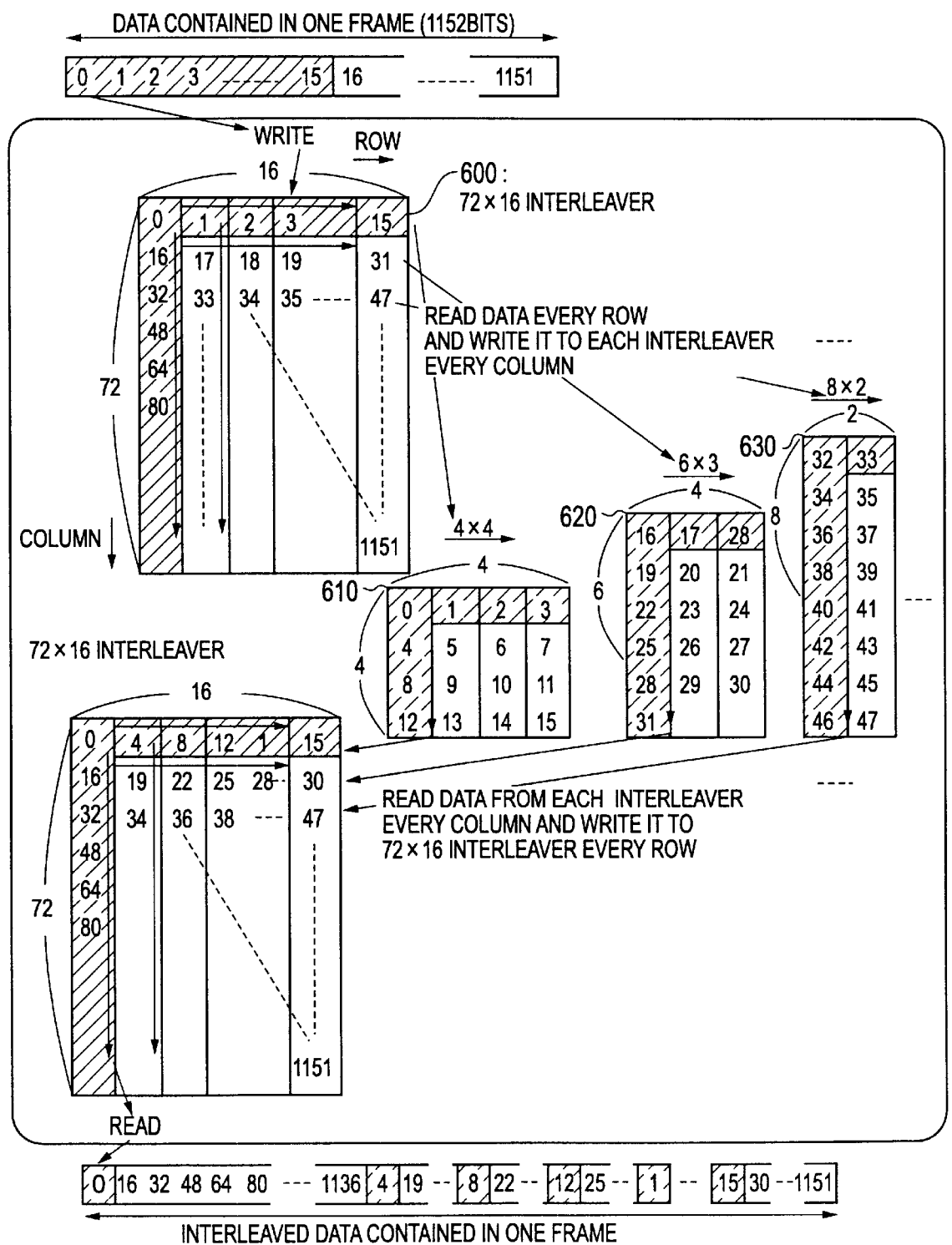
FIG. 6 is a diagram showing the interleaving method according to a fourth embodiment of the present invention.

In the following, a fourth embodiment of the present invention will be described. FIG. 6 shows the embodiment.

It is not necessary to use the same interleavers repeatedly for the same interleaving step as in the above-mentioned first to third embodiments. As shown in FIG. 6, after writing an input series to a 72×16 interleaver 600, each row of the interleaver 600 is read by 16 bits. In this case, the interleaver's shape can be varied such that the first row is written to a 4×4 interleaver 610, the second row is written to a 6×3 interleaver 620, and the third row is written to a 8×2 interleaver 630, and the like. It is also not necessary to fill an interleaver buffer with input data, for example, a 6×3 interleaver may be used for the 16-bit input series.

Figure 7:
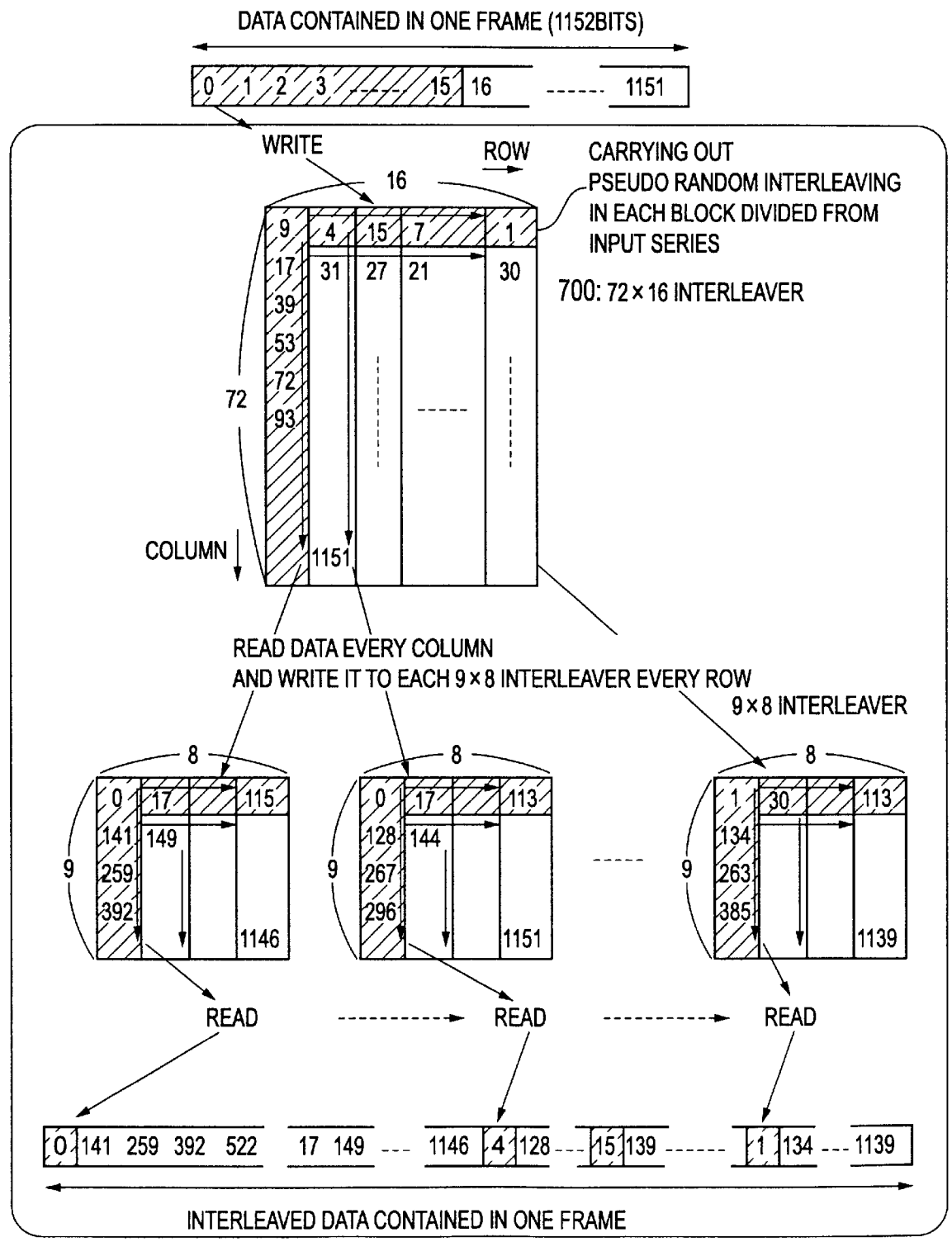
FIG. 7 is a diagram showing the interleaving method according to a fifth embodiment of the present invention.

A fifth embodiment of the present invention will be described in the following. FIG. 7 shows the fifth embodiment.

FIG. 7 shows an example of interleaving similar to that shown in FIG. 2. In the case of the example shown in FIG. 2, an input series is divided into a plurality of 16 bit blocks, wherein the sequence of the bits in each block remains in the same order of time in the first interleaving step. On the other hand, in the case of the example shown in FIG. 7, pseudo-random interleaving is performed on each block and the data in the block is written to a 72×16 interleaver 700. Thus, interleaving repeating processes of the present invention can be combined with interchanging processes of a bit sequence such as that used for a pseudo-random interleaving method. FIG. 7 shows an example of such an interleaving method.

Next, a sixth embodiment of the present invention will be described. In the above-mentioned embodiments, interleaving methods by a bit unit are described. Interleaving by a symbol unit is also possible. In the following, the sixth embodiment will be described as an example of the interleaving by a symbol unit.

First, L-bit length data is written to an N×M (L≦N×M) block interleaver.

Here, one symbol will be considered to be K bits hereinafter. That is, in an N×M block interleaver, successive (adjacent) K bits will be considered to be one symbol.

In a first case in which K successive bits in the vertical direction are assumed to be one symbol, a block interleaver can be considered to be an (N/K) symbol×M symbol block interleaver. Therefore, symbol interleaving is possible by performing multiple stage interleaving in the vertical direction and in the horizontal direction in the way mentioned above and by converting the symbol to bits, which are read out. In a second case in which K bits in the horizontal direction are assumed to be one symbol, the block interleaver can be considered to be an N symbol×(M/K) symbol block interleaver. Therefore, symbol interleaving is also possible. Further, in a third case in which K adjacent bits are considered to be one symbol where K is N1×M1, the block interleaver can be considered to be an (N/N1) symbol×(M/M1) symbol block interleaver, thereby symbol interleaving is also possible.

Figure 8:
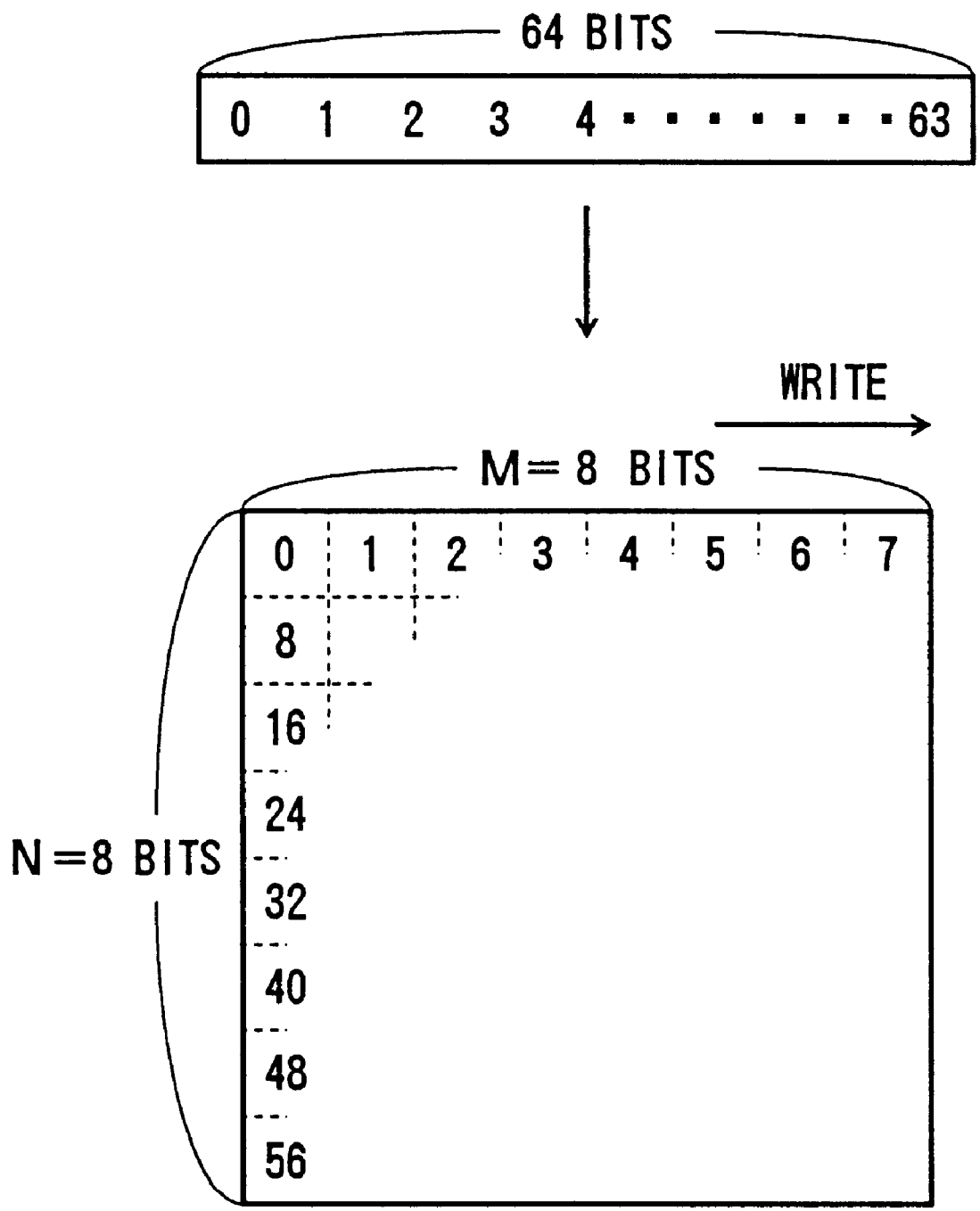
FIG. 8 is a diagram showing that L=64-bit length data is written in a block interleaver of 8 bits×8 bits.

Concrete examples of the above-mentioned methods will be described with reference to figures. FIG. 8 shows L=64 bit length data written to an (N=) 8 bit×(M=) 8 bit block interleaver. The following processes will be described with reference to FIG. 9–FIG. 11 corresponding the above mentioned first case to third case respectively.

Figure 9:
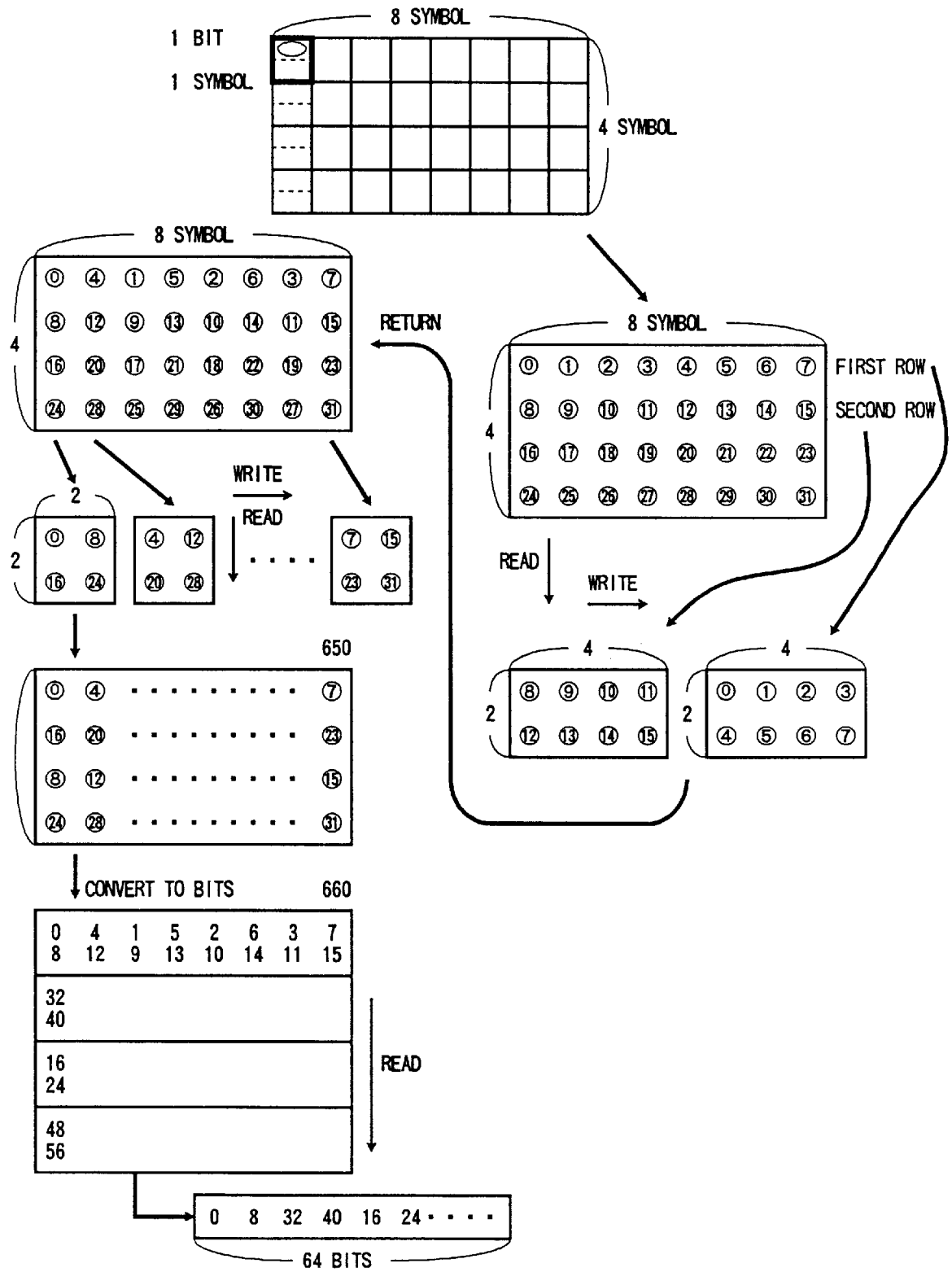
FIG. 9 is a diagram showing a first case of interleaving by a symbol unit.

FIG. 9 shows the first case in which K equals 2. A 4 symbol×8 symbol block interleaver shown in FIG. 9 is interleaved in the above-mentioned way of a bit unit, and symbols in an interleaver 650 are converted into bits, thereby an interleaver 660 is generated, and, then, the bits are read out.

Figure 10:
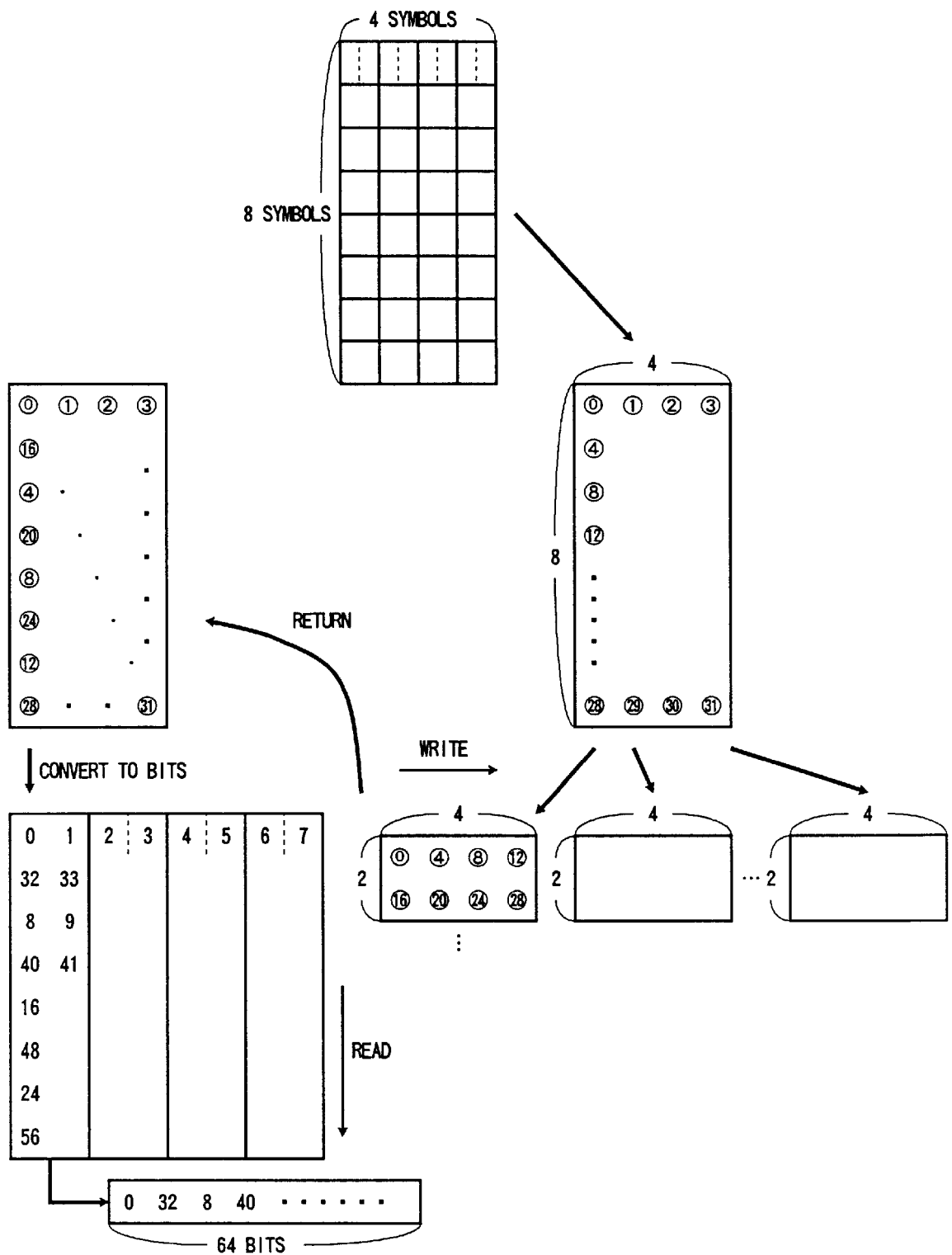
FIG. 10 is a diagram showing a second case of interleaving by a symbol unit.
Figure 11:
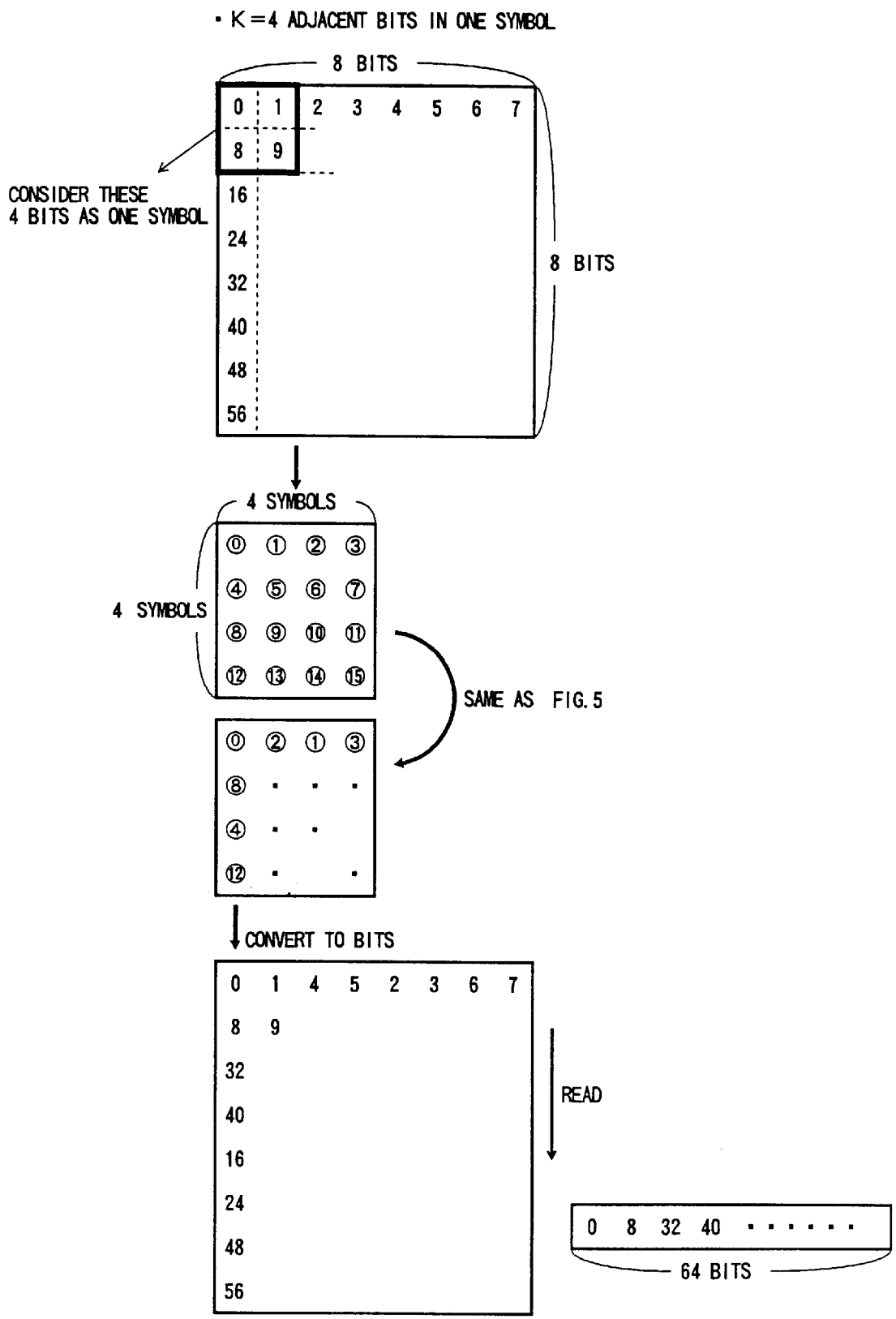
FIG. 11 is a diagram showing a third case of interleaving by a symbol unit.

In the second case in which K equals 2, interleaving is performed as shown in FIG. 10, and, in the third case in which K equals 4, interleaving is performed as shown in FIG. 11. The precise description of these methods will be omitted because it is obvious from these figures and above descriptions.

As mentioned above, according to the interleaving method in the first to sixth embodiments of the present invention, the aforementioned first objective is achieved. That is, by applying an interchanging process on a data sequence repeatedly after writing to or reading from a buffer once, the performance of interleaving will improve as compared with the conventional method in which reading and writing is performed in order of time one by one.

The interleaving method of the present invention will be called a multiple interleaving method hereinafter.

As mentioned above, in the case of a digital system, permutation in interleaving is performed by the bit or the symbol. The above-mentioned methods show the way of writing data in a buffer and reading out the data. It is also possible to use a pattern (which will be called an interleaving pattern hereinafter) as sequence permutation information in interleaving which will be referred to when interleaving data. Although, interleaving can be performed by the bit or by the symbol, or the like, an example by the bit will be shown in the following for the sake of simplicity.

Figure 12:
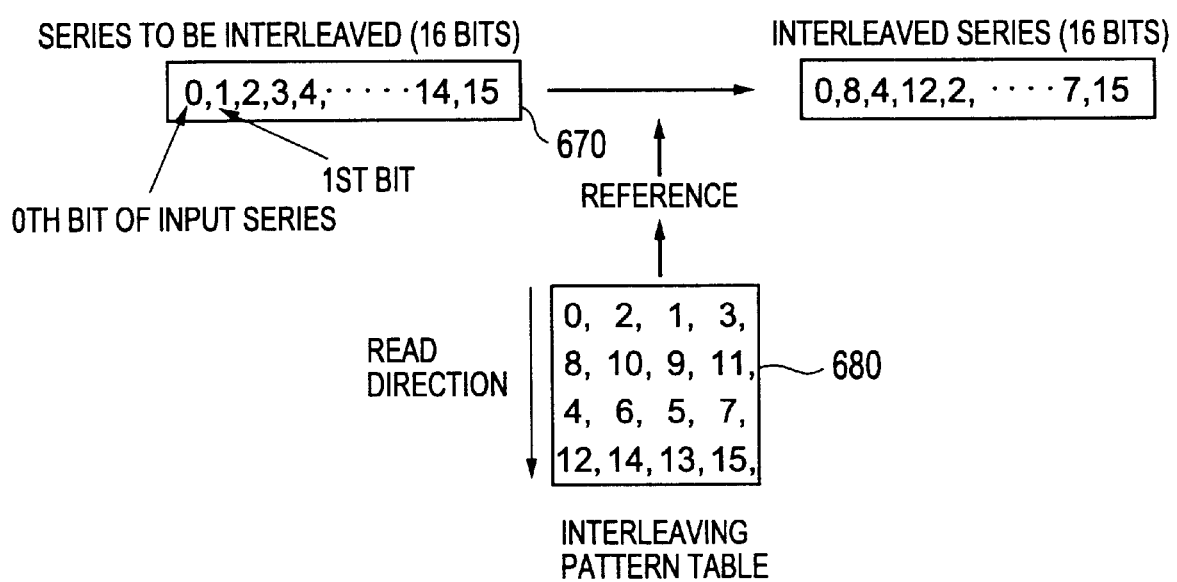
FIG. 12 is a diagram for explaining an interleaving process.

FIG. 12 shows an example of interleaving of a 16-bit series. As shown in FIG. 12, bit-by-bit interleaving is carried out by referring to an interleaving pattern table. In FIG. 12, as for an input 16-bit series 670 which will be interleaved, the sequence of the bits (or the symbols and the like) in the input series are altered according to the sequence stored in the interleaving pattern table 680.

As shown in FIG. 12, the sequence in the interleaving pattern table 680 is read out in order of the vertical direction, as indicated by an arrow, as 0, 8, 4, 12, 2, . . . . Then, the bits of the 16-bit series are interchanged according to the read out sequence such that the 0th bit of the input series is interchanged to the 0th bit of the output series and the first bit is interchanged to the eighth bit and the like. After that, an interleaved bit series is output.

Next, embodiments of the present invention for achieving the second objectives will be described starting from a seventh embodiment.

Figure 13:
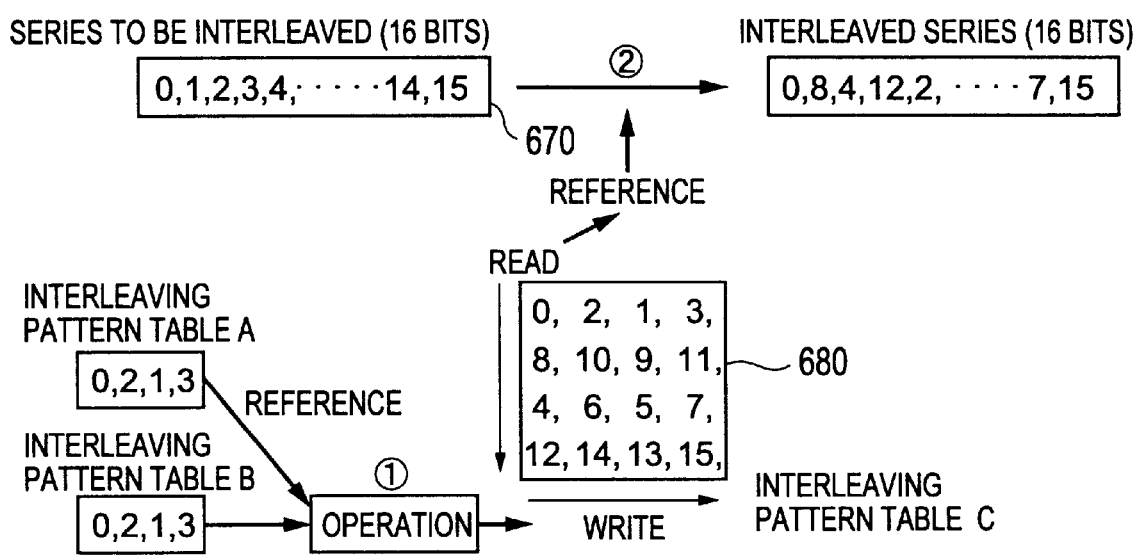
FIG. 13 is a diagram for explaining an interleaving process according to a seventh embodiment of the present invention.
Figure 14:
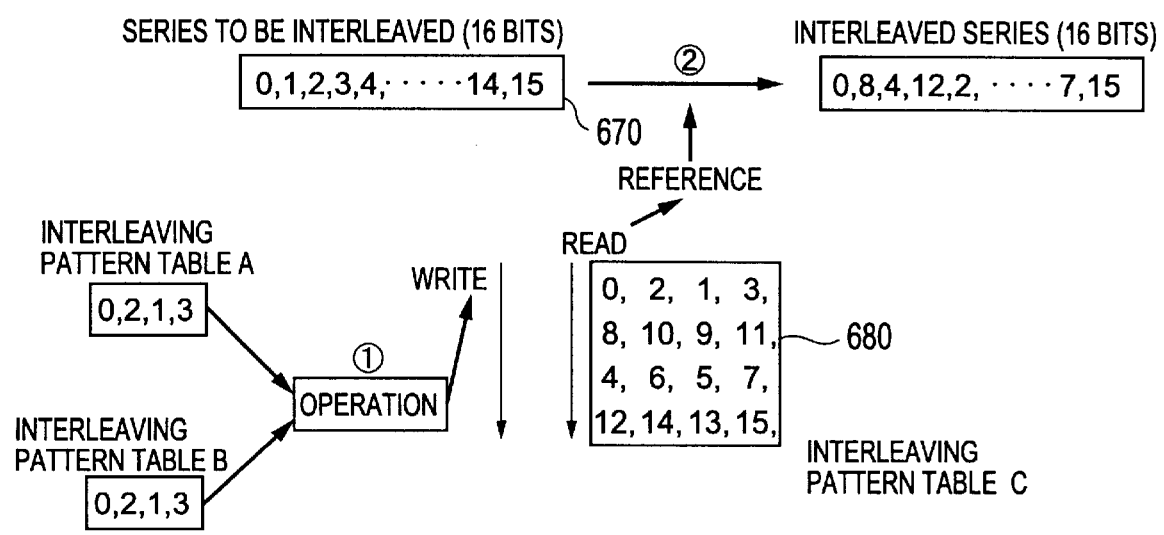
FIG. 14 is a diagram for explaining an interleaving process according to the seventh embodiment of the present invention.
Figure 15:
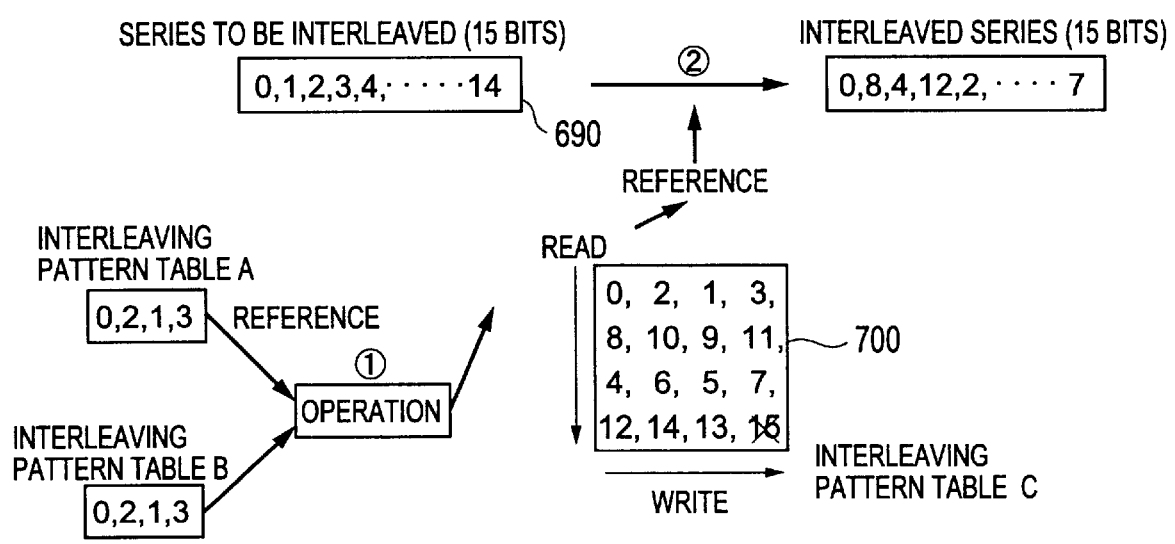
FIG. 15 is a diagram for explaining an interleaving process according to the seventh embodiment of the present invention.

FIG. 13–FIG. 15 show the seventh embodiment of the present invention.

In FIG. 13 and FIG. 14, an example of interleaving a 16-bit series 670 is shown. That is, an interleaving pattern table A and an interleaving pattern table B, both of which describe a 4 bit series conversion, are provided, and an interleaving pattern table C 680 for 16 (4×4) bit series conversion is generated by the two 4 bit interleaving pattern tables. Then, interleaving of the input 16 bit series 670 is performed with the generated 16 bit series interleaving pattern table.

In FIG. 13, the prepared table A defines the writing direction to the interleaving pattern table C and the table B defines the direction perpendicular to the writing direction. When carrying out interleaving of L=16 bits, the interleaving pattern table C which describes an L ($\leq$LA×LB) bit interleaving pattern is generated by using the interleaving pattern table A which describes an LA=4 bit interleaving pattern and the interleaving pattern table B which describes an LB=4 bit interleaving pattern. (1̂ in FIG. 13)

According to the example shown in FIG. 13, an operation for generating C[i] of the interleaving pattern table which means ith bit of the bit series C is $$C[i]=A[i\%LA]+LA \times B[i/LA],$$

wherein LA=4, and i is an address indicating a bit location of the bit series and is an integer equal to or larger than 0.

An address indicating a bit location of a series will be represented by one of i, j, k, each of which is an integer equal to or more than 0 hereinafter. A[i] means ith element of the table A. "%" is a modulo operator and "i%LA" means remainder of i divided by LA. "i/LA" means the integer part (in which a fractional portion is dropped) of the result of i divided by LA. The meanings of these operators are the same hereinafter. The table A defines the pattern in a horizontal direction of the table C and the table B defines the pattern in a vertical direction.

The interleaving pattern table C 680 is generated by writing the result to the interleaving pattern table C 680 in the horizontal direction.

When interleaving, bits in the table C are read sequentially in the vertical direction and interleaving of the input series is performed by referring to the bits. (2̂ in FIG. 13) That is, permutation of the sequence of the bits in the series is performed according to the sequence stored in the interleaving pattern table C 680.

In this case, it is not necessary to read out data downward, nor is it necessary to write rightward. Instead, those directions can be reverse to that shown in the figure. For example, reading out may be upward.

Further, in FIG. 13, although it is mentioned that the prepared table A defines the writing direction to an interleaving pattern table C and the table B defines the direction perpendicular to the writing direction, the relationship between table A and B can be interchanged. In addition, the interleaving pattern table A and B can be the same or different patterns.

If the table A and the table B are the same, it is necessary to use only one of the tables. For example, C[i] can be represented as $$C[i]=A[i\%LA]+LA \times A[i/LA], \text{ or}$$

$$C[i]=B[i\%LB]+LB \times B[i/LB].$$

These features are the same in FIG. 13–FIG. 21.

FIG. 14 shows another operation in which the same result as that shown in FIG. 13 can be obtained. The interleaving pattern C 680 in FIG. 14 is generated by $$C[i]=LA \times B[i\%LB]+A[i/LB]$$

(1̂ in FIG. 14) which is different from the case shown in FIG. 13. In this case, the table A defines a pattern of a horizontal direction of the table C, and the table B defines a pattern of a vertical direction of the table C. The result is written to the table C in the vertical direction.

The relationship between tables A and B can be interchanged. Also, the interleaving pattern tables A and B can be the same or different patterns. If the table A and the table B are the same, it is necessary to use only one of the tables.

When interleaving, the bits in the table C are read out in the same (vertical) direction sequentially, thereby the input series is interleaved by referring to the bits (2̂ in FIG. 14).

Thus, it is possible to change the operation for the interleaving pattern table C 680. In addition, the reading direction is not necessarily the same as the writing direction, and both directions are not necessarily the same as those shown in FIG. 14. That is, the writing direction and reading direction can be set freely.

FIG. 15 shows an example of 15-bit interleaving instead of the 16 bit interleaving shown in FIG. 13 or FIG. 14.

As shown in FIG. 15, when interleaving L=15 bit input data, the interleaving pattern table C 700 which describes an L ($\leq$LA×LB) bit interleaving pattern is generated by using the interleaving pattern table A which has the LA=4 bit interleaving pattern and the interleaving pattern table B which has the LB=4 bit interleaving pattern ($\hat{1}$ in FIG. 15). In the same way as shown in FIG. 13, the method for generating the interleaving pattern table C 700 is $$C[i]=A[i\%LA]+LA\times B[i/LA],$$

wherein LA=4. The table A defines the pattern in the horizontal direction of the table C and the table B defines the pattern in the vertical direction.

The result is written to the table C in a horizontal direction. Since the table C has the 16 bit interleaving pattern, the 15 bit interleaving is performed by reading out the table C sequentially in the vertical direction and by discarding a number equal to or larger than 15 when the number is read. ($\hat{2}$ in FIG. 15).

As shown in FIG. 15, the 15 bit interleaving is available by skipping the number equal to or larger than 15. Also, the table C which includes the 15 bit interleaving pattern can be generated to perform the 15 bit interleaving by inhibiting data equal to or larger than 15 from being written when writing data to the table C. That is, as shown in FIG. 15, in the case of generating the 15 (<4×4) bit interleaving pattern table C with the table A storing the 4 bit interleaving pattern and the table B storing the 4 bit interleaving pattern, it is possible to generate the 15 bit interleaving pattern table C by not writing a number larger than 14 (=15−1).

According to the seventh embodiment, from one interleaving pattern table (in the case of A=B), or from two interleaving pattern tables, for example, an interleaving pattern table which has a larger interleaving length is generated. Thus, a pattern of a certain interleaving length can be represented by a plurality of patterns of a smaller interleaving length. Therefore, a memory amount for fixed length patterns can be decreased.

For example, conventionally, in the case of using a 1000 bit interleaving pattern table, memory for the 1000 bit interleaving pattern table is necessary. According to the seventh embodiment, by representing a 1000 bit interleaving pattern table with a 20 bit interleaving pattern table and a 50 bit interleaving pattern table, the memory can be decreased to an amount for 70 (=20+50) bits.

In addition, by representing a 900 bit interleaving pattern table with a 20 bit interleaving pattern table and a 50 bit interleaving pattern table, interleaving for 1000 bits and 900 bits is possible without enlarging the fixed length interleaving pattern table.

Figure 16:
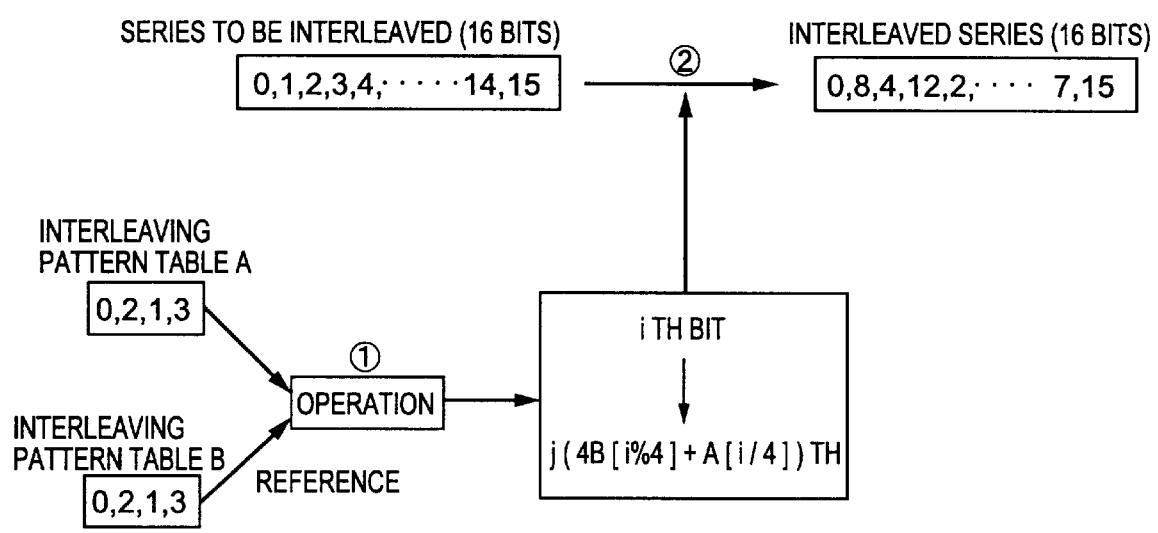
FIG. 16 is a diagram for explaining an interleaving process according to an eighth embodiment of the present invention.
Figure 17:
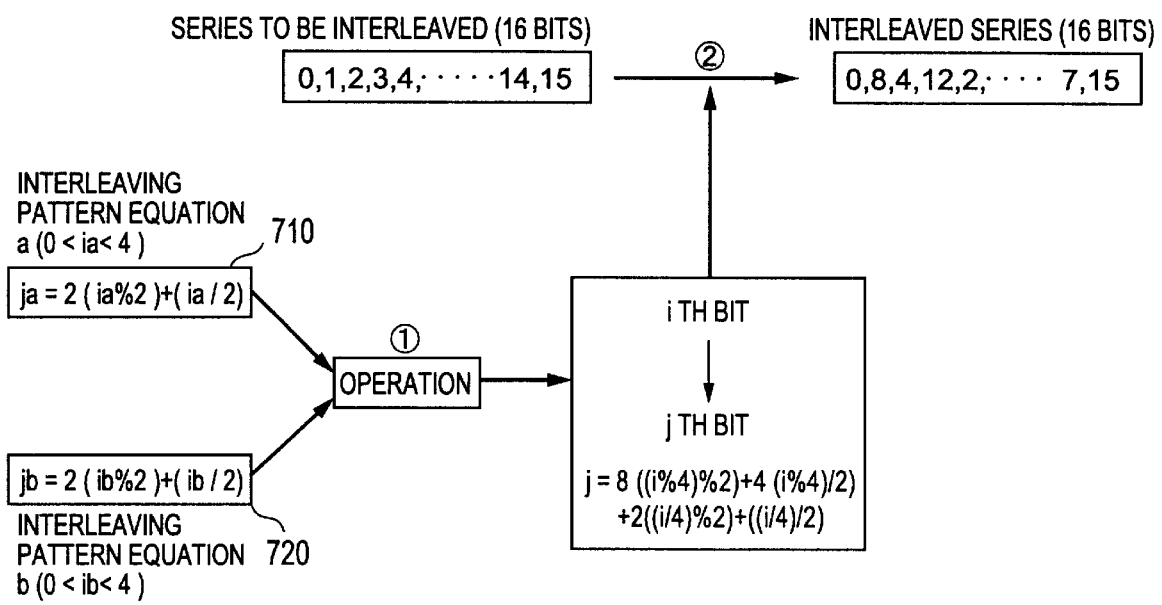
FIG. 17 is a diagram for explaining an interleaving process according to the eighth embodiment of the present invention.

Next, an eighth embodiment will be described. According to the eighth embodiment of the present invention, the same result as that of the seventh embodiment shown in FIG. 13–FIG. 15 is obtained. However, the interleaving pattern table C is not generated for interleaving, instead of that, an interleaving destination is directly obtained by calculating it from the table A and the table B. FIG. 16 and FIG. 17 show the eighth embodiment.

In FIG. 16, an example of a 16 bit input series in which the same result as that of FIG. 13 can be obtained is shown.

As shown in FIG. 16, the interleaving pattern table C is not generated, unlike the example of FIG. 13. Each destination for interchanging a bit in the input series is calculated ($\hat{1}$ in FIG. 16) from the table A storing the 4 bit interleaving pattern and the table B storing the 4 bit interleaving pattern, thereby the input series is interleaved on the basis of the result of the calculation ($\hat{2}$ in FIG. 16).

A formula for calculating directly the interleaving destination which is a jth element corresponding to an ith element in the input series from the table A and the table B is $$C[i]=4B[i\%4]+A[i/4]$$

The relationship between the table A and B can be interchanged. And, the interleaving pattern tables A and B can be the same or different patterns. If the table A and the table B are the same, it is necessary to use only one of the tables. That is, $$j=4A[i\%4]+A[i/4]=4B[i\%4]+B[i/4].$$

In FIG. 17, interleaving pattern equations (710, 720) are used for defining interleaving instead of preparing for the interleaving pattern tables A and B. Also, interleaving is performed by calculating the interleaving pattern equation ($\hat{1}$, $\hat{2}$ in FIG. 17).

The equation a 710 and the equation b 720 each of which equations represents a 4 bit interleaving pattern, are expressed as $$ja=2(ia\%2)+(ia/2)=fa(ia)$$

wherein $0 \leq ia \leq 4$ $$jb=2(ib\%2)+(ib/2)=fb(ib)$$

wherein $0 \leq ib \leq 4$.

An interleaving destination which is a jth element corresponding to an ith element in the 16 bit input series is calculated by using both of the equation a and the equation b sequentially, which is the same as calculating $$j=4fa(i\%4)+fb(i/4)=8((i\%4)\%2)+4((i\%4)/2)+2((i/4)\%2)+((i/4)/2),$$

thereby performing interleaving.

The relationship between the equation a and b can be interchanged. Also, the interleaving pattern equations a and b can be the same or different equations. If the equation A and the equation B are the same, it is necessary to use only one of the equations.

In the interleaving shown in FIG. 17, it is also possible to perform interleaving after generating an interleaving pattern table by calculating a 16 bit interleaving pattern from the prepared 4 bit equations and writing the result of the calculation in the table, which is the same as the case of the seventh embodiment in which an interleaving pattern is defined by formulas instead of a pattern table.

According to the eighth embodiment, from one interleaving pattern table (when A=B), or from two interleaving pattern tables, interleaving of a larger interleaving length is performed. Therefore, it is characterized there is no need to generate another interleaving pattern table.

Further, from one interleaving pattern equation (when a=b), or from two interleaving pattern equations, interleaving of a larger interleaving length can be performed. In this case, it is unnecessary to generate another interleaving pattern table. However, it is possible to generate an interleaving pattern table.

A ninth embodiment will be described in the following. The ninth embodiment is an example in which a process shown in the seventh embodiment or the eighth embodiment is applied repeatedly a plurality of times. The ninth embodiment will be described with reference to FIG. 18–FIG. 22.

Figure 18:
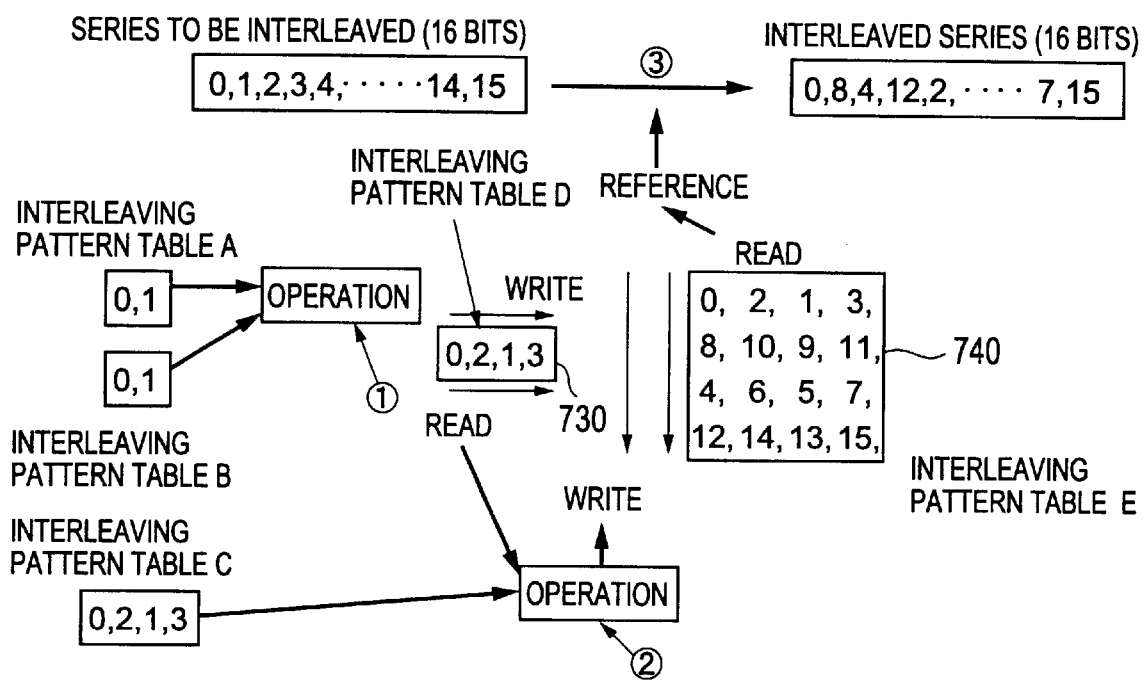
FIG. 18 is a diagram for explaining an interleaving process according to a ninth embodiment of the present invention.

FIG. 18 shows an example in which a 16 bit interleaving pattern table is generated from two 2 bit interleaving pattern tables A, B and a 4 bit interleaving pattern table C by applying a process shown in the seventh embodiment in FIG. 13 repeatedly a plurality of times.

As shown in FIG. 18, when interleaving L=16 bit input data, an interleaving pattern table D 730 which has an L=4($\leq$LA×LB) bit interleaving pattern is generated by using the interleaving pattern table A which has an LA=2 bit interleaving pattern and the interleaving pattern table B which has an LB=2 bit interleaving pattern ($\hat{1}$ in FIG. 18).

An operation for generating the interleaving pattern table D 730 is, for example, $$D[i]=2A[i\%2]+B[i/2],$$

(when the table A defines a writing direction of the table D and the table B defines a direction perpendicular to the writing direction of the table D.)

Next, an interleaving pattern table E 740 which has LE=16($\leq$LC×LD) bit interleaving pattern is generated by referring to the generated interleaving pattern table D and the interleaving pattern table C which has an LD=4 bit interleaving pattern ($\hat{2}$ in FIG. 18).

An operation for generating the interleaving pattern table E 740 is, for example, $$E[i]=4D[i\%4]+C[i/2],$$

(in the case that the table D defines a horizontal direction of the table E and the table C defines a vertical direction of the table E.)

By referring to the interleaving pattern table E which was thus generated, interleaving of the 16 bit series is performed ($\hat{3}$ in FIG. 18).

The relationship between the table A and B can be interchanged. Also, the interleaving pattern tables A and B can be the same or different patterns. If the tables A and B are the same, it is necessary to use only one of the tables can be used. That is, $$C[i]=A[i\%4]+4A[i/4]=B[i\%4]+4B[i/4].$$

In addition, the reading direction is not necessarily the same as the writing direction, and the both directions are not necessarily the same as shown in FIG. 18.

Figure 19:
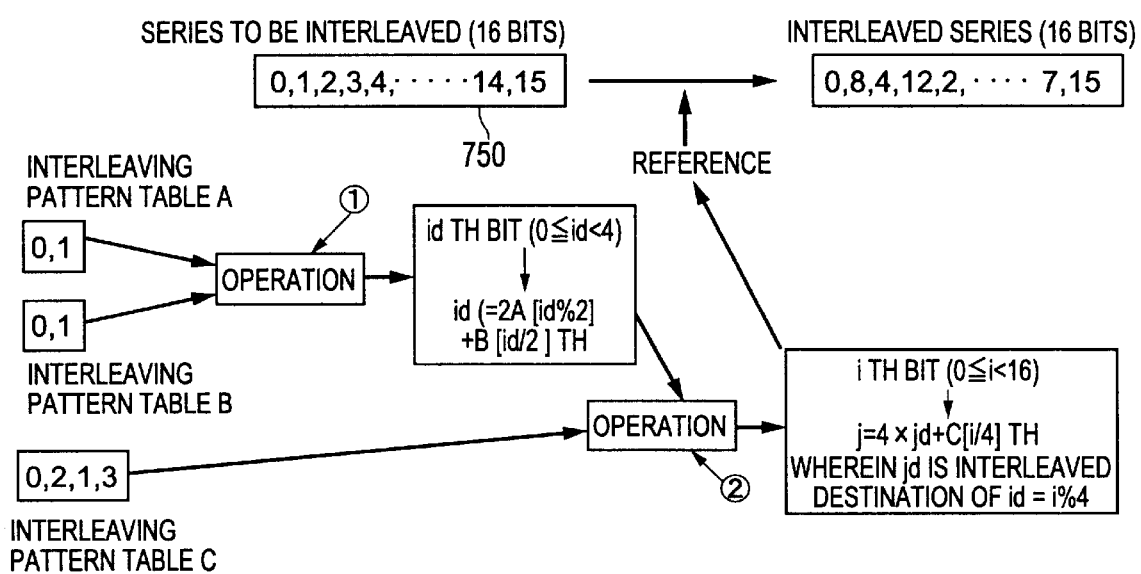
FIG. 19 is a diagram for explaining an interleaving process according to the ninth embodiment of the present invention.

FIG. 19 shows an example in which 16 bit interleaving is performed with two 2 bit interleaving pattern tables A, B and a 4 bit interleaving pattern table C by assembling processes shown in the eighth embodiment in FIG. 16 repeatedly a plurality of times.

As shown in FIG. 19, the interchanging destination which is a jdth bit corresponding to an idth (0$\leq$id<4) bit in a 4 bit series is calculated by referring to the table A and the table B. The operation is, for example, $$jd=2A[id\%2]+B[id/2]$$

in a case where the table A defines a writing direction of the table C and the table B defines a direction perpendicular to the writing direction of the table C.

Next, the interchanging destination which is a jth bit from a ith (0$\leq$i<16) bit in a 16 bit input series 750 is calculated by referring to the result of the above mentioned operation and the interleaving pattern table C ($\hat{2}$ in FIG. 19). The operation is, for example, $$j=4\times jd+C[i/4]$$

wherein jd is a interchanging destination of id=i%4.

Finally, interleaving is performed by interchanging the bit sequence of the 16 bit series on the basis of the result of the above mentioned operations ($\hat{3}$ in FIG. 19).

The relationship between the table A and B can be interchanged. Also, the interleaving pattern tables A and B can be the same or different patterns. If the tables A and B are the same, it is necessary to use only one of the tables. In such a case, $$C[i]=A[i\%4]+4A[i/4]=B[i\%4]+4B[i/4]$$

can be applied.

Also, an interleaving pattern table can be generated by storing the result of the calculation in a table.

Figure 20:
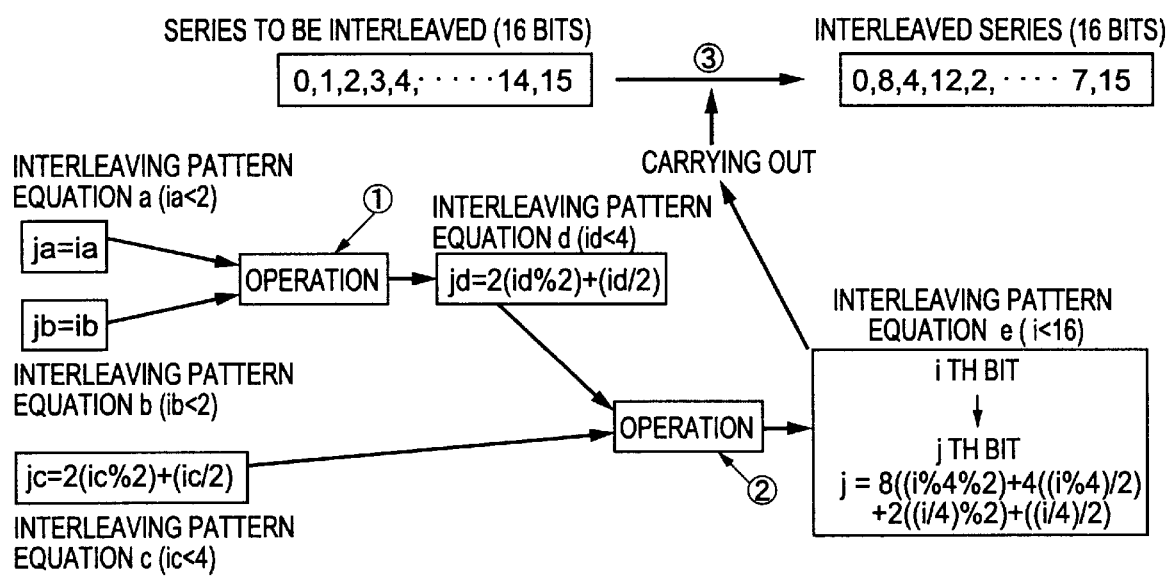
FIG. 20 is a diagram for explaining an interleaving process according to the ninth embodiment of the present invention.

FIG. 20 shows an example in which a process shown in FIG. 17, which shows the eighth embodiment which defines interleaving by equations, is repeated.

As shown in FIG. 20, first, an equation d for describing a 4 bit interleaving pattern, which is $$jd=2(id\%2)+(id/2),$$

is generated from an equation a (ja=ia) and an equation b (jb=ib), each of which equations describes a 2 bit interleaving pattern ($\hat{1}$ in FIG. 20).

Next, a 16 bit interleaving equation e, which is $$je=8((ie\%4)\%2)+4((ie\%/4)/2)+2((ie/4)\%2)+((ie/4)/2),$$

is calculated from the 4 bit equation c and the equation d ($\hat{2}$ in FIG. 20). Then, interleaving is performed with the calculated equation e ((a in FIG. 20).

It is also possible to perform interleaving after generating an interleaving pattern table by writing the result of the above mentioned calculation to a table.

Figure 21:
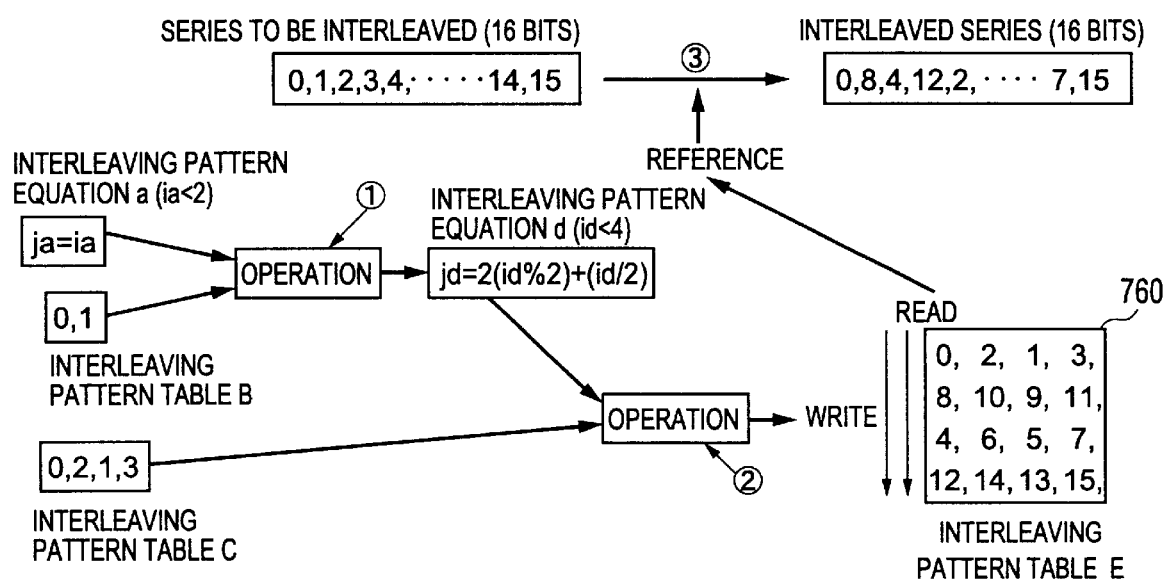
FIG. 21 is a diagram for explaining an interleaving process according to the ninth embodiment of the present invention.

FIG. 21 shows an example in which interleaving is performed by defining an interleave with an equation and a table and generating an interleaving pattern table on the basis of the interleave.

As shown in FIG. 21, a 4 bit interleaving equation d, which is $$jd=2(id\%2)+(id/2),$$

is generated from an equation a describing a 2 bit interleaving pattern and a 2 bit interleaving pattern table B ($\hat{1}$ in FIG. 21).

Next, a 16 bit interleaving pattern table E 760 is generated by $$E[i]=4(2(i\%4)\%2)+((i\%4)/2)+B[i/4]$$

from the equation d and a 4 bit interleaving pattern table C ($\hat{2}$ in FIG. 21). Then, interleaving is performed with reference to the table E 760 ($\hat{3}$ in FIG. 21).

Figure 22:
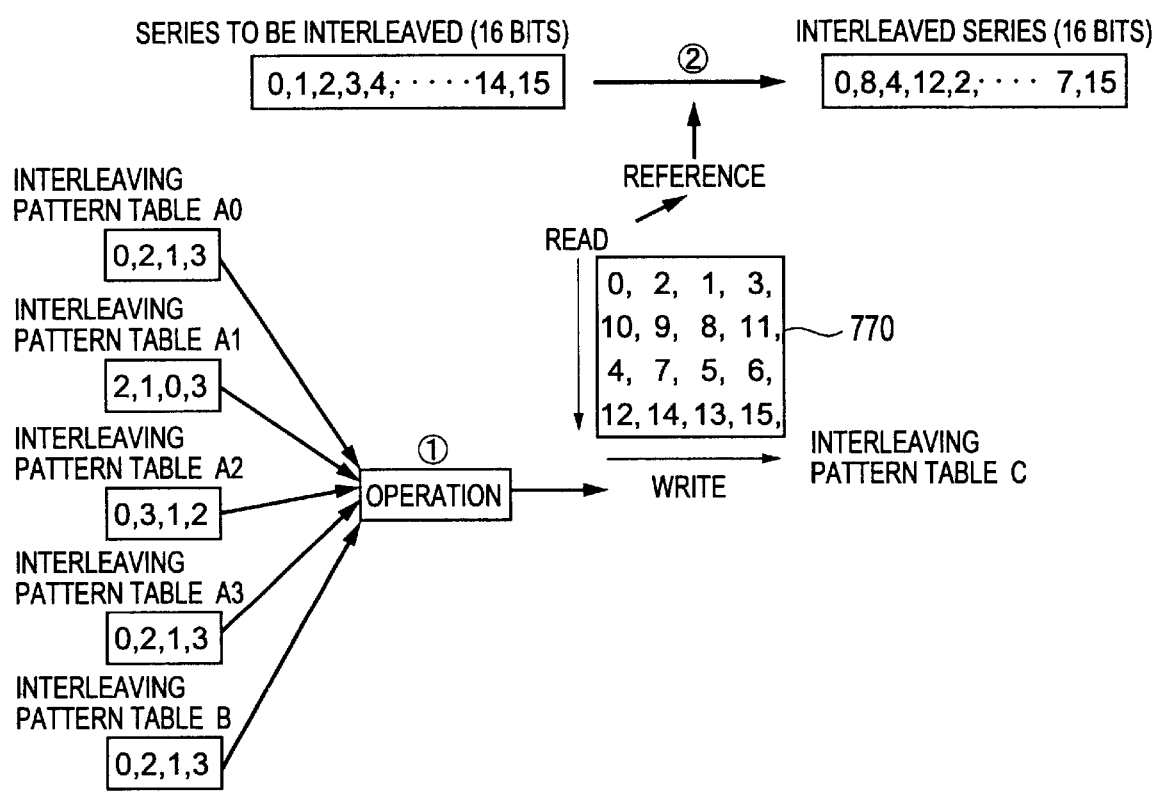
FIG. 22 is a diagram for explaining an interleaving process according to the ninth embodiment of the present invention.

FIG. 22 shows an example, which is a modification of FIG. 13, in which example a 16 bit interleaving pattern table is generated from a plurality of 4 bit tables.

As shown in FIG. 22, a 16 bit interleaving pattern table C 770 is generated by $$C[i]=Ai/4[i\%4]+4B[i/4]$$

(in the case that the table A0–A3 defines the writing direction of the table C and the table B defines the perpendicular direction to the writing direction of the table C) with a plurality of 4 bit tables A0–A3 and a 4 bit table B ($\hat{1}$ in FIG. 22). Then, interleaving is performed by referring to the table C ($\hat{2}$ in FIG. 22).

The relationship between the tables A0–A3 and B can be interchanged. Also, the interleaving pattern tables A0–A3 and B can be the same or different patterns. The reading direction is not necessarily downward and the writing direction is not necessarily rightward.

Next, an tenth embodiment will be described. The tenth embodiment shows a method in which interleaving is defined by an interleaving pattern description language, which is recognized so that an interleaving pattern is generated or interleaving is performed as was described in the above mentioned seventh–ninth embodiments.

FIG. 23–FIG. 26 are figures for explaining the definition of the interleaving pattern description language. FIG.

Figure 31:
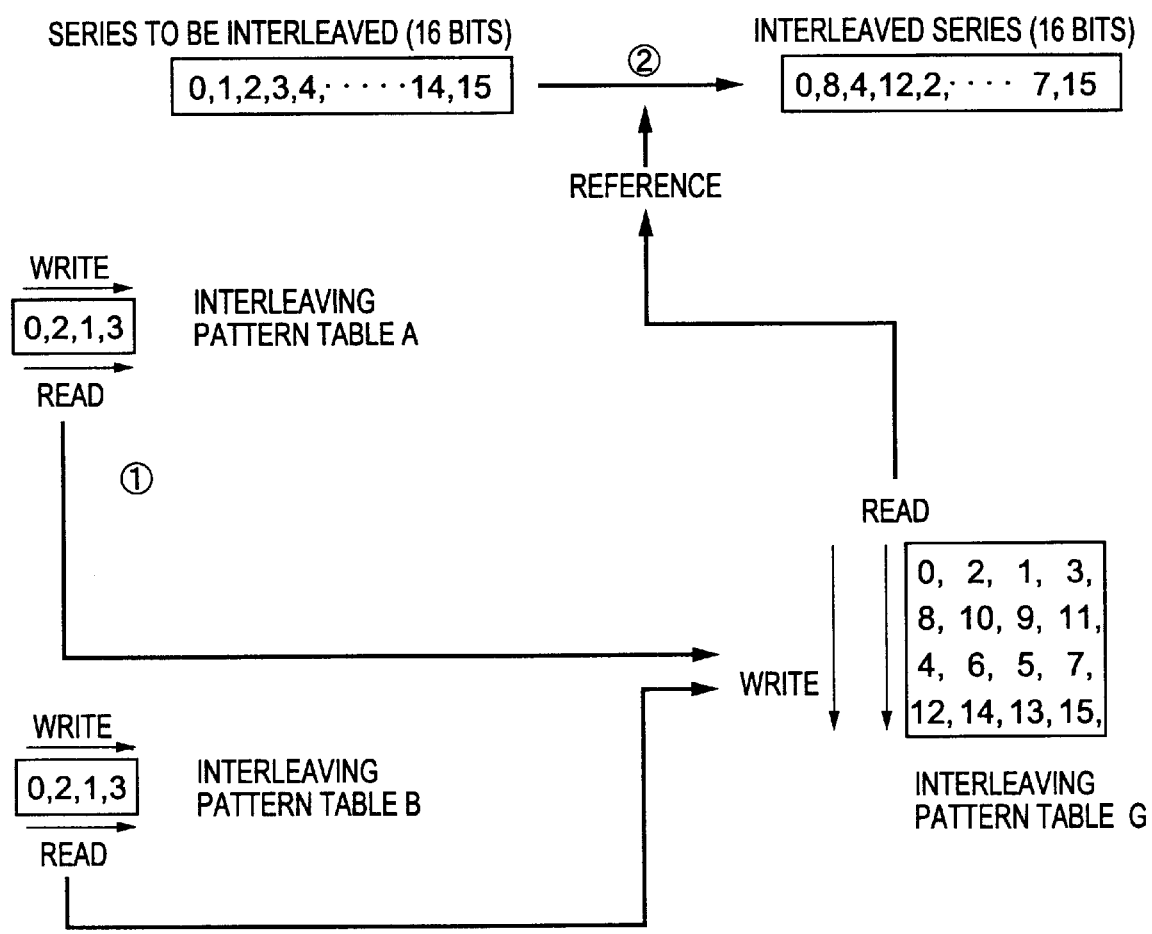
FIG. 31 is a diagram for explaining an example of realizing interleaving in the case of using the interleaving pattern description language.
Figure 32:
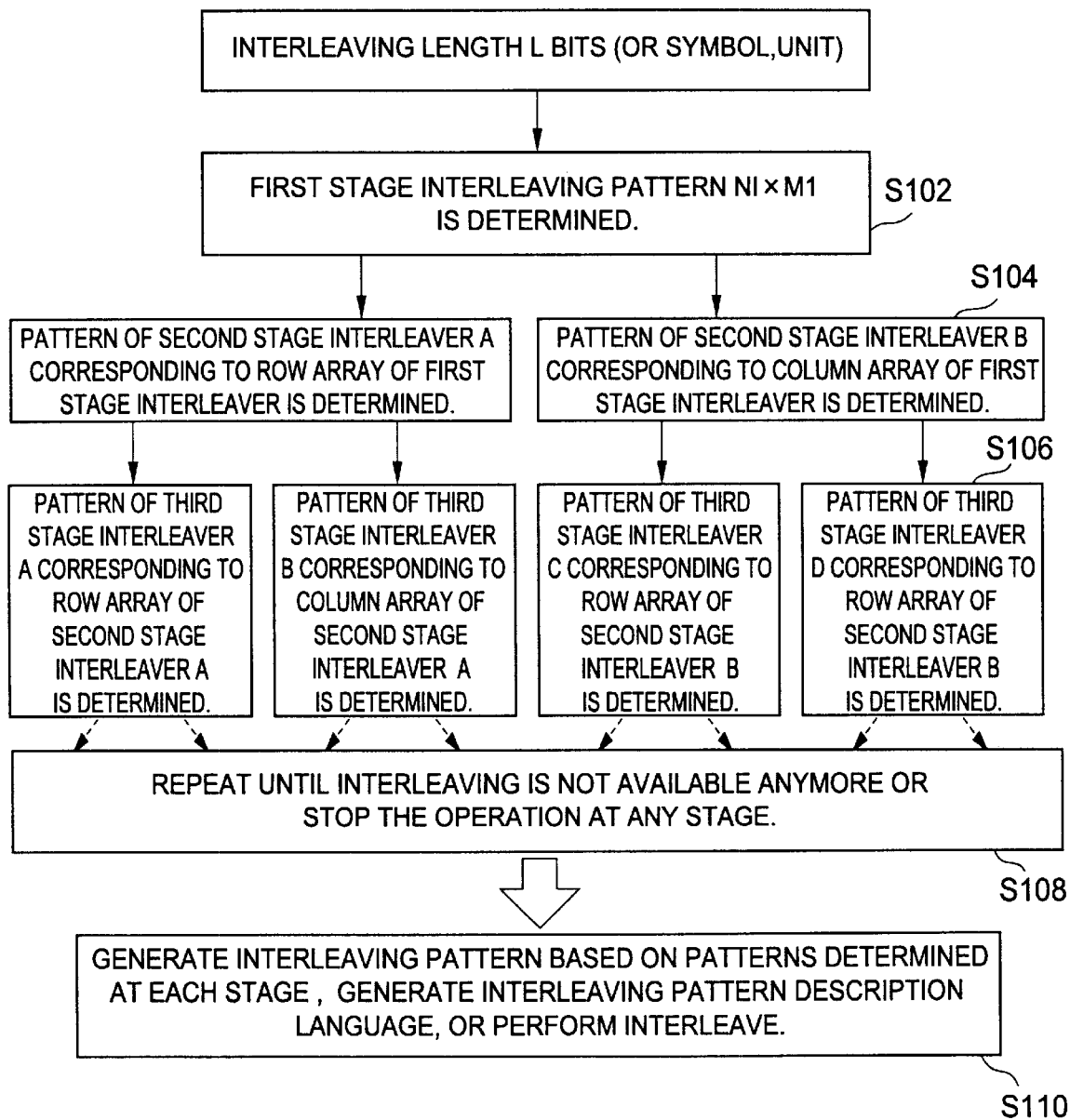
FIG. 32 is a diagram showing a process flow for generating an interleaving pattern.
Figure 33:
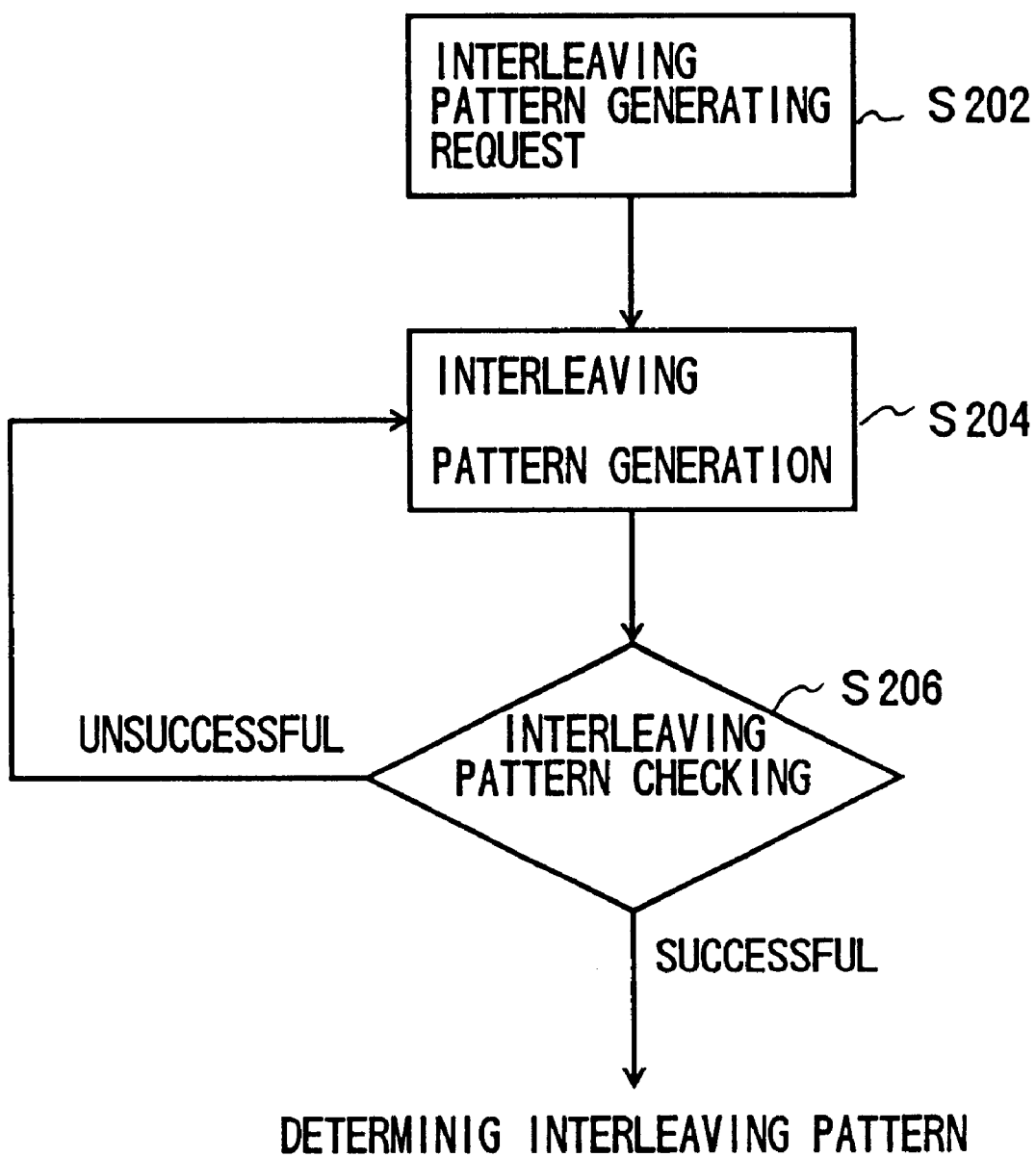
FIG. 33 is a flowchart showing a process for determining the generated interleaving pattern.

27–FIG. 31 shows examples in which a formula described by the interleaving pattern description language which is defined by FIG. 23–FIG. 26 is recognized and an interleaving pattern is generated according to one of the methods or a combination of the methods shown in the above mentioned seventh–ninth embodiments so as to perform interleaving. FIG. 32 is a diagram for explaining automatic generation of an interleaving pattern. FIG. 33 shows a flowchart for explaining a flow of determining the interleaving pattern.

First, the interleaving pattern description language will be described with reference to FIGS. 23–26.

Figure 23:
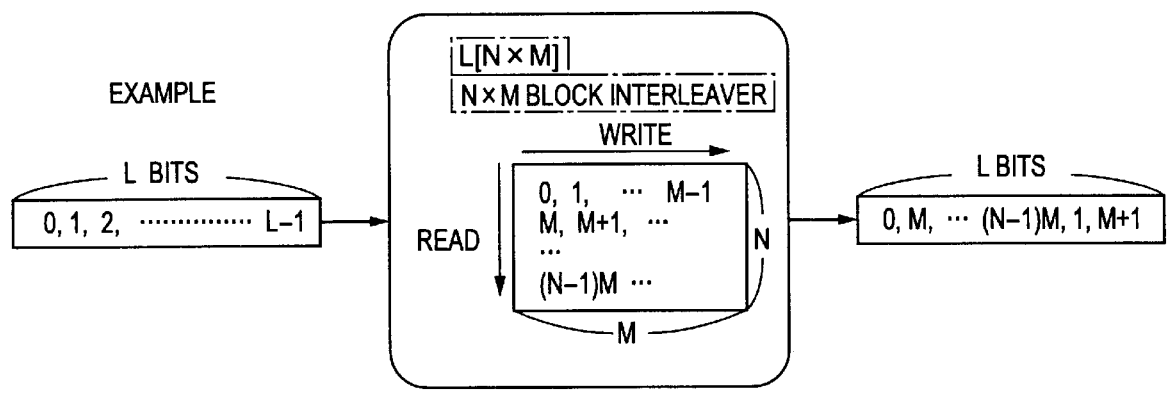
FIG. 23 is a diagram for explaining an example of definition of an interleaving pattern description language.

FIG. 23 describes definition 1 of an interleaving pattern description language L[N×M]. L[N×M] means an N×M block interleaver. This interleaver means performing interleaving of an L bit series with the N×M block interleaver. FIG. 23 shows interleaving of the L bit series by the L[N×M] block interleaver as an example.

Figure 24:
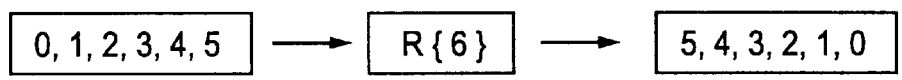
FIG. 24 is a diagram for explaining an example of definition of the interleaving pattern description language.

FIG. 24 describes a definition 2 of R{A}. R{A} means that A bits are rearranged in inverse order. FIG. 24 shows R{6} as an example in which 6 bit series are rearranged in inverse order.

Figure 25:
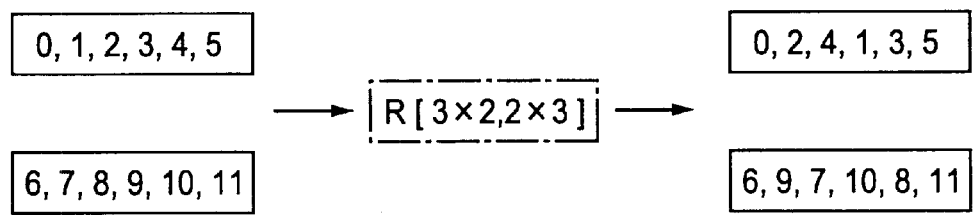
FIG. 25 is a diagram for explaining an example of definition of the interleaving pattern description language.

FIG. 25 describes a definition 3 of L[N1×M1, N2×M2 . . . ]. L[N1×M1, N2×M2 . . . ] means interleaving of a plurality of series (each series is L bit length) by corresponding interleavers. FIG. 25 shows 6[3×2, 2×3] as an example in which each of two 6 bit series is interleaved.

Figure 26:
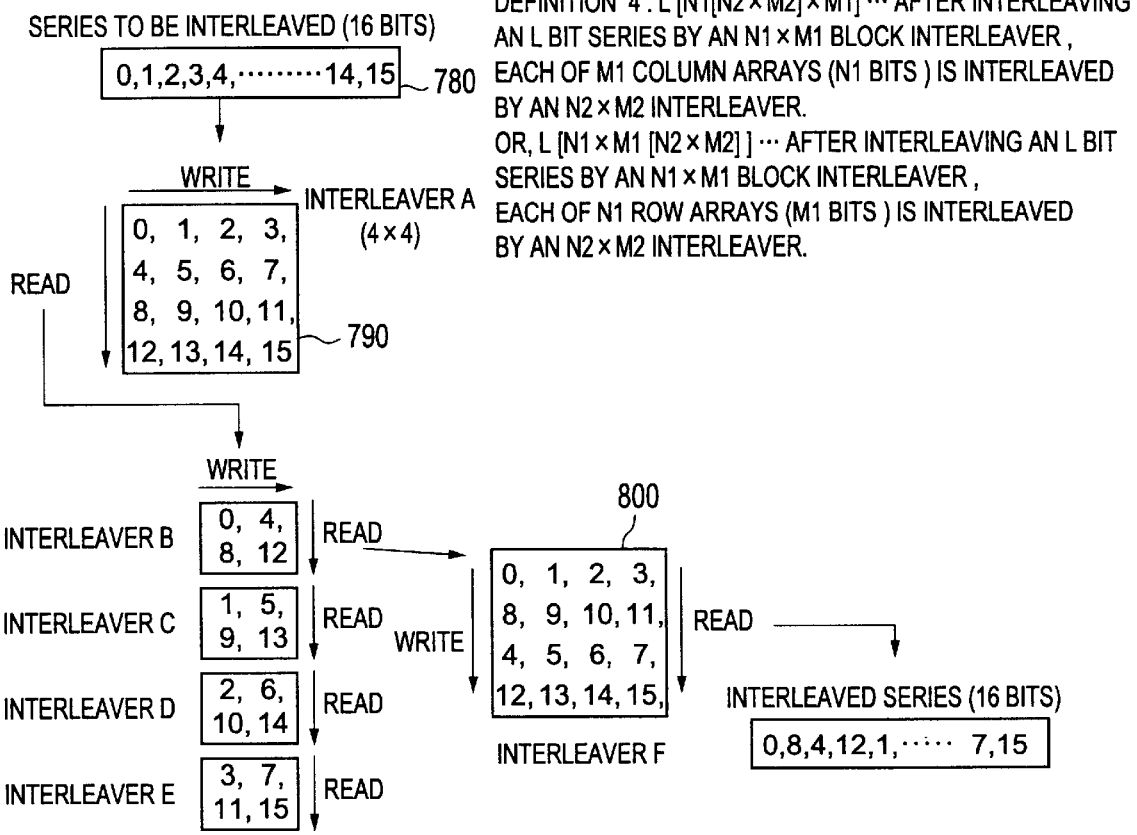
FIG. 26 is a diagram for explaining an example of definition of the interleaving pattern description language.

FIG. 26 describes a definition 4 of L[N1[N2×M2]×M1]. L[N1[N2×M2]×M1] means that after interleaving an L bit series by an N1×M1 block interleaver, each of M1 column arrays (N1 bits) is interleaved by an N2×M2 interleaver.

L[N1×M1 [N2×M2] ] means that after interleaving an L bit series by an N1×M1 block interleaver, each of N1 row arrays (M1 bits) is interleaved by an N2×M2 interleaver.

FIG. 26 shows 16[4[2×2]×4] as an example in which a 16 bit series 780 is written to a 4×4 block interleaver A 790 and each column array is read and interleaved by one of four 2×2 interleavers B–E. An interleaver F 800 is used for getting together the results by the interleavers B–E.

The above mentioned interleaving description language can be used for generating an interleaving pattern and performing interleaving of an input series by referring an interleaving pattern.

In the following, embodiments of interleaving by the above mentioned interleaving pattern description language will be described.

Figure 27:
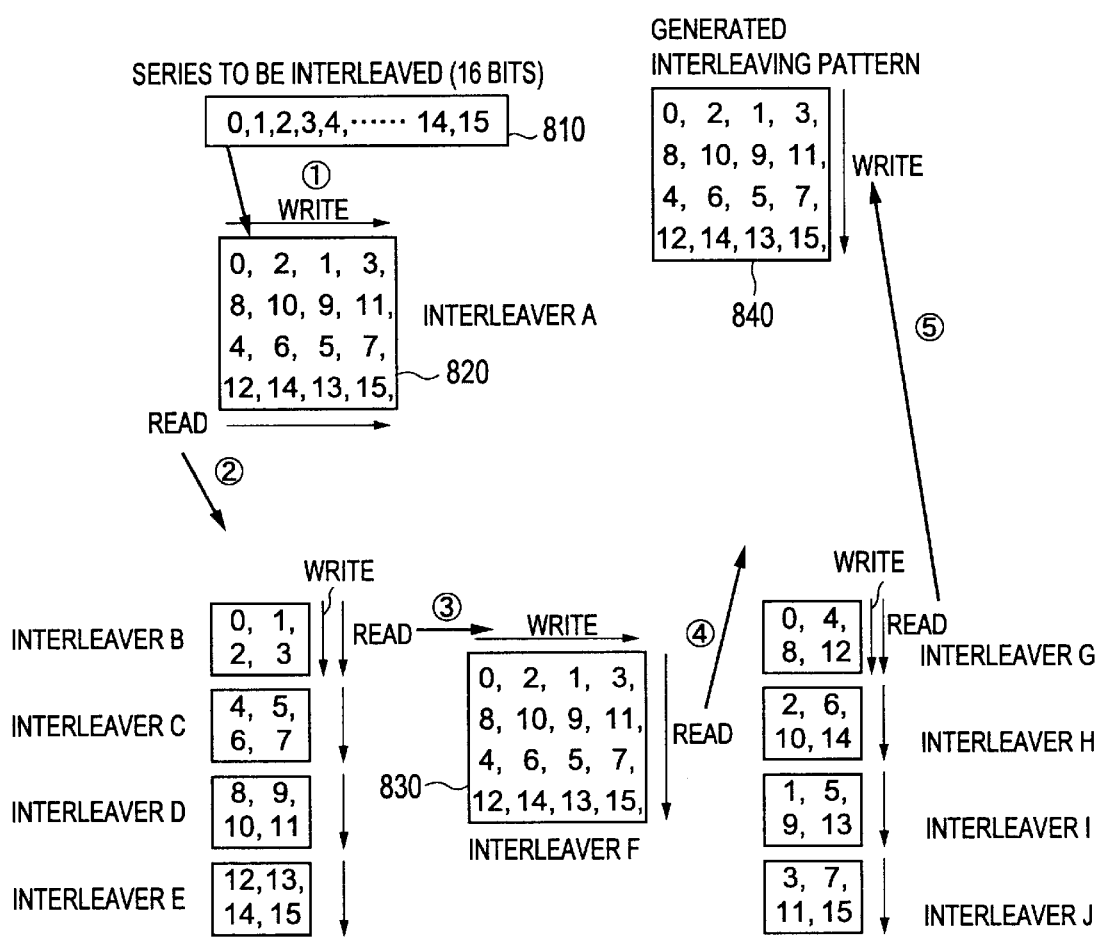
FIG. 27 is a diagram for explaining an example of realizing interleaving in the case of using the interleaving pattern description language.

FIG. 27 shows an example in which generation of an interleaving pattern described as 16[4[2×2]×4[2×2]] by the interleaving pattern description language is realized.

The meaning of the interleaving pattern described as 16[4[2×2]×4[2×2]] is as follows:

(a) First stage interleaver which is a 4×4 block interleaver performs 16 bit interleaving.

(b) Each of row arrays (4 bits) of the first stage interleaver is interleaved by a 2×2 interleaver.

(c) Each of the column arrays (4 bits) of the first stage interleaver is interleaved by a 2×2 interleaver.

FIG. 27 describes how the above process is realized. As shown in FIG. 27, an input 16 bit series 810 is written to a 4×4 block interleaver A 820 ($\hat{1}$ in FIG. 27). Next, each of row data is read from the interleaver A 820 and interleaved by one of 2×2 interleavers B–E ($\hat{2}$ in FIG. 27). The interleaved data is written to a interleaver F 830 ($\hat{3}$ in FIG. 27). Then, each of column data is read and interleaved by one 2×2 interleaver G–J ($\hat{4}$ in FIG. 27).

Finally, a described interleaving pattern is generated by writing the interleaved data to a table 840 ($\hat{5}$ in FIG. 27).

Figure 28:
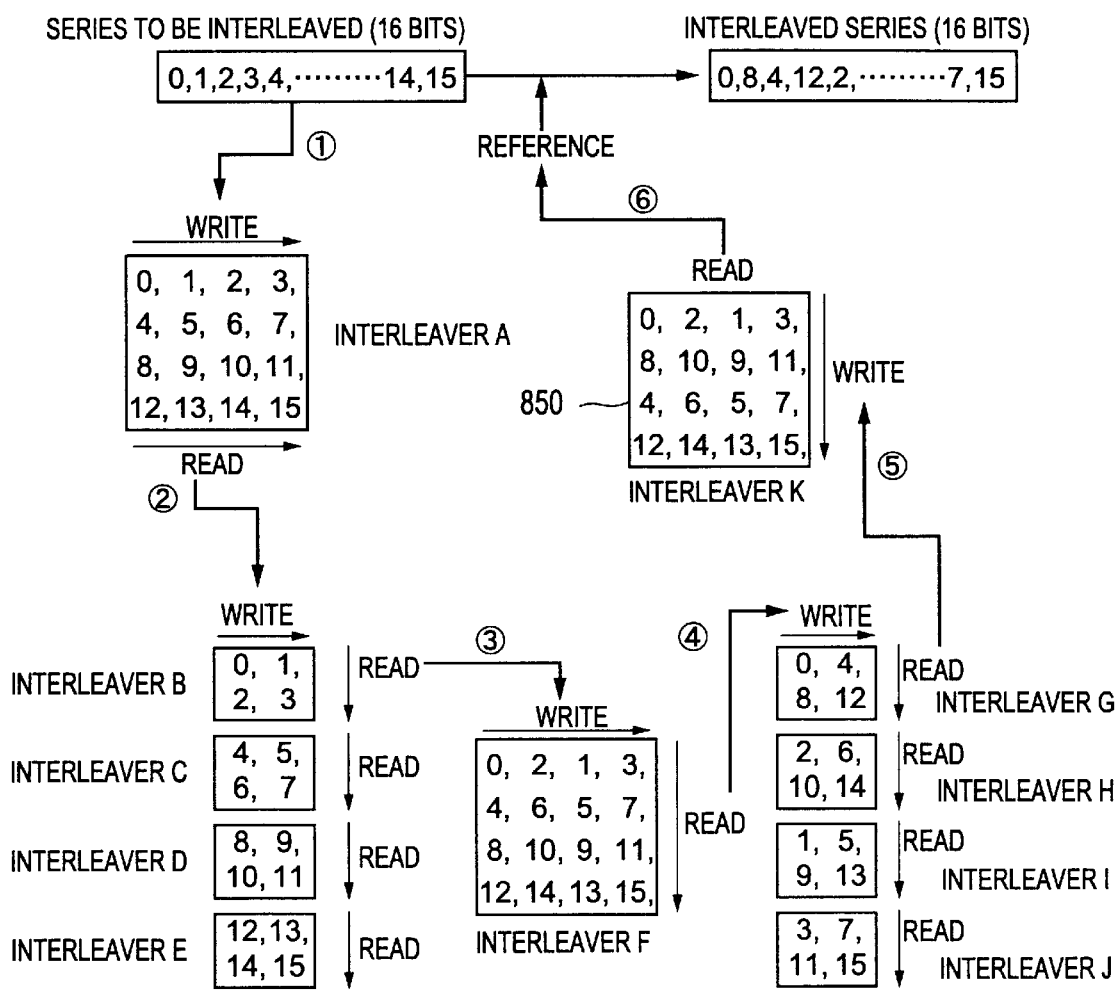
FIG. 28 is a diagram for explaining an example of realizing interleaving in the case of using the interleaving pattern description language.

FIG. 28 shows an example in which an interleaving process represented as 16[4[2×2]×4[2×2]], which is the same description as shown in FIG. 27, is realized by the above mentioned interleaving method. In FIG. 28, the description of $\hat{1}$–$\hat{5}$ for generating an interleave patter will be omitted since it has been described with FIG. 27. After that, interleaving can be realized by referring to the generated interleaving pattern table 850 ($\hat{6}$ in FIG. 28).

Figure 29:
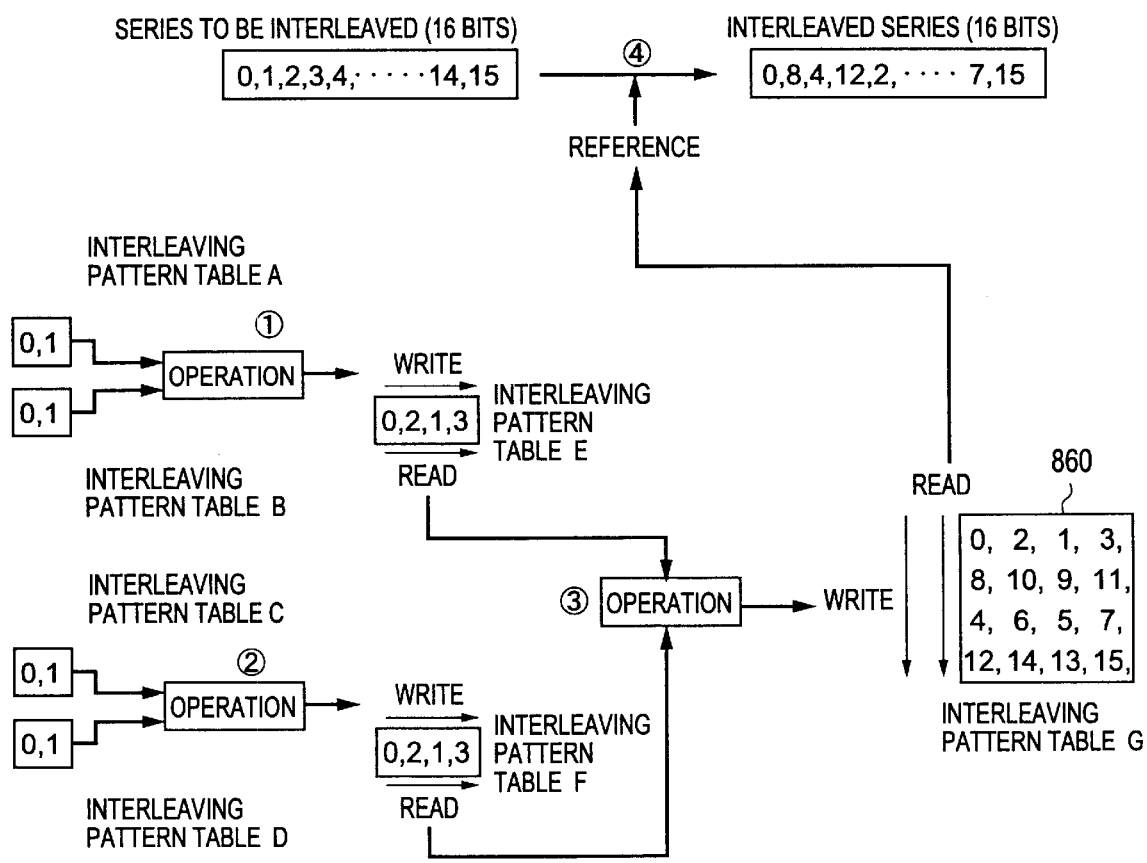
FIG. 29 is a diagram for explaining an example of realizing interleaving in the case of using the interleaving pattern description language.
Figure 30:
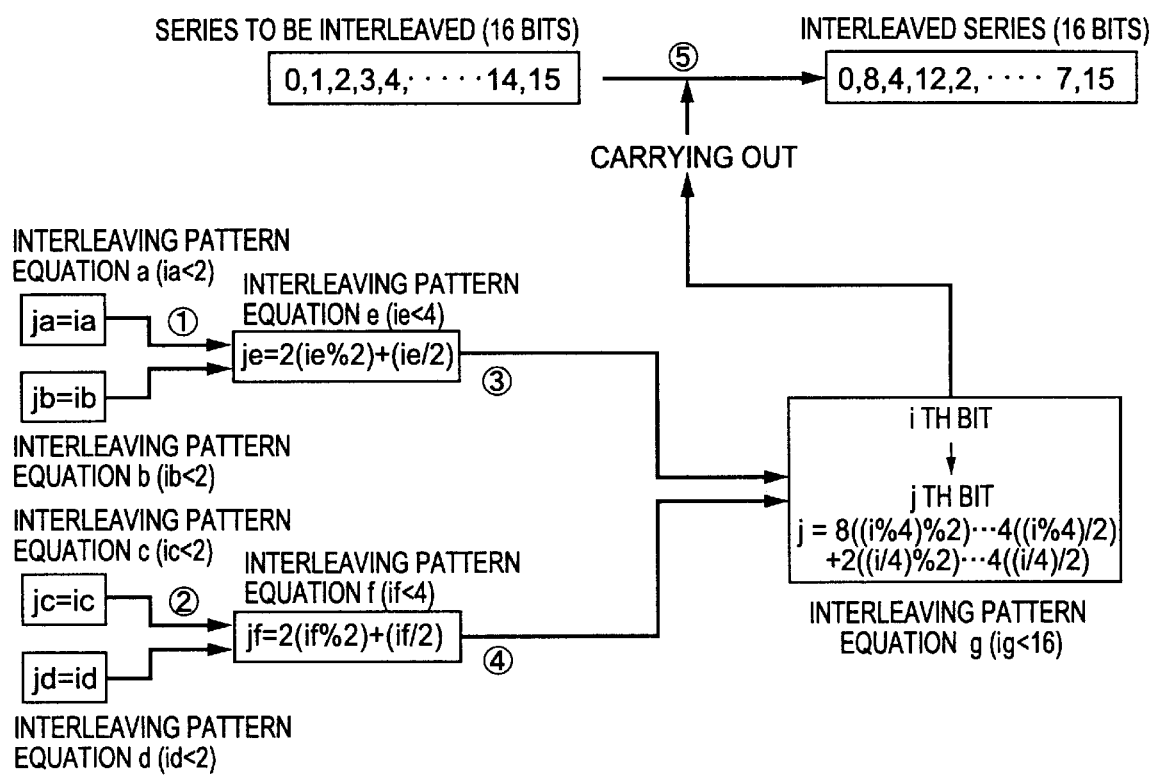
FIG. 30 is a diagram for explaining an example of realizing interleaving in the case of using the interleaving pattern description language.

FIG. 29 and FIG. 30 shows examples in which a formula described by the above mentioned interleaving pattern description language is recognized and an interleaving pattern is generated according to one of the methods or a combination of the methods shown in the above mentioned seventh ninth embodiments so as to perform interleaving.

FIG. 29 shows that generation of an interleaving pattern or an interleaving process described as 16[4[2×2]×4[2×2]] is performed by applying interleaving processes shown, for example, in the above FIG. 13 repeatedly.

In order to use an interleaving pattern described by the interleaving pattern description language according to FIG. 29, first, interleaving pattern tables E and F are generated with interleaving pattern tables A–D ($\hat{1}$ and $\hat{2}$). Second, an interleaving pattern table G 860 is generated by calculating with the interleaving pattern tables E and F ($\hat{3}$ in FIG. 29). When interleaving is required, it is performed with the interleaving pattern table G 860 ($\hat{4}$ in FIG. 29).

FIG. 30 shows that generation of an interleaving pattern or an interleaving process described as 16[4[2×2]×4[2×2]] is performed by applying interleaving processes shown, for example, in the above FIG. 17 repeatedly.

As shown in FIG. 30, 4 bit interleaving pattern equations e and f is generated from 2 bit interleaving pattern equations a–d ($\hat{1}$ and $\hat{2}$ in FIG. 30). Next, a 16 bit interleaving pattern equation g is generated from the 4 bit interleaving pattern equations e and f ($\hat{1}$ and $\hat{1}$ in FIG. 30) and interleaving is performed with the interleaving pattern equation g ($\hat{5}$ in FIG. 30).

After the generated interleaving pattern is stored, same interleaving process can be done only by reading the pattern table without generating the pattern once again at the time of next interleaving or other interleaving. FIG. 31 shows as example of such an effect.

FIG. 31 shows a case interleaving described as 16[4[2×2]×4[2×2]] is required assuming that a 4 bit interleaving pattern 4[2×2] is already stored.

For example, the case shown in FIG. 31 takes the same method as that shown in FIG. 29. As shown in FIG. 31, a system has an interleaving pattern 4[2×2] as interleaving pattern tables A and B. Therefore, a 16 bit interleaving pattern can be generated by referring to the 4 bit interleaving patterns ($\hat{1}$ in FIG. 31) without performing a process corresponding to 4[2×2] ($\hat{1}$ and $\hat{2}$ in FIG. 29). Then interleaving is performed by referring to the generated interleaving pattern table C ($\hat{2}$ in FIG. 31).

Thus, 16[4[2>2]×4[2×2]] can be generated from the stored 4[2×2] interleavers.

The method for realizing interleaving patterns described by interleaving pattern description languages shown in FIG. 27–FIG. 31 is not limited to the methods shown here, for example, those methods can be combined. Therefore, for getting an interleaving pattern, either of an interleaving pattern table or an interleaving pattern equation can be used.

In the following, the generation method of the above mentioned interleaving pattern will be described by a flowchart shown in FIG. 32.

As shown in FIG. 32, when data of interleaving length L bits is given, first stage interleaving pattern N1×M1 which is equal to or larger than L bits is determined in step 102. Next, in step 104, a plurality of second stage interleaving patterns are determined each of which pattern corresponds to row array and column array of the first stage interleaver. Then, in step 106, interleaving patterns of third stage interleavers corresponds to each of the second stage interleavers in the same way as step 104. In step 108, the above process will be repeated until interleaving is not available anymore or until any stage, finally, in step 110, an interleaving pattern which can be described by an interleaving pattern description language is generated.

As the method for determining the interleaving pattern of the interleaver of each stage, methods of using factoring, referring to a list, and using a real number near the result of squaring the interleaving length of each stage, and selecting an odd number or a prime number for N or M in the N×M interleaver of each stage in the above each methods can be used.

The above mentioned method will be called a multi stage interleaving method.

FIG. 33 is a flowchart for selecting a feasible interleaving pattern among the generated interleaving patterns.

As shown in FIG. 33, an interleaving pattern corresponding to an interleaving length is generated in step 204 as described with FIG. 32, and the generated interleaving pattern is tested in step 206.

If the test is unsuccessful, all or a part of the patterns of each stage interleaver shown in FIG. 32 are changed and the interleaving pattern is regenerated in step 204. The above process will be repeated until the test becomes successful in order to determine an eventually generated interleaving pattern.

Items of the test may be intensity of resistance to burst error, intensity of randomness of interleaved bits, and the like. In particular, if the interleaver is assumed to be used as a turbo code interleaver, a code weight test, a code weight test assuming trellis termination and the like may be used for the test.

According to the above description, it is obvious that the methods of the present invention can be applied to any interleaving unit such as a symbol other than a bit. Further, the length of interleaved series may change over time.

According to the method for generating an interleaving pattern of the present invention described in the seventh–tenth embodiment, memory capacity can be reduced and an interleaving length without a corresponding interleaving pattern can be processed flexibly. That is, when interleaving 1000 bit series without using the method of the present invention, a table which includes interleaving pattern for the 1000 bits is necessary. Therefore, the longer the interleaving length, the more the memory amount for storing an interleaving pattern table, in which the interleaving length means the total number of interleaved units such as bits, symbol, and the like. Further, without the present invention, when the interleaving length changes, sufficient interleaving patterns need to be prepared such that each interleaving pattern corresponds to a changed interleaving length. Thus, the more the kinds of the interleaving length, the more the memory amount for storing the interleaving pattern tables corresponding to each interleaving length. For example, for 4 kinds of interleavers of 10 bits, 100 bits, 1000 bits, 10000 bits interleaving length, memory amount for 10([log(10−1)]+1)+100([log(100−1)]+1)+1000([log(1000−1)]+1)+ 10000([log(10000−1)]+1)

bits is necessary in order to store the every interleaving patterns, in which [log X] means that the logarithm×to the base 2 is taken and the fractional portion of the number is dropped, therefore, [log (X−1)]+1 means the number of digits of the integer×in binary notation. According to the present invention, such a problem will nor arise. Further, according to the present invention, an interleaving pattern can be generated as a description by an interleaving pattern description language. The characteristics of the generated interleaving pattern can be checked, and, it is possible to add a system in which an interleaving pattern of good characteristics is regenerated automatically if the checked characteristics is bad.

Next, embodiments of the present invention for achieving the third objectives will be described. In the following, an interleaving method for a turbo encoder, a transmission system of a transmitter-receiver in mobile communication and the like will be described. Before describing the embodiments, the configurations of the turbo encoder and the transmitter-receiver in mobile communication will be described.

Figure 34A:
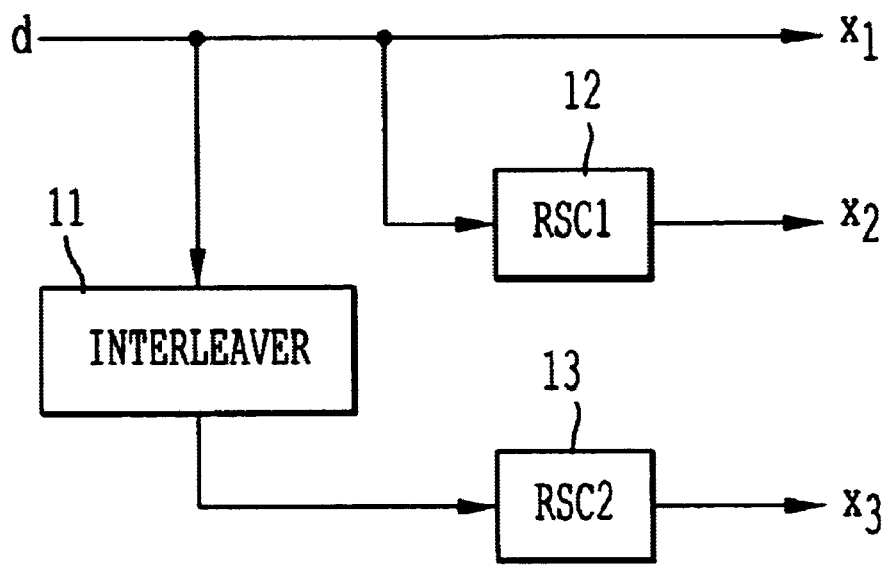
FIG. 34(a) and FIG. 34(b) are block diagram for explaining an example of a configuration of a turbo encoder.
Figure 34B:
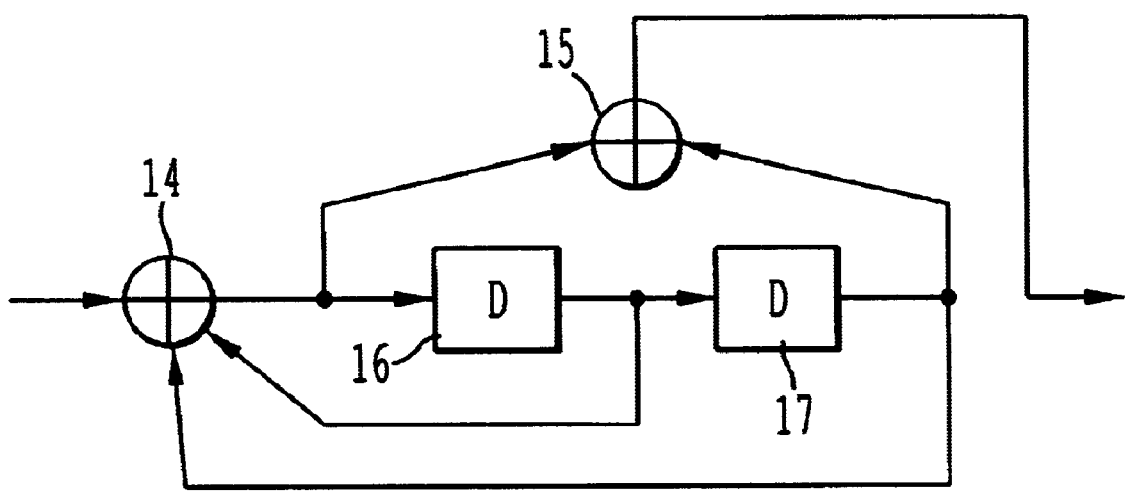

FIG. 34(*a*) is a diagram showing a configuration of the turbo encoder. The turbo encoder is formed by including recursive systematic convolutional encoders (RSC 12, RSC 13), in which the recursive systematic convolutional encoder is shown in FIG. 34(*b*). As shown in FIG. 34(*a*), input data d is processed and output as output data X1–X3. An interleaver 11 is placed before the recursive systematic convolutional encoder (RSC) 13 in order to reduce interrelationship between the redundant bits X1 and X2. In addition, a turbo decoder includes 2 decoders, an interleaver and a deinterleaver which performs a reverse process of an interleaver.

Figure 35:
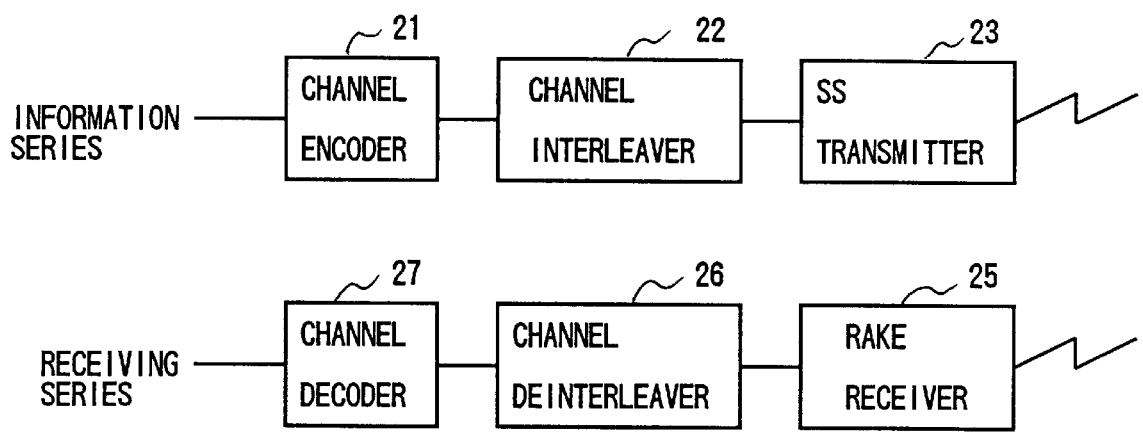
FIG. 35 is a block diagram for explaining an example of a configuration of a mobile radio transmitter-receiver.

FIG. 35 is a diagram showing a part of the configuration of a transmitter-receiver and the like of CDMA in mobile communication. In the transmitting end, after a channel encoder 21 performs channel encode, a channel interleaver 22 performs interleaving. Then, SS transmitter 23 time-division multiplexes modulated signals and pilot symbols, and performs spread modulation. In the receiving end, a RAKE receiver 25 performs despreading, and, then, performs RAKE synthesis by using pilot symbols. A channel deinterleaver 26 performs deinterleaving and a channel decoder 27 performs decoding. If the turbo code is used for a transmission system, a turbo encoder instead of the channel encoder 21 is used, and a turbo decoder instead of a channel decoder 27 is used.

The table of the interleaver used in these devices is, for example, one described in FIG. 12.

In the following, examples of deinterleaving which is performed in the channel deinterleaver 26 and the like are described with reference to FIG. 36 and FIG. 37.

Figure 36A:
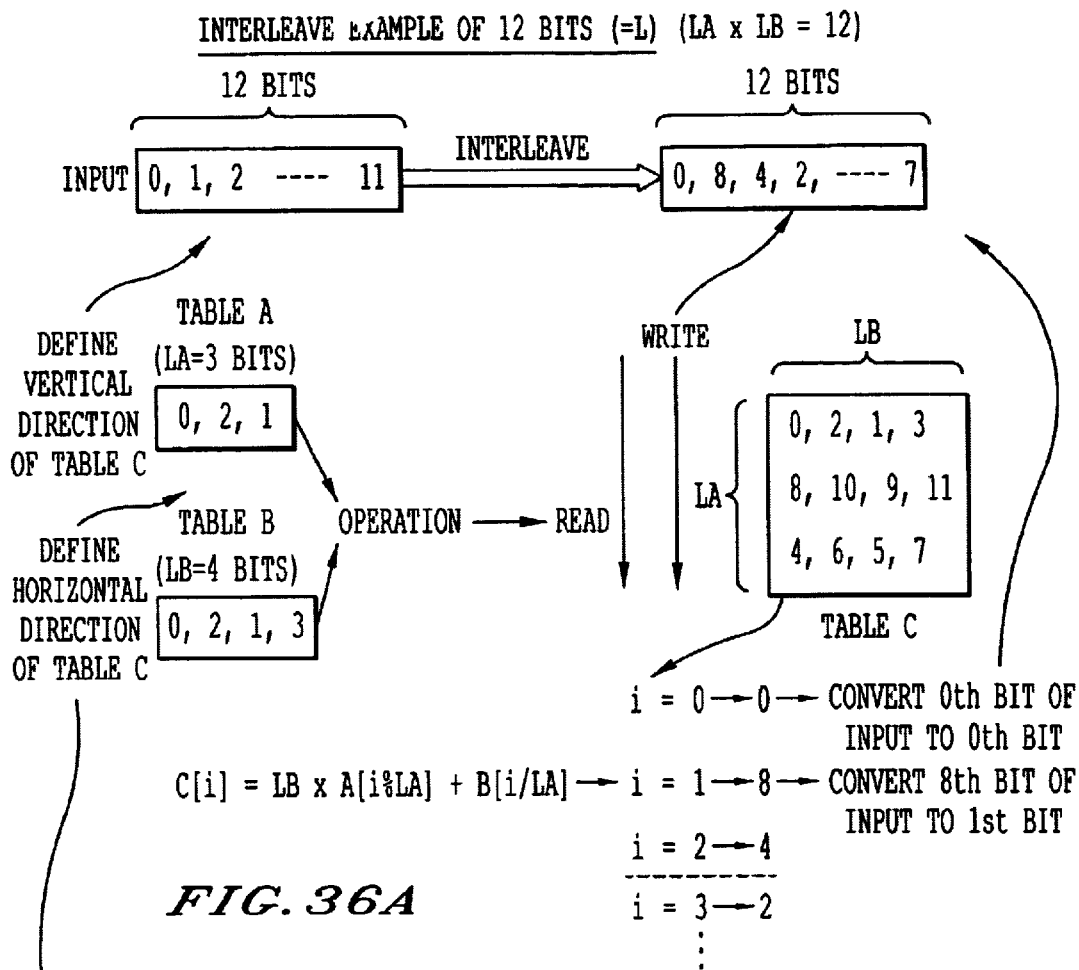
FIG. 36(a) and FIG. 36(b) are a diagram showing an example of deinterleaving.
Figure 36B:
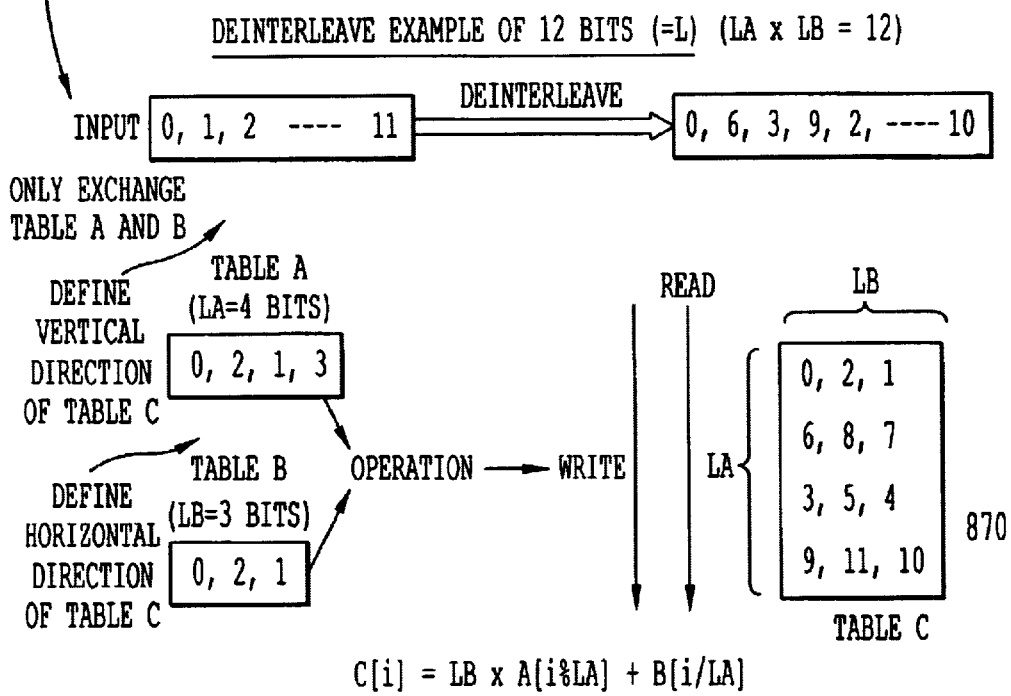

FIG. 36(*a*) shows an example in which interleaving of 12 bits is performed with a table A (LA=3 bits) and a table B. The operation for generating an interleaving pattern table C[i] (ith bit of bit sequence C) is $C[i]=LB \times A[i \% LA]+B[i/LA]$ in which LA=3 and LB=4. In addition, the table A defines the pattern in a vertical direction of the table C and the table B defines the pattern in a horizontal direction of the table C. By calculating the operation, an interleaving pattern table C is generated, and an output data is obtained from an input data by referring to the interleaving pattern table C.

FIG. 36(*b*) shows a deinterleaving process which is a reverse process to the above mentioned process. A deinterleaving pattern table C 870 can be generated by interchanging the table A and the table B and by performing the same operation. If input data is 0, 8, 4, 2, . . . , 7 which is the output of the above mentioned interleaving, the output becomes 0, 1, 2, . . . , 11 which is the input of the above mentioned interleaving.

Figure 37A:
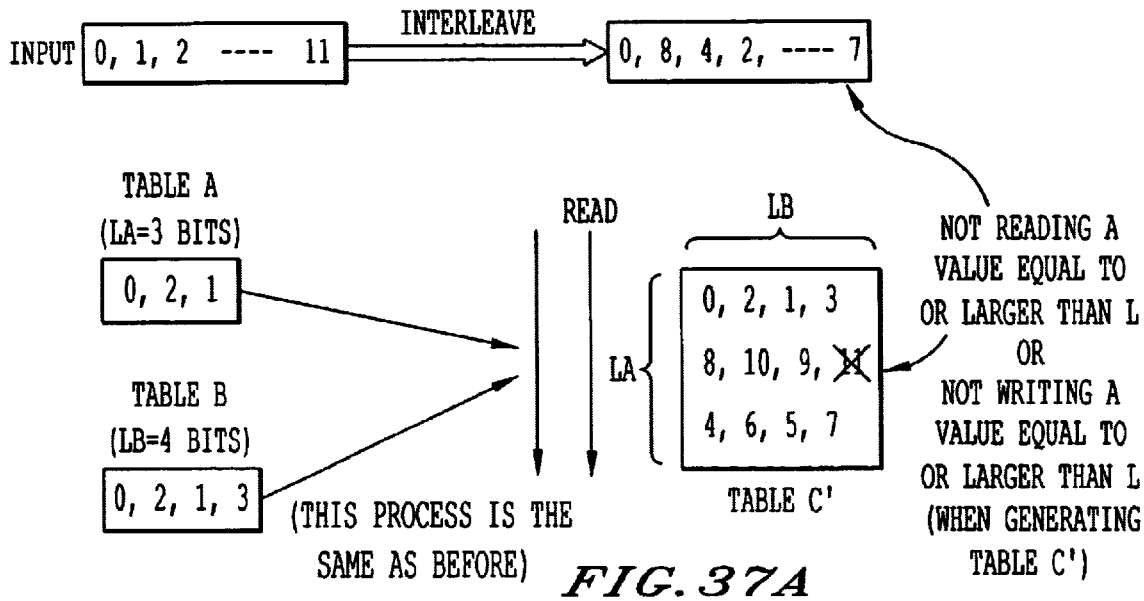
FIG. 37(a) and FIG. 37(b) are a diagram showing an example of deinterleaving.
Figure 37B:
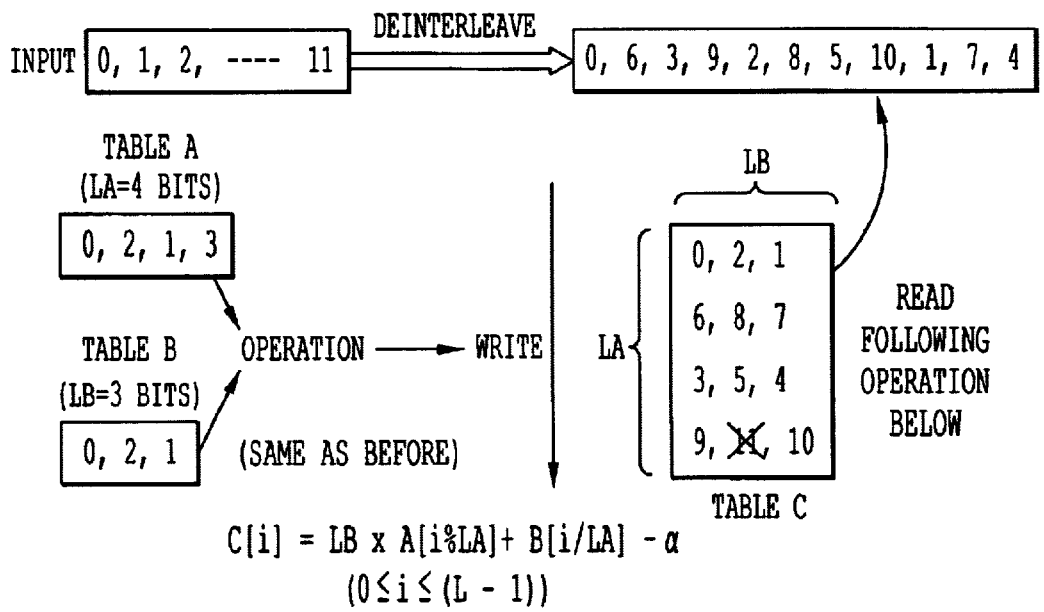

FIG. 37(a) shows an example of interleaving in the case of LA×LB>L, and FIG. 37(b) shows deinterleaving. In FIG. 37(a), a value which is equal to or larger than L is not read out, or, the value is not written when generating a table. The operation formula in FIG. 37(c) is $$C[i]=LB \times A[i\%LA]+B[i/LA]$$

in which follows the following rule (represented by C language).
=0
for(j=0,J<(LA×LB−L),J++){
if C[i]>=LB×A[(L−1−j)%LA]
+B[(L−1−j)/LA]
++;
}

The deinterleaving method can be applied to the above mentioned interleaving methods and also applied to the after-mentioned interleaving methods.

Next, an eleventh embodiment will be described. In the following description, notation for describing an interleaving pattern is the one used in FIG. 23–FIG. 25.

In the following, a generating method of an interleaving pattern suitable for turbo code with reference to FIG. 38–FIG. 45.

Figure 38:
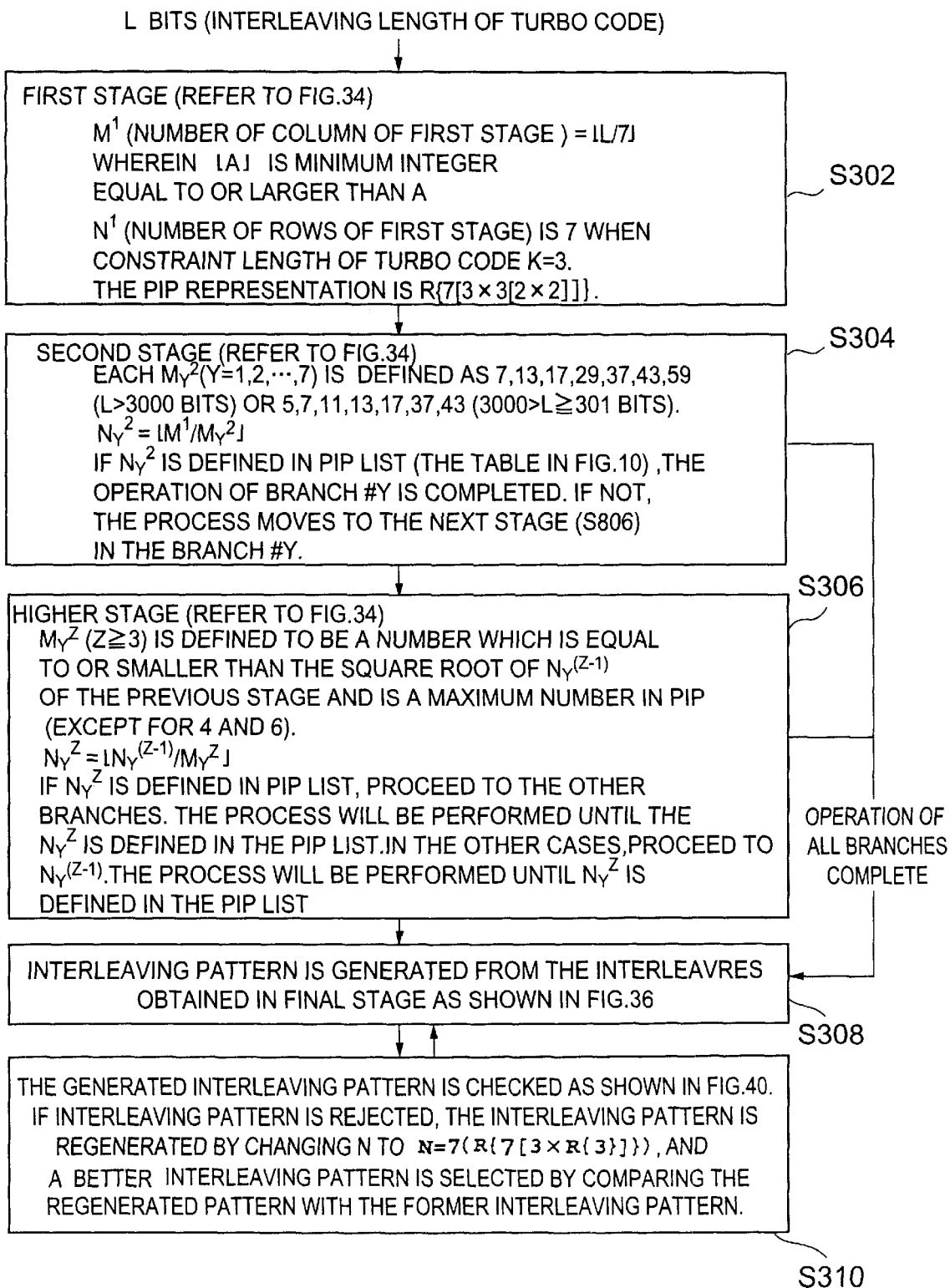
FIG. 38 is a flowchart for explaining generation of an interleaving pattern suitable for turbo code.

FIG. 38 is a flowchart for explaining a generating method of an interleaving pattern which has an L bit interleaving length and is suitable for turbo code.

Figure 39:
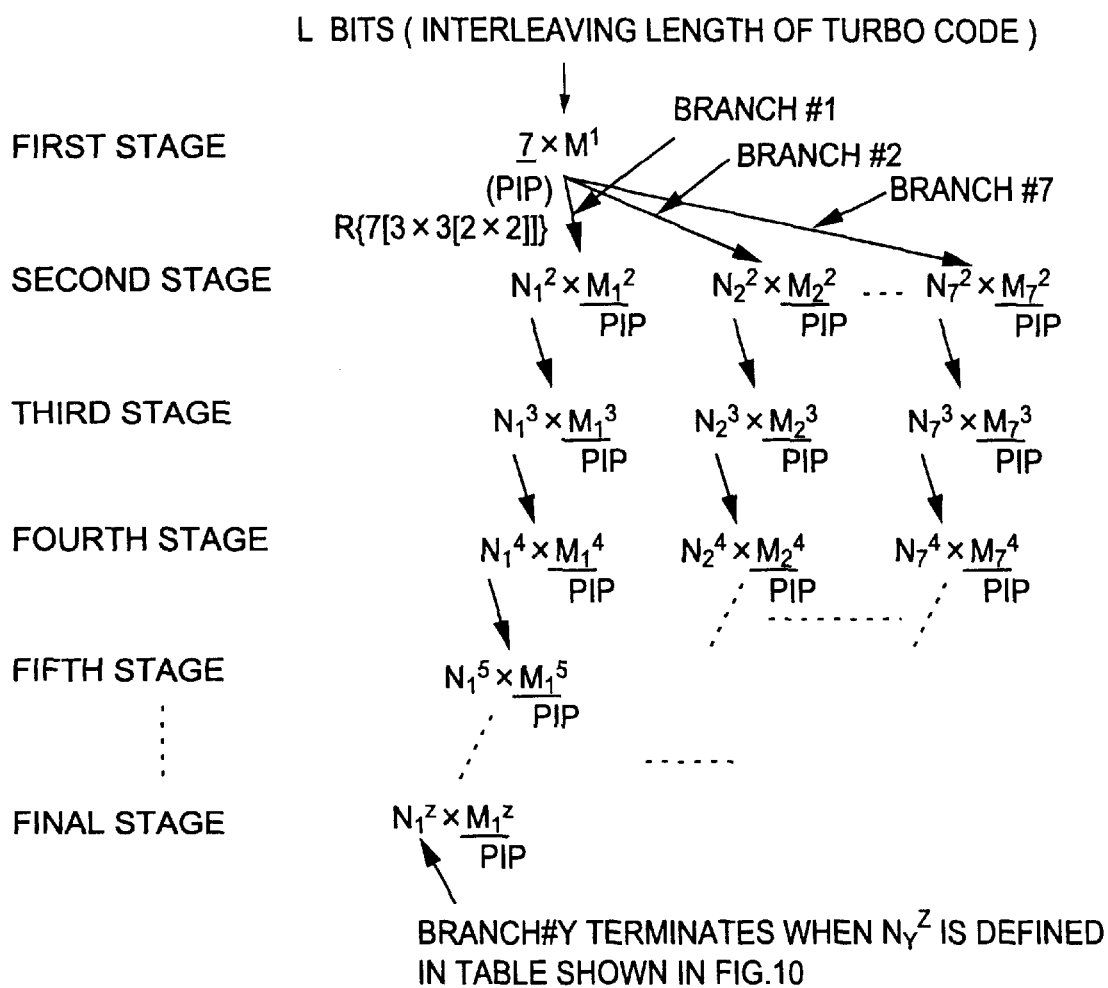
FIG. 39 is a diagram showing details of the determining process of the interleaving pattern.

From the first stage (S302) to the higher stage (S306) shown in FIG. 38, the interleaving pattern for turbo code having L bit interleaving length is determined by a decision process which will be described in detail with FIG. 39. Interleave patterns are determined when all processes of each decision process branch are completed, and, then, the interleaving pattern is generated from the determined final results (S308). After that, the generated interleaving pattern are checked and the interleaving pattern of the L bit interleaving length which is suitable for turbo code can be obtained.

Now, the decision process of the interleaving pattern will be described. FIG. 39 is a diagram showing the decision process of the interleaving pattern in detail. FIG. 40 is a table showing a list of predefined interleaving patterns (PIP) which are used for the decision process of the interleaving pattern. The predefined interleaving pattern list is a list of interleaving patterns which is recognized to be suitable for turbo code.

In the first stage (S302) in FIG. 38, it is necessary to determine an interleaving pattern represented by row and column of $L \leq N^1 \times M^1$ (the superscript denotes the number of the stage). In this eleventh embodiment, $N^1$ is fixed to be 7. Thus, $M^1$ is determined such that if a value of L divided by 7 is an integer, $M^1$ is the value, and, in the other cases, $M^1$ is a minimum integer larger than the value. The predefined interleaving pattern corresponding to $N^1$ is R{7[3×3[2×2]]} which is shown in FIG. 40 as T7.

It is necessary to represent each of 7 rows ($M_1^1$–$M_7^1$) as a row and a column in order to determine the row and the column of the interleaving pattern of the first stage. Thus, in the second stage, a row and a column need to be determined in each of 7 branches corresponding to each of the rows (refer to FIG. 39). In order to determine the row and the column, as shown in the second stage (S304) in FIG. 38, the number of each of columns $M_Y^2$ (Y=1, 2, . . . , 7) is selected from "7, 13, 17, 29, 37, 43, 59 (L>3000 bits)" or "5, 7, 11, 13, 17, 37, 43 (3000>L≧301 bits)" which are shown in PIP lists in FIG. 38. The number of the row $N_Y^2$ is determined such that if a value of $M^1$ divided by the selected number of $M_Y^2$ is an integer, $N_Y^2$ is the value, and, in the other cases, $N_Y^2$ is a minimum integer larger than the value. If an IP (interleaving pattern) corresponding to the $N_Y^2$ is defined in the table in FIG. 40, the operation to the branch is completed. If not, the process moves to the next stage (S306).

In the next process (S306), the process to determine a row and a column until the undetermined rows are determined. In the process (S306), each branch is processed as described below and as shown in FIG. 39. The number of a column $M_Y^Z$ (Z≧3) is defined to be a number which is equal to or smaller than the square root of the undefined number of row $N_Y^{(Z-1)}$ of previous stage and is a maximum number in PIP (except for 4 and 6) in FIG. 40. The reason for excluding 4 and 6 is that it is known empirically that an odd number or a large number is suitable for the column number for turbo code. The number of the row $N_Y^Z$ is determined such that if a value of $N_Y^{(Z-1)}$ divided by the above defined $M_Y^Z$ is an integer, $N_Y^Z$ is the value, and, in the other cases, $N_Y^Z$ is a minimum integer larger than the value. If PIP is defined for the row number $N_Y^Z$ in FIG. 40, the process of the branch is completed. The process will be performed until every branch of every stage is completed.

In addition, other than interleaving patterns shown in FIG. 40, an interleaving pattern corresponding to other number can be defined. In this case, the interleaving pattern corresponding to the other number is generated by the same method as that in higher stage shown in FIG. 38. The more the interleaving patterns defined in FIG. 40, the fast a process is completed. Even when the number of the interleaving patterns shown in FIG. 40 is increased in such away, $M_Y^Z$ (Z≧3) will be selected among "2, 3, 5, 7, 8, 9, 11, 13, 17, 20, 29, 37, 43, 47, 53, 59, 61" shown in FIG. 40.

After all interleaving patterns of the row and the column are defined, the interleaving pattern is generated from the defined interleavers of the row and the column (S308). The process will be described with reference to FIG. 41–FIG. 44 in detail.

Figure 41:
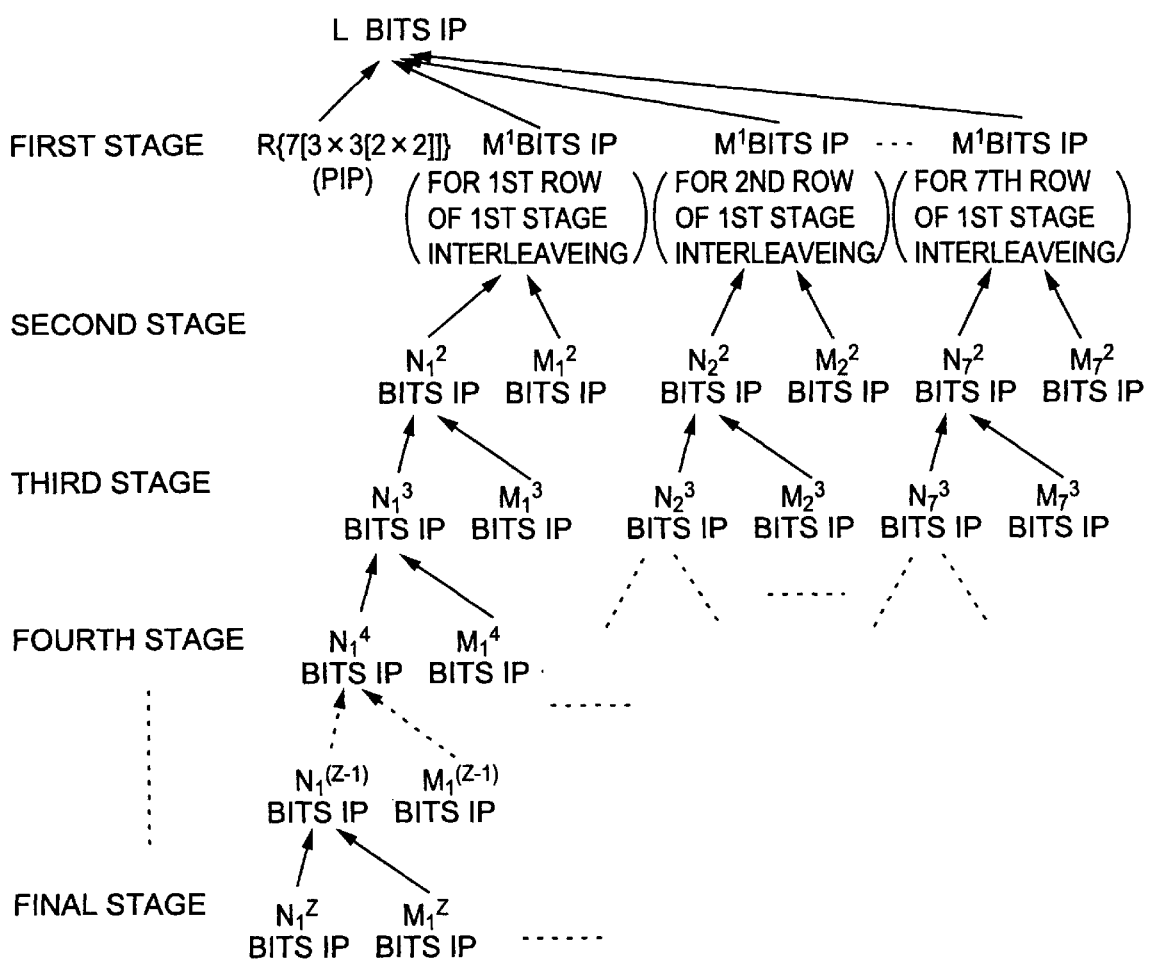
FIG. 41 is a diagram showing details of a generation process of an interleaving pattern by a multistage interleaving method.

FIG. 41 is a diagram showing a detailed generating process of the interleaving pattern by the above mentioned multistage interleaving method. As is understood from this figure, the interleaving pattern (IP) corresponding to the row or the column of the upper stage is determined from the interleaving pattern (IP) corresponding to the row or the column defined in the lower stage, which is reverse of the procedure of each branch in FIG. 39. Then, the L bit interleaving pattern (IP) can be generated finally.

Figure 42:
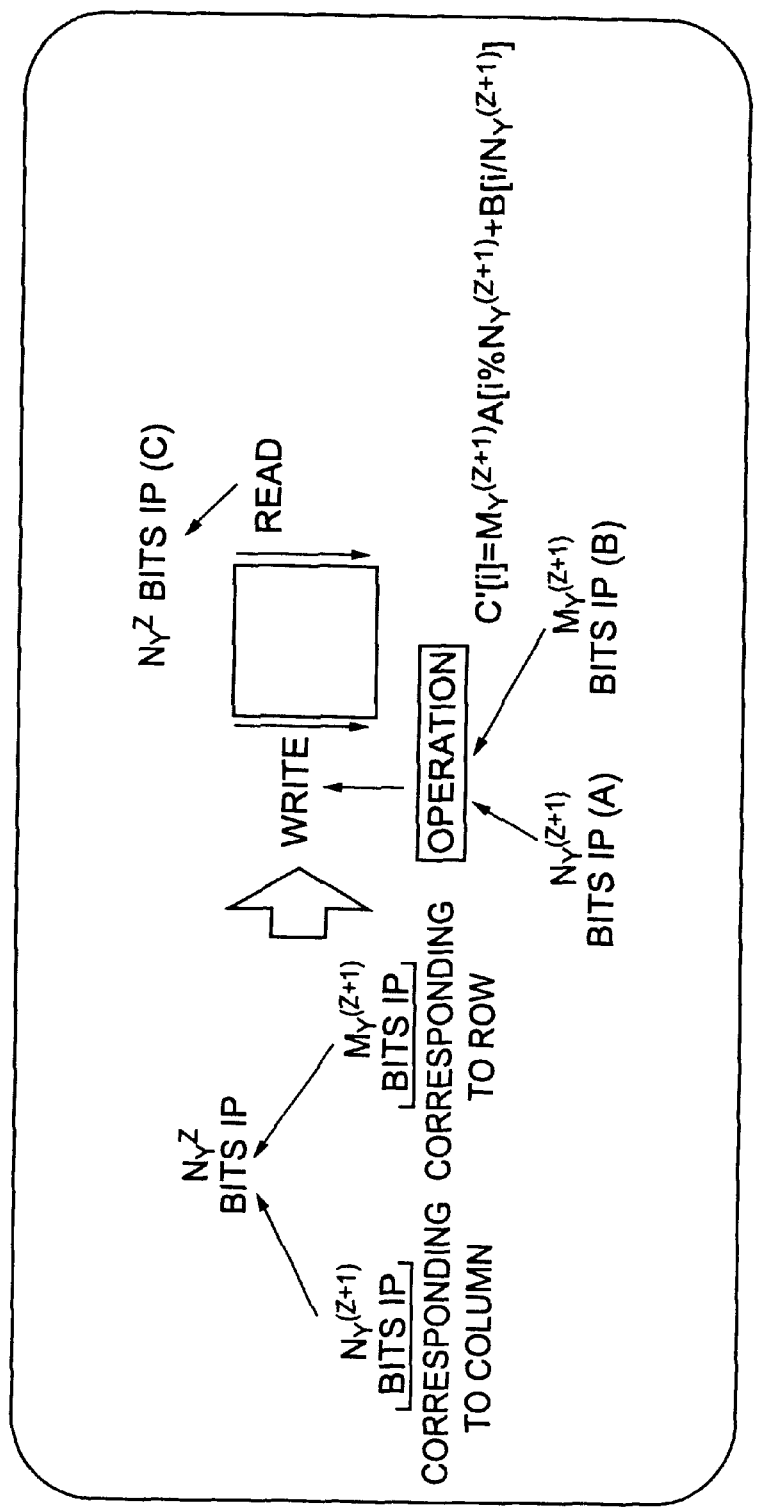
FIG. 42 is a diagram for explaining a first stage of the generation process of the interleaving pattern.
Figure 43:
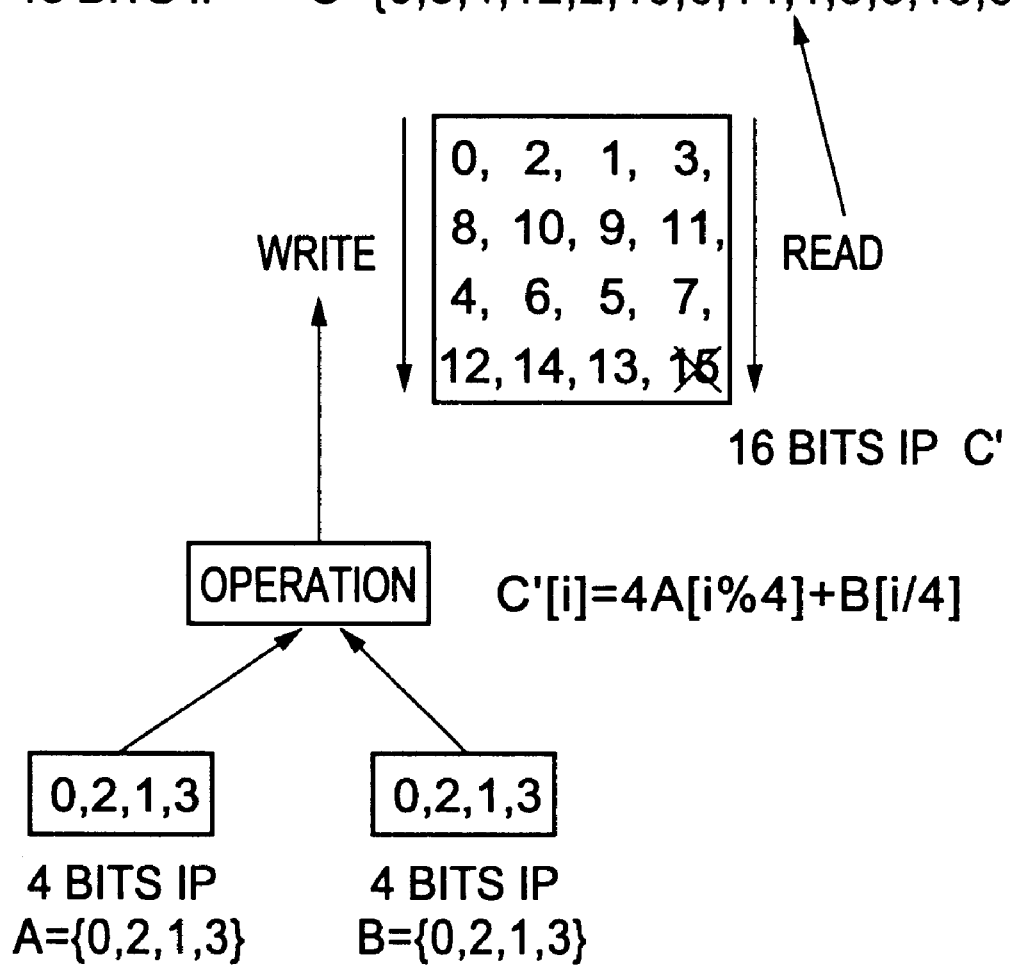
FIG. 43 shows a specific example of the generation process shown in FIG. 42.
Figure 44:
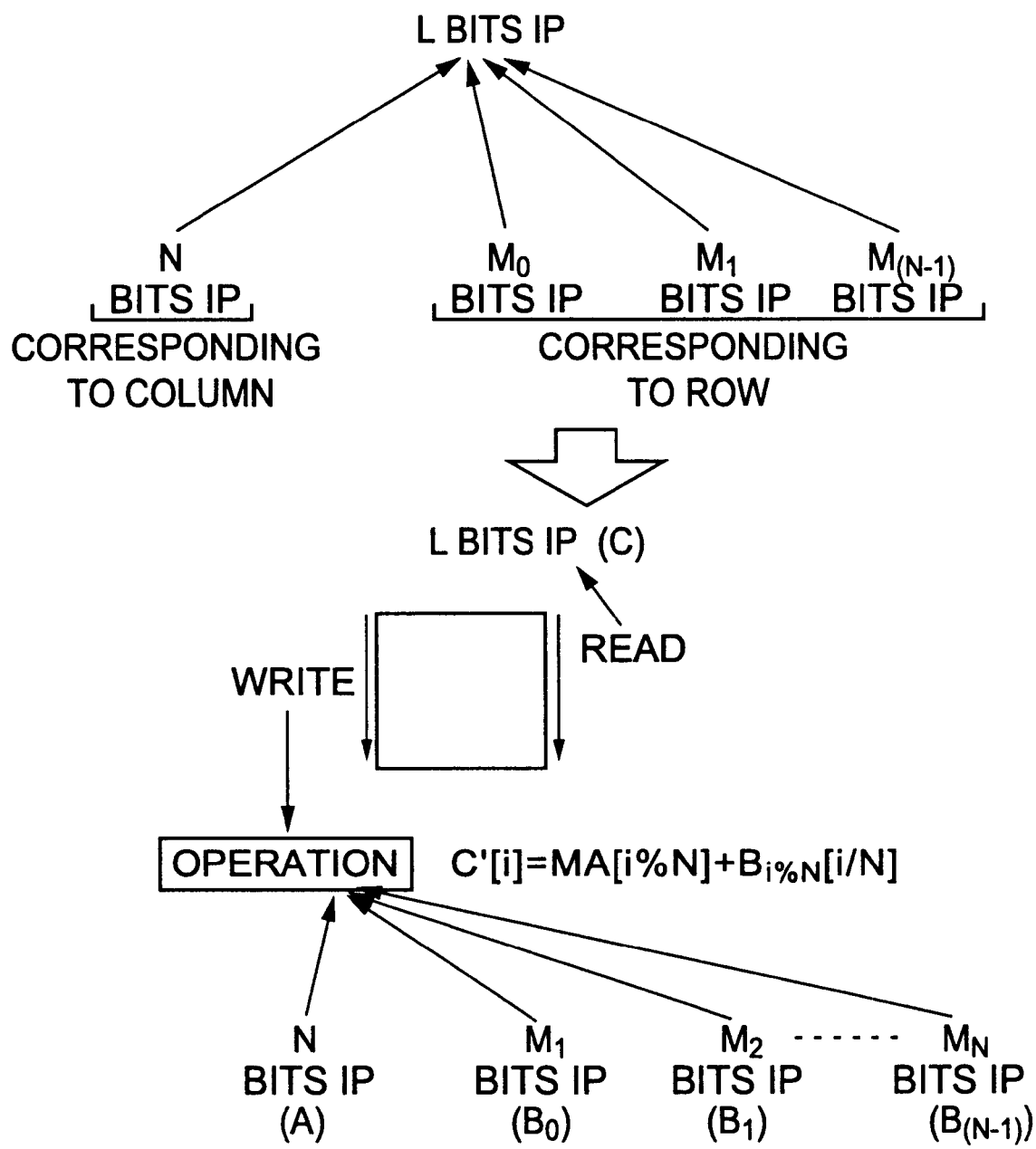
FIG. 44 is a diagram for explaining another example of the generation process of the interleaving pattern.

The way in which the interleaving pattern (IP) is generated by the interleaving patterns of the row and the column will be described in detail with reference to FIG. 42–FIG. 44. FIG. 42 is a diagram for explaining one stage of the generating process of the interleaving pattern. FIG. 43 is an example of the generating process shown in FIG. 42. FIG. 44 is a diagram for explaining the final stage of the generating process of the interleaving pattern.

FIG. 42 shows how the interleaving pattern of $N_Y^Z$ (=$N_Y^{(Z+1)} \times M_Y^{(Z+1)}$) bits of each branch is generated by using an $N_Y^{(Z+1)}$ bit interleaving pattern (IP) corresponding to the column which is determined in the lower stage and an $M_Y^{(Z+1)}$ bit interleaving pattern corresponding to the row which is determined in the lower stage.

In FIG. 42, by the operation to the $N_Y^{(Z+1)}$ bit interleaving pattern (IP) corresponding to the column and the $M_Y^{(Z+1)}$ bit interleaving pattern (IP) corresponding to the low, a pattern C'[i] of $N_Y^Z$ bits is generated in each branch. The C'[i] represents an ith element of the pattern C'. The operation is $$C'[i]=M_Y^{(Z+1)}A[i\%N_Y^{(Z+1)}]+B[i/N_Y^{(Z+1)}],$$

wherein A represents an interleaving pattern corresponding to $N_Y^{(Z+1)}$ of the column, B represents an interleaving pattern corresponding to $M_Y^{(Z+1)}$ of the row, "%" is a modulo operator which takes a remainder of division, and "/" means an integer part (in which fractional portion is dropped) of division.

The pattern C' by the operation is written to a memory which has a capacity of vertical $N_Y^{(Z+1)} \times$ horizontal $M_Y^{(Z+1)}$ in a vertical direction. Then, $N_Y^Z$ bit interleaving pattern C is obtained by reading out the memory in a vertical direction. At the time, the interleaving pattern C can be obtained without writing a number which is equal to or larger than $N_Y^Z$ to the memory when $N_Y^Z$ is smaller than $N_Y^{(Z+1)} \times M_Y^{(Z+1)}$. Also, the interleaving pattern can be obtained by writing all data in the memory and skipping a number larger than $N_Y^Z$ when reading.

FIG. 43 shows a concrete example of the process. FIG. 43 shows an example in which a 15 bit interleaving pattern (IP) C which is smaller than 4×4=16 is obtained from a 4 bit interleaving pattern (IP) A and a 4 bit interleaving pattern (IP) B.

As shown in FIG. 43, an 16 bit interleaving pattern C' is obtained by an operation with a 4 bit interleaving pattern A={0, 2, 1, 3} and a 4 bit interleaving pattern B={0, 2, 1, 3}. Then, the pattern is written to a 4×4 memory sequentially in a vertical direction. The operation is $$C'[i] = 4A[i\%4] + B[i/4].$$

At this time, "15" obtained by the operation is not written to the memory. A 15 bit interleaving pattern C can be obtained by reading out data from the memory in the same direction as writing sequentially.

Thus, interleaving patterns (IP) corresponding to each row and each column from the final stage to the second stage, and, then, interleaving patterns corresponding to the first row–the seventh row–of the first stage can be obtained. Finally, the L bit interleaving pattern is obtained from the interleaving patterns of the first row the–seventh row.

FIG. 44 is a diagram for explaining how the L bit interleaving pattern is generated from a plurality of rows in the first stage. As shown in FIG. 44, the L bit pattern C is generated from an N bit interleaving pattern (IP) corresponding to the column and N interleaving patterns corresponding to each row.

In FIG. 44, assuming that N which is the column as A, and assuming each of $M_0$–$M_{(n-1)}$ which is the row as $B_0$–$B_{(n-1)}$, the operation is represented as $$C[i] = MA[i\%] + B_{i\%N}[i/N]$$

Which is different from that in FIG. 43 and B is changed. The L bit interleaving pattern C can be generated by writing to a memory sequentially in a vertical direction and reading out sequentially in a vertical direction. The process when L<M×N is the same as that described in FIG. 43.

As mentioned above, the L bit length interleaving pattern can be generated (S308 in FIG. 38). In FIG. 38, the generated interleaving pattern is checked next (S310). If the generated interleaving pattern is rejected according to the check, an interleaving pattern is regenerated by changing N to 7 represented by R(7[3×R{3}])), and a better interleaving pattern is selected by comparing the regenerated pattern with the former interleaving pattern.

Figure 45:
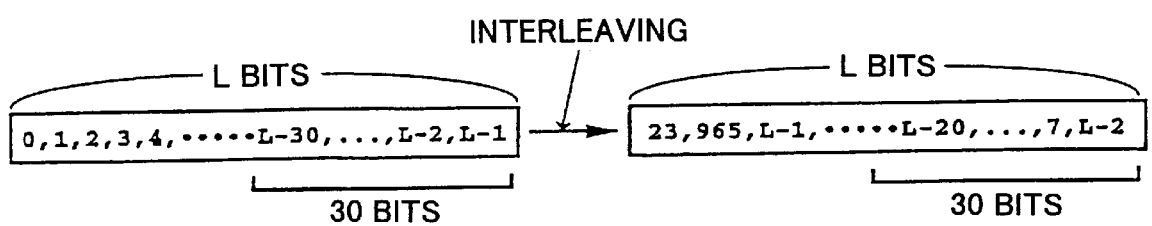
FIG. 45 is a diagram for explaining a check of the generated interleaving pattern.

The checking method of the generated interleaving pattern will be described with reference to FIG. 45. As shown in FIG. 45, interleaved L bit series is compared with L bit series which is not interleaved, and, if all bits or a part of bits within 30 bits from the last bit of the bit series which is not interleaved are interleaved within 30 bits from the last bit of the interleaved bit series, the interleaving pattern which performs the interleaving is rejected.

The interleaving pattern obtained by the flowchart shown in FIG. 38 is suitable for turbo coding. The turbo code is assumed to be turbo code of constraint length 3. That is, it means there are two delay elements D such as (16) and (17) (constraint length−1). When assuming turbo code of constraint length 4, $N^1$ of the first stage in FIG. 38 can be set as 8 represented by R{8[4[2×2]×2]}. That is, $M^1$ becomes L/8 and the number of the branches shown in FIG. 41 increases to 8 from 7.

Next, a twelfth embodiment will be described.

In the following, a generating method of an interleaving pattern suitable for transmission line interleaver with reference to FIG. 46–FIG. 49.

Figure 46:
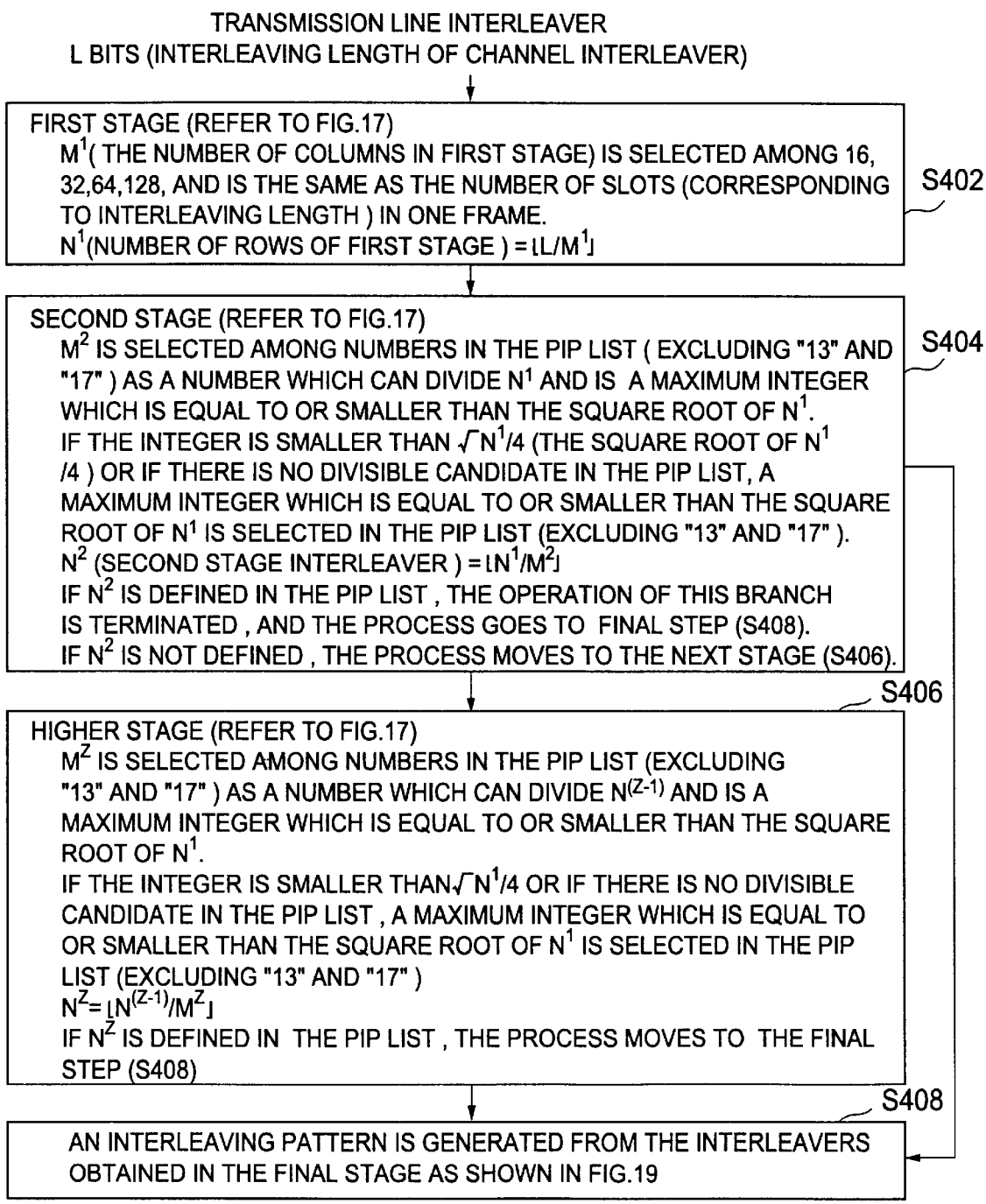
FIG. 46 is a flowchart for explaining a generation process of the interleaving pattern suitable for a transmission line interleaver.

FIG. 46 is a flowchart for explaining a generating method of an interleaving pattern which is suitable for transmission system.

Figure 47:
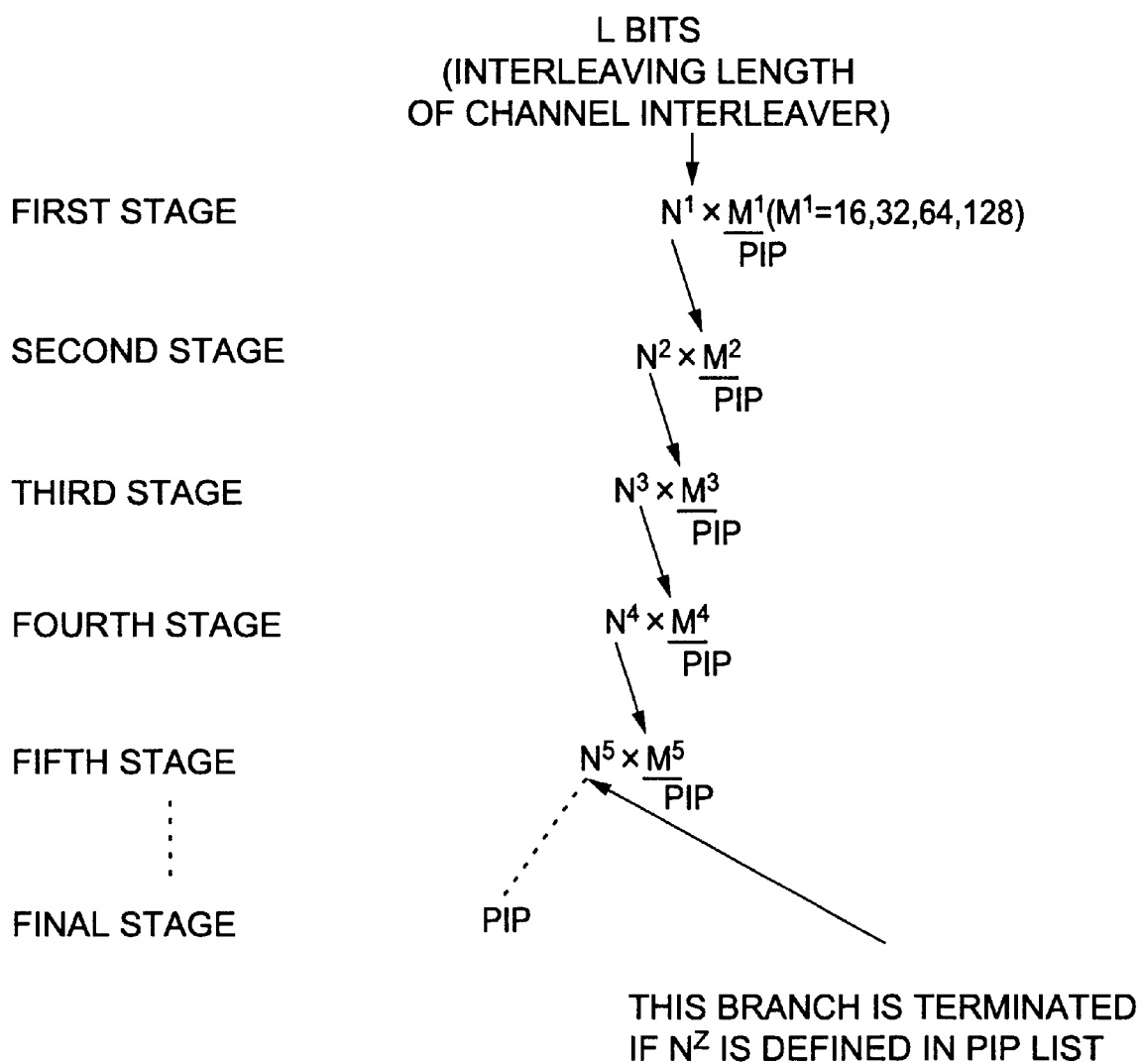
FIG. 47 is a diagram showing details of a determining process of the interleaving pattern.

From the first stage (S402) to the higher stage (S406) shown in FIG. 46, the interleaving pattern for transmission line interleaver having L bit interleaving length is determined by a decision process which will be described in detail with FIG. 47. Interleave patterns are determined when all processes of each decision process branch are completed, and, then, the interleaving pattern is generated from the determined final results (S408).

Now, the decision process of the interleaving pattern will be described. FIG. 47 is a diagram showing the decision process of the interleaving pattern in detail. FIG. 48 is a table showing a list of predefined interleaving pattern (PIP) which is used for the decision process of the interleaving pattern. The predefined interleaving pattern list in FIG. 48 is a list of interleaving patterns which are recognized to be suitable for transmission system.

In the first stage (S402) in FIG. 46, it is necessary to determine an interleaving pattern represented by a row and a column of $L \leq N^1 \times M^1$ (the superscript denotes the number of the stage). $M^1$ which is the number of the column in the first stage is selected among 16, 32, 64, 128 according to the number of slots (interleaving length) in one frame. $N^1$ which is the number of row in the first stage is determined as a minimum integer larger than L divided by the selected $M^1$.

In the second stage (S404), $M^2$ is selected among numbers corresponding to the list of the predefined interleaving patterns shown in FIG. 48 (excluding "13" and "17") as a number which can divide $N^1$ and is a maximum integer which is equal to or smaller than the square root of $N^1$. If the integer is smaller than $\sqrt{N^1}/4$ (the square root of $N^1/4$) or if there is no divisible candidate in the PIP list, a maximum integer which is equal to or smaller than the square root of $N^1$ is selected in the PIP list (excluding "13" and "17"). The reason for excluding 13 and 17 is that it is known empirically that an even number is suitable for transmission system. $N^2$ is a minimum integer which is equal to or larger than $N^1$ divided by the selected $M^2$. In the second stage (S404), if $N^2$ is defined in the PIP list in FIG. 48, all interleaving patterns are determined, thereby the process of generating the L bit interleaving pattern is performed with the determined interleaving pattern (S408). If $N^2$ is not defined in the PIP list, the process moves to the next stage (S406). (refer to FIG. 47)

In the stage (S406), similar to the second stage, $M^Z$ ("Z" represents the number of stage) is selected among numbers corresponding to the predefined interleaving patterns shown in FIG. 48 (excluding "13" and "17") as a number which can divide $N^1$ and is a maximum integer which is equal to or smaller than the square root of $N^1$. If the integer is smaller than $\sqrt{N^1}/4$ (the square root of $N^1/4$) or if there is no divisible candidate in the PIP list, a maximum integer which is equal to or smaller than the square root of $N^1$ is selected in the PIP list (excluding "13" and "17"). $N^Z$ is a minimum number which is equal to or larger than previous stage $N^{(Z-1)}$ divided by the selected $M^Z$. Such a process is performed until $N^Z$ is defined in PIP in FIG. 48 (refer to FIG. 47). If it is defined, since all interleaving patterns are defined, the process for generating the L bit interleaving pattern is performed with the determined interleaving patterns S408).

In addition, other than interleaving patterns shown in FIG. 48, an interleaving pattern corresponding to other number can be defined. In this case, the interleaving pattern corresponding to the other number is generated by the same way as that in higher stage shown in FIG. 46. The more the interleaving patterns defined in FIG. 48, the fast the process is completed. Even when the number of the interleaving patterns shown in FIG. 48 is increased, $M_Y^Z$ ($Z \geq 2$) will be selected among "2, 3, 4, 5, 6, 7, 8, 9, 10, 11, 16, 20, 32, 64, 128" shown in FIG. 48.

Figure 49:
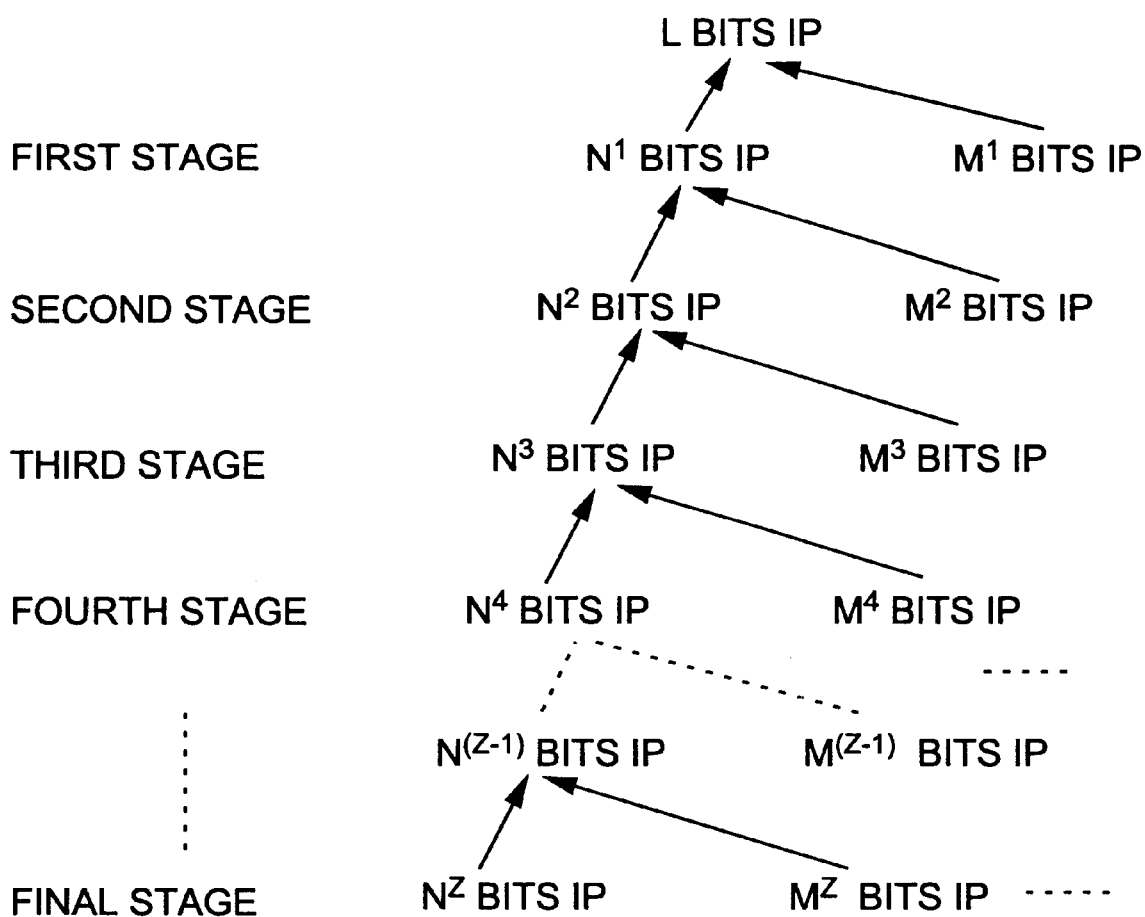
FIG. 49 is a diagram showing details of a generation process of an interleaving pattern by a multistage interleaving method.

The process for generating the L bit interleaving pattern (S408) will be described with reference to FIG. 49 showing a detailed generating process of the interleaving pattern by the above mentioned multistage interleaving method.

In FIG. 49, by using interleaving patterns (IP) $N^Z$ and $M^Z$, $N^{(Z-1)}$ of the former stage will be obtained. The obtaining process was described in FIG. 42 and FIG. 43, therefore, the description will be omitted. By performing the process sequentially, the L bit interleaving pattern which is suitable for transmission system can be obtained. In the above descriptions, bit length is used from interleaving pattern length. Different representations will be used as a unit other than bit for interleaving.

In the following, an interleaving device which uses the above mentioned interleaving method will be described as a thirteenth embodiment.

The interleaving method described so far can be applied to an interleaver and a deinterleaver in devices shown in FIG. 34–FIG. 35. However, it is not limited to the devices. The multiple interleaving method of the present invention can be applied to other devices which perform interleaving. The present invention of the eleventh and twelfth embodiments is especially suitable for devices shown in FIG. 34–FIG. 35, that is, a turbo encoder and a transmission system device.

Figure 50:
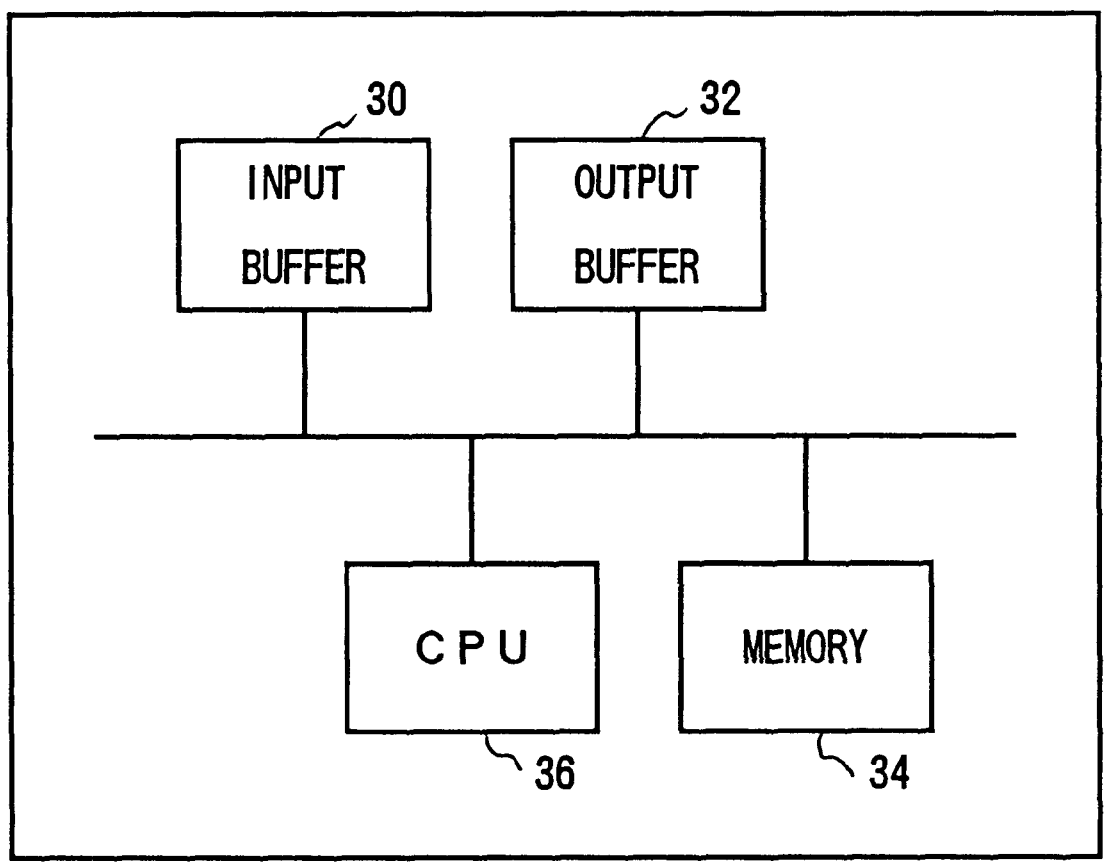
FIG. 50 is a diagram showing an example of a device for interleaving.

Since the configurations of an interleaver and a deinterleaver are the same, an example of the interleaver will be described. FIG. 50 shows an example of a device for performing interleaving or deinterleaving. As shown in FIG. 50, the interleaver includes an input buffer 30, an output buffer 32, a memory 34, and a CPU 36. Input series data is stored in the input buffer and interleaved output series data is stored in the output buffer. In the case of deinterleaving, interleaved data is stored in the input buffer 30 and deinterleaved data which is the data before interleaving. The input buffer and the output buffer 32 are realized with a RAM, a shift register, and the like. The memory 34 stores the above mentioned interleaved pattern tables and/or a program which directly calculates interleaved addresses in the output buffer 32, and is realized by a RAM, a ROM and the like. The CPU 36 performs instruction of input/output to the buffers, address calculation, and so on. The above mentioned configuration can be realized by an integrated circuit such as an LSI and the like.

Next, the operation in the case that the memory 34 stores only interleaving pattern tables will be described.

When input series data is input in the input buffer 30, the CPU 36 reads out destination addresses in the output buffer with reference to an interleaves pattern table in the memory 34 and outputs the input series data to the addresses in the output buffer 32.

When calculating the addresses directly, the CPU 36 calculates the destination addresses by a program from addresses of the input series data in the input buffer 30 and outputs to the addresses in the output buffer 32.

In the following, a media according to the present invention will be described as a fourteenth embodiment. An interleaving pattern can be generated automatically and can be used as pattern data in the above mentioned RAM and the like by performing the interleaving pattern generating method, on a computer, which was described with flowcharts shown in FIG. 38 and FIG. 46 and is suitable for transmission system and turbo code.

At the time, interleaving patterns defined in FIG. 40 and FIG. 48 can be stored in a storage device and referred to by a program. Also, only representations may be stored and interleaving pattern may be generated if necessary. Further, for example, common processes shown in FIG. 39, FIG. 41, and FIG. 47, FIG. 49 can be used as subroutines and used by calling from other processes.

The medium storing a program of the present invention can be realized by an electronic memory, a hard disk, a magneto-optical disk, a floppy disk and the like the methods of the present invention can be performed and the interleaving pattern can be obtained by loading the program stored in the medium in a computer or incorporating the medium in a computer. Further, an encoder/decoder and a transmitter-receiver can be formed so as to generate an optimal interleaving pattern automatically by loading the program in a memory in the encoder/decoder and transmitter-receiver or incorporating the medium in the devices. Therefore, the devices can perform optimal interleaving processes under various conditions in communication.

As described above, by using the interleaving pattern generating method of the present invention, an interleaving pattern suitable for using purpose.

The present invention is not limited to the specifically disclosed embodiments, and variations and modifications may be made without departing from the scope of the invention.

What is claimed is:

1. An interleaving method for inputting a data series of a unit length and outputting an interleaved data series of the unit length, characterized by:

a first step of writing data of said data series to a first interleaver, reading out the data column by column or row by row from said first interleaver, and writing the data to a plurality of second interleavers;

a second step of reading out the data from each of said second interleavers, and writing the data to one or a plurality of third interleavers as necessary, and reading out the data from each of interleavers generated by repeating said second step once or a plurality of times, or from each of interleavers generated by said first step, and outputting said interleaved data series.

2. An interleaving method for inputting a data series of a unit length and outputting an interleaved data series of the unit length, characterized by:

a first step of writing said data series to a first interleaver in one direction;

a second step of reading out column data or row data from said first interleaver, writing said read out data to a second interleaver, which has a size different from a size of said first interleaver, in one direction, and repeating said reading out column data or row data and said writing read out data column by column or row by row;

repeating a third step of performing said second step wherein each of a plurality of said second interleavers generated by said second step is regarded as said first interleaver, and reading out data from each of interleavers generated by repeating said third step or by performing said second step, and outputting said interleaved data series.

3. An interleaving method for inputting a data series of a unit length and outputting an interleaved data series of the unit length, characterized by:

a first step of writing said data series to a first interleaver in one direction;

a second step of reading out column data or row data from said first interleaver, writing said read out data to a second interleaver, which has a size different from a size of said first interleaver, in one direction, and repeating said reading out column data or row data and said writing read out data column by column or row by row;

a third step of reading out data column by column or row by row from each of interleavers generated by said second step, and writing said data to an interleaver which has a size the same as the size of said first interleaver, and reading out data. from said interleaver generated by said third step, and outputting said interleaved data series.

4. The interleaving method as claimed in claim 3, characterized by:

a fourth step of performing said second step and said third step wherein said interleaver generated by said third step is regarded as said first interleaver, reading out data from an interleaver generated by repeating said fourth step once or a plurality of times, and outputting said interleaved data series.

5. An interleaving method for inputting a data series of a unit length and outputting an interleaved data series of the unit length, characterized by:

storing a plurality of interleaving patterns in a table beforehand;

applying one of said interleaving patterns to said input data series by referring to said table and outputting data, and repeating a step of applying one of said interleaving patterns to said output data, and outputting said interleaved data series.

6. A method for generating an interleaving pattern description of an interleaving pattern for interleaving an input data series of a unit length and outputting an interleaved data series of the unit length, characterized by:

generating said interleaving pattern description of a third unit by using an interleaving pattern description of a first unit and an interleaving pattern description of a second unit.

7. A method for generating an interleaving pattern description of an interleaving pattern for interleaving an input data series of a predetermined length unit and outputting an interleaved data series of the predetermined length unit, comprising the steps of:

generating said interleaving pattern description of a third unit by using an interleaving pattern description of a first unit and an interleaving pattern description of a second unit, and repeating the generating step a plurality of times.

8. The method as claimed in claim 6 or 7, characterized in that said interleaving pattern description is an interleaving pattern table or an interleaving pattern equation which describes an interleaving pattern.

9. An interleaving method for inputting a data series of a unit length and outputting an interleaved data series of the unit length, characterized by:

generating an interleaving pattern description of a third unit by using an interleaving pattern description of a first unit and an interleaving pattern description of a second unit, and interleaving with said generated interleaving pattern description.

10. An interleaving method for inputting a data series of a unit length and outputting an interleaved data series of the unit length, characterized by:

calculating interleaving destinations in a series of a third unit with an interleaving pattern description of a first unit and an interleaving pattern description of a second unit, and interleaving with the result of the calculation.

11. An interleaving method comprising the steps of:

generating an interleaving pattern description of a first unit and an interleaving pattern description of a second unit by using an interleaving pattern description of an interleaving pattern for interleaving an input data series of a unit length and outputting an interleaved data series of the unit length, interleaving a data series of a third unit by calculating from said interleaving pattern description of a first unit and said interleaving pattern description of a second unit.

12. The interleaving method as claimed in any one of claims 9–11, characterized in that said interleaving pattern description is an interleaving pattern table or an interleaving pattern equation which describes an interleaving pattern.

13. A method for generating an interleaving pattern description of an interleaving pattern for interleaving an input data series of a unit length and outputting an interleaved data series of the unit length, comprising the steps of:

interpreting an interleaving pattern description language which defines an interleaving pattern, and generating an interleaving pattern description by generating said interleaving pattern description of a third unit by using an interleaving pattern description of a first unit and an interleaving pattern description of a second unit on the basis of said interpretation.

14. The method as claimed in claim 13, characterized in that if an interleaving pattern description corresponding to a part of said interleaving pattern description language is stored, said interleaving pattern description is generated with reference to said stored interleaving pattern description without performing a process corresponding to said part of said interleaving pattern description language, when generating an interleaving pattern.

15. An interleaving method comprising the steps of:

interpreting an interleaving pattern description language which defines an interleaving pattern, and interleaving by generating an interleaving pattern description of a third unit by using an interleaving pattern description of a first unit and an interleaving pattern description of a second unit, and interleaving with said generated interleaving pattern description on the basis of said interpretation.

16. The interleaving method as claimed in claim 15, characterized in that if an interleaving pattern description corresponding to a part of said interleaving pattern description language is stored, said interleaving pattern description is generated with reference to said stored interleaving pattern without performing a process corresponding to said part of said interleaving pattern description language, when interleaving.

17. A method for generating an interleaving pattern description of an interleaving pattern for interleaving an input data series of a unit length and outputting an interleaved data series of the unit length, characterized by:

determining an interleaving pattern description of a first stage when a unit length is given, and generating an interleaving pattern description by repeating a process of determining interleaving patterns corresponding to interleavers of a column and a row of a stage after said first stage until reaching any stage or until becoming unable to interleave.

18. A method for generating an interleaving pattern description of an interleaving pattern for interleaving an input data series of a unit length and outputting an interleaved data series of the unit length, characterized by:

checking an interleaving pattern description which is generated;

generating an interleaving pattern description again after changing all or a part of parameters if the result of said checking is unsuccessful, and repeating said checking and said generation until the result of said checking becomes successful so as to generate an interleaving pattern description which passed said checking.

19. The method as claimed in claim 17 or 18, characterized in that said interleaving pattern description which is generated is an interleaving pattern table or an interleaving pattern equation or an interleaving pattern description language.

20. A method for generating an interleaving pattern description of an interleaving pattern for interleaving an input data series of a unit length and outputting an interleaved data series of the unit length, characterized by:

a step of determining, when a unit length is given, the number of rows or columns of a block interleaver corresponding to said unit length by using an interleaving pattern list suitable for a predefined application target and defining the number of columns or rows from said determined number of rows or columns, and generating an interleaving pattern of said unit length from interleaving patterns obtained by repeating said step until said defined number of columns or said defined number of rows is defined in said interleaving pattern list.

21. The method as claimed in claim 20, characterized by:

a first step, which is a process of a first stage, of determining the number of rows or the number of columns of a block interleaver corresponding to a unit length which is given beforehand by a defined number, assuming an interleaving pattern corresponding said defined number as a predefined interleaving pattern, and defining the number of rows by using said determined number of columns or defining the number of columns by using said determined number of rows;

a second step of determining the number of rows or the number of columns of a block interleaver corresponding to said defined number of rows or said defined number of columns by using an interleaving pattern list suitable for a predefined application target, and defining the number of columns from said determined number of rows or defining the number of rows from said determined number of columns;

a third step of repeating said second step until an interleaving pattern corresponding to the number of rows or columns exists in said predefined interleaving pattern list;

performing said third step a number of times equal to the number of rows or columns corresponding to said predefined interleaving pattern in said first step, and generating an interleaving pattern corresponding to the row or the column of a former stage sequentially from an interleaving pattern corresponding to the row and the column which is generated in a final stage.

22. The method as claimed in claim 21, wherein said application target is turbo code and the number of rows of said first stage is 7.

23. The method as claimed in claim 21, wherein said application target is transmission and the number of columns of said first stage is the number of slots of one frame.

24. The method as claimed in claim 20 or 21, further characterized in that said generated interleaving pattern of said unit length is checked and an interleaving pattern of said unit length is generated again according to the result of said checking.

25. The method as claimed in claim 24, wherein said application target is turbo code and the number of rows of said first stage is 7.

26. The method as claimed in claim 24, wherein said application target is transmission and the number of columns of said first stage is the number of slots of one frame.

27. An interleaving device for inputting a data series of a unit length and outputting interleaved data series of the unit length, comprising:

means for storing one or a plurality of interleaving patterns in a table beforehand;

means for outputting data by applying one of said plurality of interleaving patterns, and means for outputting said output data by further applying one of said plurality of interleaving patterns as necessary.

28. The interleaving device as claimed in claim 27, characterized in that said interleaving pattern is generated by said interleaving pattern generating method as claimed in claim 20.

29. The interleaving device as claimed in claim 27, wherein the table is configured to store an interleaving table by implementing the steps of:

a first step of writing data of said data series to a first interleaver, reading out the data column by column or row by row from said first interleaver, and writing the data to a plurality of second interleavers;

a second step of reading out the data from each of said second interleavers, and writing the data to one or a plurality of third interleavers as necessary, and reading out the data from each of interleavers generated by repeating said second step once or a plurality of times, or from each of interleavers generated by said first step, and outputting said interleaved data series.

30. The interleaving device as claimed in claim 27, wherein the table is configured to store an interleaving table by implementing the steps of:

a first step of writing said data series to a first interleaver in one direction;

a second step of reading out column data or row data from said first interleaver, writing said read out data to a second interleaver, which has a size different from a size of said first interleaver, in one direction, and repeating said reading out column data or row data and said writing read out data column by column or row by row;

repeating a third step of performing said second step wherein each of a plurality of said second interleavers generated by said second step is regarded as said first interleaver, and reading out data from each of interleavers generated by repeating said third step or by performing said second step, and outputting said interleaved data series.

31. The interleaving device as claimed in claim 27, wherein the table is configured to store an interleaving table by implementing the steps of:

a first step of writing said data series to a first interleaver in one direction;

a second step of reading out column data or row data from said first interleaver, writing said read out data to a second interleaver, which has a size different from a size of said first interleaver, in one direction, and repeating said reading out column data or row data and said writing read out data column by column or row by row;

a third step of reading out data column by column or row by row from each of interleavers generated by said second step, and writing said data to an interleaver which has a size the same as the size of said first interleaver, and reading out data from said interleaver generated by said third step, and outputting said interleaved data series.

32. The interleaving device as claimed in claim 31, wherein the table is further configured to store an interleaving table by implementing the step of:

a fourth step of performing said second step and said third step wherein said interleaver generated by said third step is regarded as said first interleaver, reading out data from an interleaver generated by repeating said fourth step once or a plurality of times, and outputting said interleaved data series.

33. An interleaving device for inputting a data series of a unit length and outputting data, comprising:

means for calculating destinations of each piece of data in said input data series;

means for interleaving said input data series on the basis of said calculation, and means for outputting interleaved data series.

34. A computer readable medium storing a program for description and generation of an interleaving pattern in an interleaving method for inputting a data series of a unit length and outputting an interleaved series of the unit length, said program when interpreted configured to control a computer to execute the steps comprising:

a step of determining the number of rows or columns of a block interleaver corresponding to a unit length which is given beforehand by using an interleaving pattern list suitable for a predefined application target and defining the number of columns from said determined number of rows or the number of rows from said determined number of columns, and generating an interleaving pattern of said unit length from interleaving patterns obtained by repeating said step until said defined number of columns or said defined number of row is defined in said interleaving pattern list.

35. The computer readable medium storing a program for generation of an interleaving pattern as claimed in claim 34, said program when interpreted configured to control the computer to further execute the steps comprising:

a first step, which is a process of a first stage, of determining the number of rows or the number of columns of a block interleaver corresponding to a unit length which is given beforehand by a defined number, assuming an interleaving pattern corresponding said defined number as a predefined interleaving pattern, and defining the number of rows by using said determined number of columns or defining the number of columns by using said determined number of rows;

a second step of determining the number of rows or the number of columns of a block interleaver corresponding to said defined number of rows or said defined number of columns by using an interleaving pattern list suitable for a predefined application target, and defining the number of columns from said determined number of rows or defining the number of rows from said determined number of columns;

a third step of repeating said second step until an interleaving pattern corresponding to the number of rows or columns exists in said predefined interleaving pattern list;

performing said third step a number of times equal to the number of rows or columns corresponding to said predefined interleaving pattern in said first step, and generating an interleaving pattern corresponding to the row or the column of a former stage sequentially from an interleaving pattern corresponding to the row and the column which is generated in a final stage.

36. The computer readable medium storing a program for generation of an interleaving pattern as claimed in claim 34 or 35, further characterized in that said generated interleaving pattern of said unit length is checked and an interleaving pattern of said unit length is generated again according to the result of said checking.

37. The computer readable medium storing a program for generation of an interleaving pattern as claimed in claim 35, characterize in that said application target is turbo code and the number of rows of said first stage is 7.

38. The computer readable medium storing a program for generation of an interleaving pattern as claimed in claim 35, characterize in that said application target is transmission and the number of columns of said first stage is the number of slots of one frame.

39. An interleaving method for inputting a data series of a unit length and outputting an interleaved data series of the unit length, comprising the steps of:

storing a plurality of interleaving patterns in a table beforehand;

applying one of said interleaving patterns to said input data series by referring to said table and outputting data, and repeating a step of applying one of said interleaving patterns to said output data, and outputting said interleaved data series;

wherein said repeating step corresponds to interleaving steps comprising:

a first step of writing data of said data series to a first interleaver, reading out the data column by column or row by row from said first interleaver, and writing the data to a plurality of second interleavers;

a second step of reading out the data from each of said second interleavers, and writing the data to one or a plurality of third interleavers as necessary, and reading out the data from each of interleavers generated by repeating said second step once or a plurality of times, or from each of interleavers generated by said first step, and outputting said interleaved data series.

40. An interleaving method for inputting a data series of a unit length and outputting an interleaved data series of the unit length, comprising the steps of:

storing a plurality of interleaving patterns in a table beforehand;

applying one of said interleaving patterns to said input data series by referring to said table and outputting data, and repeating a step of applying one of said interleaving patterns to said output data, and outputting said interleaved data series;

wherein said repeating step corresponds to interleaving steps comprising:

a first step of writing said data series to a first interleaver in one direction;

a second step of reading out column data or row data from said first interleaver, writing said read out data to a second interleaver, which has a size different from a size of said first interleaver, in one direction, and repeating said reading out column data or row data and said writing read out data column by column or row by row;

repeating a third step of performing said second step wherein each of a plurality of said second interleavers generated by said second step is regarded as said first interleaver, and reading out data from each of interleavers generated by repeating said third step or by performing said second step, and outputting said interleaved data series.

41. An interleaving method for inputting a data series of a unit length and outputting an interleaved data series of the unit length, comprising the steps of:

storing a plurality of interleaving patterns in a table beforehand;

applying one of said interleaving patterns to said input data series by referring to said table and outputting data, and repeating a step of applying one of said interleaving patterns to said output data, and outputting said interleaved data series;

wherein said repeating step corresponds to interleaving steps comprising:

a first step of writing said data series to a first interleaver in one direction;

a second step of reading out column data or row data from said first interleaver, writing said read out data to a second interleaver, which has a size different from a size of said first interleaver, in one direction, and repeating said reading out column data or row data and said writing read out data column by column or row by row;

a third step of reading out data column by column or row by row from each of interleavers generated by said second step, and writing said data to an interleaver which has a size the same as the size of said first interleaver, and reading out data from said interleaver generated by said third step, and outputting said interleaved data series.

42. The interleaving method of claim 41, wherein said interleaving steps further comprise:

a fourth step of performing said second step and said third step wherein interleaver generated by said third step is regarded as said first interleaver, reading out data from an interleaver generated by repeating said fourth step once or a plurality of times, and outputting said interleaved data series.

43. An interleaving method comprising the steps of:

generating an interleaving pattern description of a first unit and an interleaving pattern description of a second unit by using an interleaving pattern description of an interleaving pattern for interleaving an input data series of a predetermined length unit and outputting an interleaved data series of the predetermined length unit, interleaving a data series of a third unit by calculating from said interleaving pattern description of a first unit and said interleaving pattern description of a second unit.

44. A method for generating an interleaving pattern description of an interleaving pattern for interleaving an input data series of a unit length and outputting an interleaved data series of the unit length, comprising the steps of:

interpreting an interleaving pattern description language which defines an interleaving pattern, and generating an interleaving pattern description by generating said interleaving pattern description of a third unit by using an interleaving pattern description of a first unit and an interleaving pattern description of a second unit and repeating the generating step a plurality of times on the basis of said interpretation.

45. An interleaving method comprising the steps of:

interpreting an interleaving pattern description language which defines an interleaving pattern, and interleaving by calculating interleaving destinations in a series of a third unit with an interleaving pattern description of a first unit and an interleaving pattern description of a second unit, and interleaving with the result of the calculation on the basis of said interpretation.

46. An interleaving method comprising the steps of:

interpreting an interleaving pattern description language which defines an interleaving pattern, and interleaving by generating an interleaving pattern description of a first unit and an interleaving pattern description of a second unit by using an interleaving pattern description of an interleaving pattern for interleaving an input data series of a unit length and outputting an interleaved data series of the unit length, and interleaving a data series of a third unit by calculating from said interleaving pattern description of a first unit and said interleaving pattern description of a second unit on the basis of said interpretation.

47. An interleaving method comprising the steps of:

interpreting an interleaving pattern description language which defines an interleaving pattern, and interleaving by generating an interleaving pattern description of a first unit and an interleaving pattern description of a second unit by using an interleaving pattern description of an interleaving pattern for interleaving an input data series of a predetermined length unit and outputting an interleaved data series of the predetermined length unit, and interleaving a data series of a third unit by calculating from said interleaving pattern description of a first unit and said interleaving pattern description of a second unit on the basis of said interpretation.

* * * * *